(12) United States Patent
Bowers et al.

(10) Patent No.: US 9,325,282 B2
(45) Date of Patent: Apr. 26, 2016

(54) SELF-HEALING TECHNIQUE FOR HIGH FREQUENCY CIRCUITS

(71) Applicant: California Institute of Technology, Pasadena, CA (US)

(72) Inventors: Steven Bowers, Duarte, CA (US); Kaushik Sengupta, Princeton, NJ (US); Kaushik Dasgupta, Pasadena, CA (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/176,607

(22) Filed: Feb. 10, 2014

(65) Prior Publication Data
US 2014/0354350 A1     Dec. 4, 2014

Related U.S. Application Data

(63) Continuation of application No. 12/877,743, filed on Sep. 8, 2010, now abandoned.

(60) Provisional application No. 61/240,518, filed on Sep. 8, 2009.

(51) Int. Cl.
| | | |
|---|---|---|
| H03F 1/30 | (2006.01) |
| H03F 3/213 | (2006.01) |
| H03F 3/195 | (2006.01) |
| H01P 1/12 | (2006.01) |
| H03F 1/02 | (2006.01) |
| H03F 1/56 | (2006.01) |
| H03F 3/193 | (2006.01) |
| H03H 7/40 | (2006.01) |

(52) U.S. Cl.
CPC ............. *H03F 3/213* (2013.01); *H01P 1/127* (2013.01); *H03F 1/0211* (2013.01); *H03F 1/0261* (2013.01); *H03F 1/301* (2013.01); *H03F 1/565* (2013.01); *H03F 3/193* (2013.01); *H03F 3/195* (2013.01); *H03H 7/40* (2013.01); *H03F 2200/318* (2013.01); *H03F 2200/447* (2013.01); *H03F 2200/451* (2013.01); *H03F 2200/468* (2013.01)

(58) Field of Classification Search
CPC ............ H03H 7/40; H03F 3/193; H03F 1/565; H03F 2200/318
USPC .................................................. 327/552–554
See application file for complete search history.

(56) References Cited

U.S. PATENT DOCUMENTS

| | | | | |
|---|---|---|---|---|
| 4,757,502 | A  * | 7/1988 | Meuriche et al. ............. | 370/318 |
| 5,793,162 | A  * | 8/1998 | Barnes et al. ............. | 315/111.21 |
| 7,890,081 | B2 * | 2/2011 | Huyart et al. ................ | 455/337 |
| 8,072,285 | B2 * | 12/2011 | Spears et al. ................ | 333/17.3 |
| 8,207,798 | B1 * | 6/2012 | Wright ............................ | 333/32 |

* cited by examiner

*Primary Examiner* — Kenneth B Wells
(74) *Attorney, Agent, or Firm* — Alston & Bird LLP

(57) ABSTRACT

A self-healing monolithic integrated includes an electronic circuit having a plurality of transistors. At least one sensor is disposed within and electrically coupled to the electronic circuit and configured to sense a performance metric of the electronic circuit. A plurality of actuators is disposed within the circuit. Each actuator of the plurality of actuators has electrically coupled to it a control terminal. The plurality of actuators is configured to perform a selected one of, electrically coupling at least one transistor of the plurality of transistors into the electronic circuit and electrically de-coupling at least one transistor of the plurality of transistors, in response to operation of one of the control terminals to improve the performance metric.

20 Claims, 39 Drawing Sheets

Line edge
roughness (LER)

Random dopant
fluctuations (RDF)

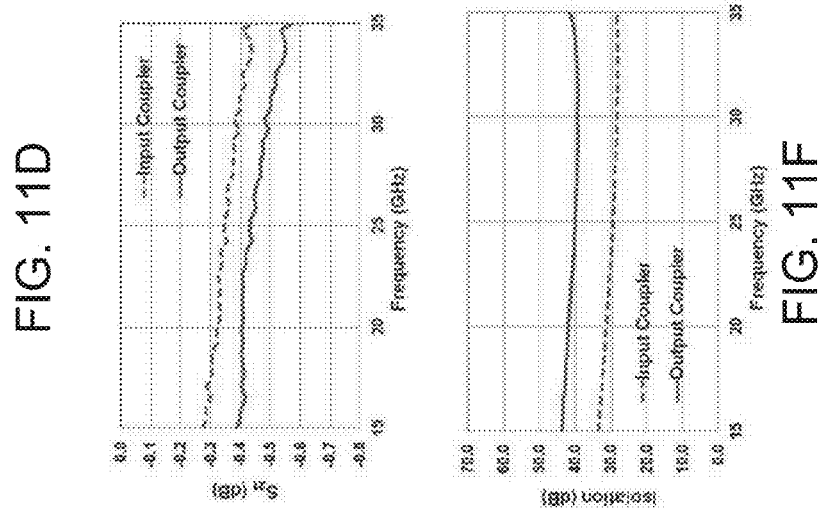
FIG. 11D
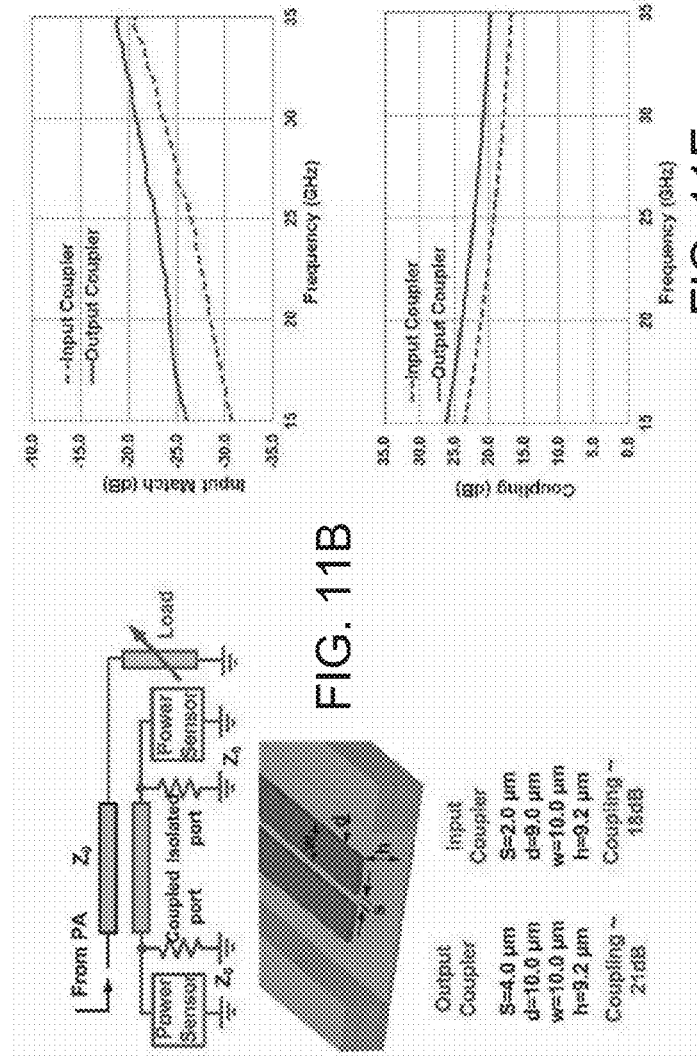
FIG. 11C
FIG. 11F
FIG. 11E
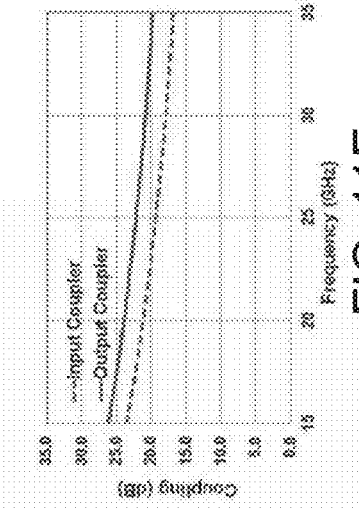
FIG. 11A
FIG. 11B FIG. 16B
FIG. 16C
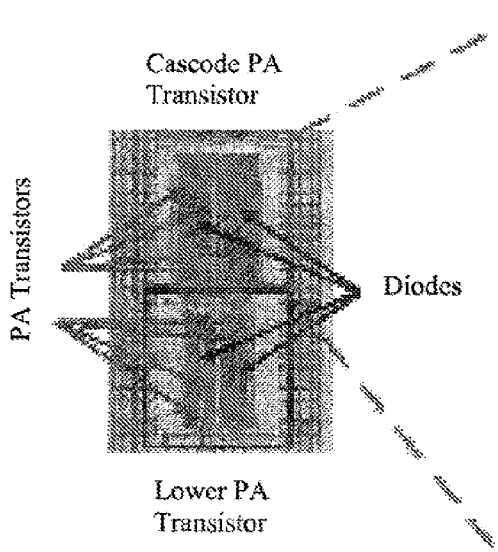
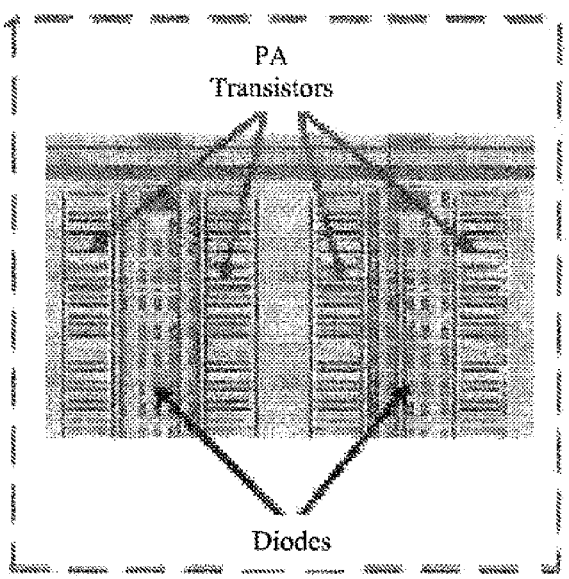
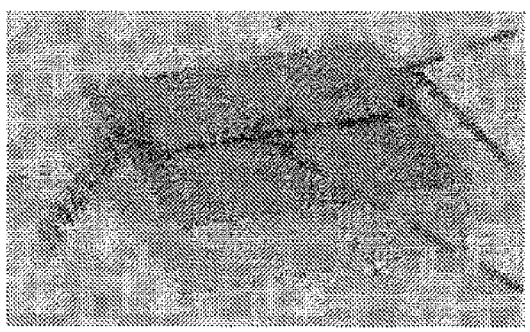
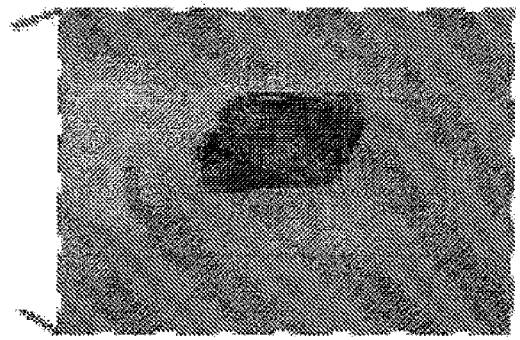
FIG. 16D
FIG. 16E

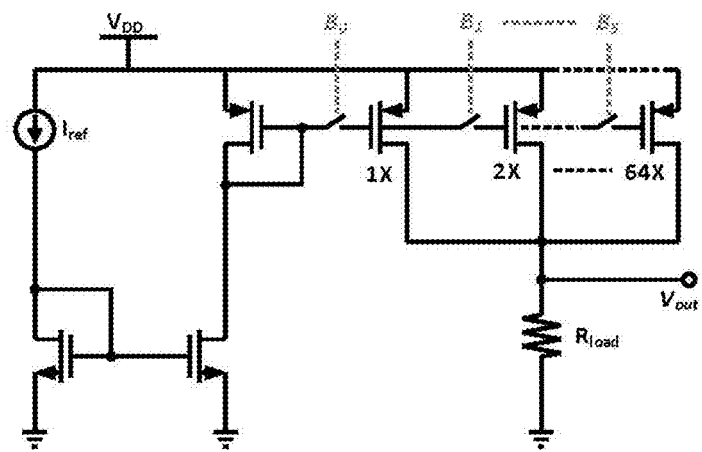
FIG. 23
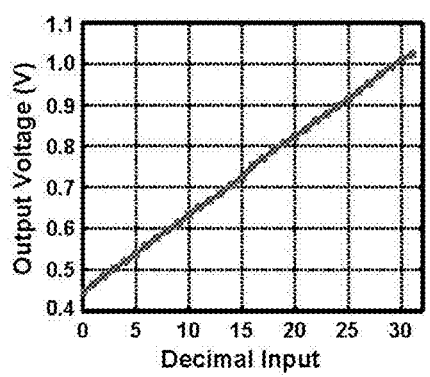 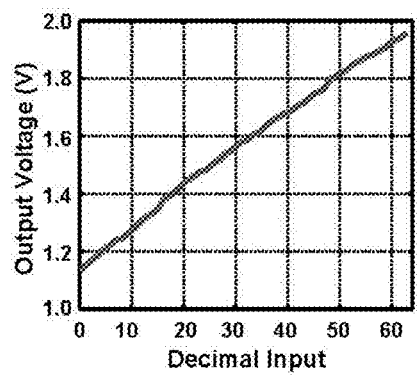
FIG. 24A    FIG. 24B

FIG. 27A
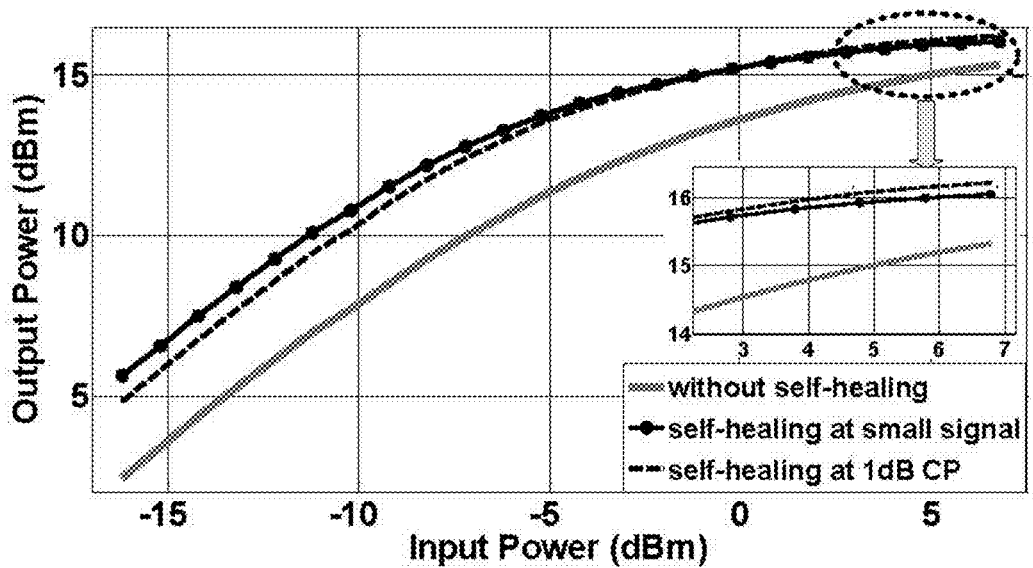
(a)
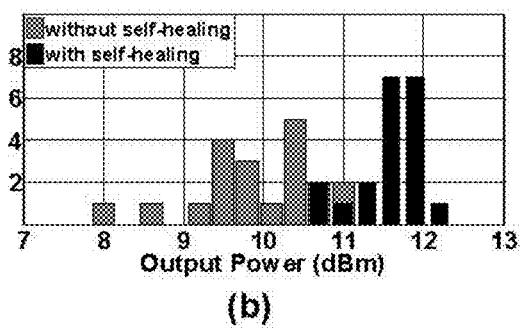
(b)
FIG. 27B
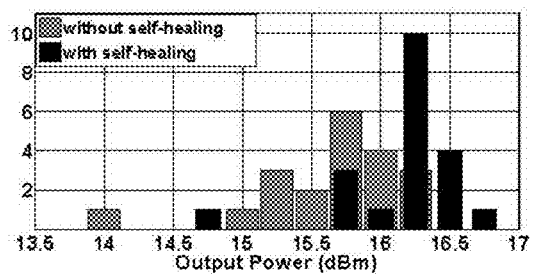
(c)
FIG. 27C

FIG. 28A
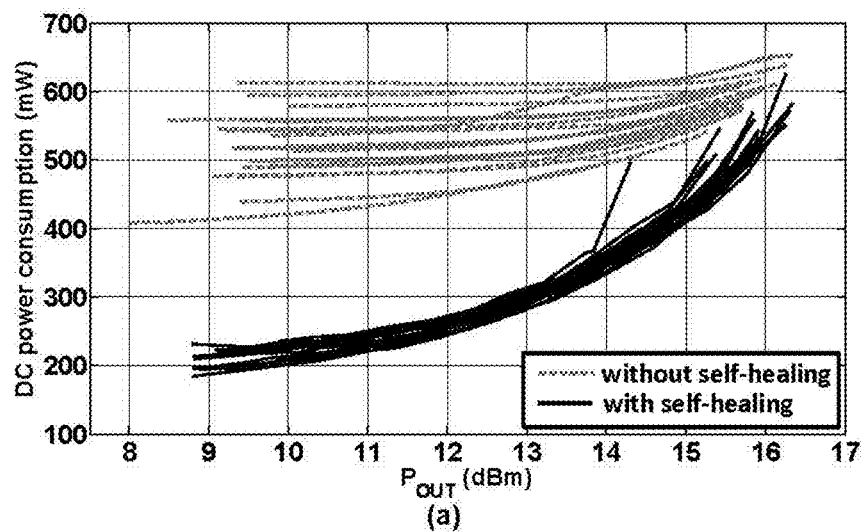
(a)
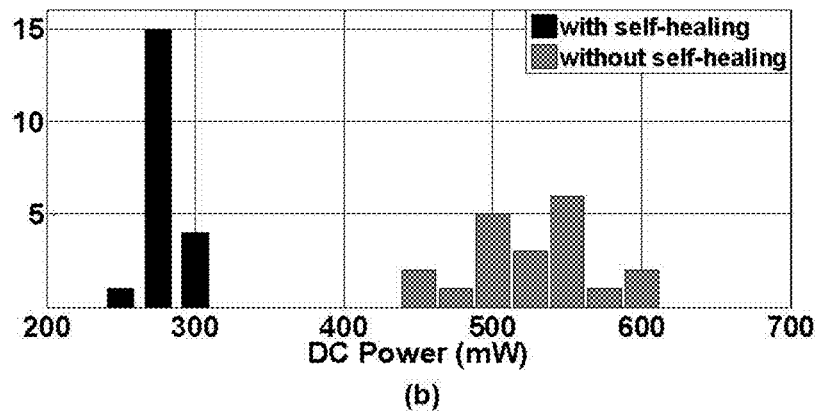
(b)
FIG. 28B

20 μm

SELF-HEALING TECHNIQUE FOR HIGH FREQUENCY CIRCUITS

CROSS-REFERENCE TO RELATED APPLICATIONS

This application is a continuation in part of co-pending U.S. patent application Ser. No. 12/877,743 filed Sep. 10, 2010 and claims the priority and benefit thereof, which application in turn claims priority to and the benefit of then U.S. provisional patent application Ser. No. 61/240,518, filed Sep. 8, 2009, entitled "Self Healing Technique for High Frequency Circuits," each of which applications is incorporated herein by reference in its entirety. U.S. patent application Ser. No. 12/806,906, filed Aug. 24, 2010, entitled "ELECTRONIC SELF-HEALING METHODS FOR RADIO-FREQUENCY RECEIVERS," now U.S. Pat. No. 8,305,106 issued Nov. 6, 2012, U.S. patent application Ser. No. 12/949,679, filed Nov. 18, 2010, entitled "A BROADBAND PHASE SYNTHESIS NETWORK WITH SELF-HEALING CAPABILITY" now U.S. Pat. No. 8,391,426 issued Mar. 5, 2013, U.S. patent application Ser. No. 12/949,719, filed Nov. 18, 2010, entitled "APPARATUS FOR THE SELF HEALING OF THE GAIN OF BROADBAND RECEIVERS," now U.S. Pat. No. 8,594,600 issued Nov. 26, 2013, and U.S. patent application Ser. No. 12/964,281, filed Dec. 9, 2010, entitled "SELF-HEALING POWER AMPLIFIER" now U.S. Pat. No. 8,319,549 issued Nov. 27, 2012 are related applications, each of which is incorporated herein by reference in its entirety.

FIELD OF THE INVENTION

The invention relates to integrated circuits in general and particularly to integrated circuits which employ circuit topologies that provide increased manufacturing yields.

BACKGROUND OF THE INVENTION

In recent years, there has been increased activity in the development of mm-wave (millimeter wave) integrated circuits. There has also been an increased interest in systems on silicon, such as those related to monolithic integration in CMOS, as well as to relatively low cost related CMOS processes. This research has followed the aggressive scaling down of transistor size. In fact device $f_{max}/f_T$ has pushed high enough that CMOS processes can now be considered for a range of applications which had previously been completely dominated by the more exotic and expensive III-V compound semiconductor processes.

However, because of low manufacturing yields and the high economic costs of design and manufacture, integrating large numbers of transistors in silicon by use of existing process technologies remains problematic for high frequency circuits. Conservative designs, which have attempted to increase production yields by increasing design margins, have proven to be wasteful and inefficient solutions. Even more problematic are designs which include a RF power amplifier (PA), such as a high frequency (e.g. mm-wave) PA.

What is needed, therefore, is a new cost effective architecture which can increase high frequency integrated circuit production yields.

SUMMARY OF THE INVENTION

In one aspect, the invention relates to a self-healing monolithic integrated which includes an electronic circuit having a plurality of transistors. The electronic circuit is disposed between and electrically coupled to at least one input terminal and at least one output terminal. At least one sensor is disposed within and electrically coupled to the electronic circuit, the at least one sensor configured to sense a performance metric of the electronic circuit and to provide a signal representative of the performance metric. A plurality of actuators is disposed within the circuit. Each actuator of the plurality of actuators has electrically coupled to it a control terminal. The plurality of actuators is configured to perform a selected one of electrically coupling at least one transistor of the plurality of transistors into the electronic circuit and electrically decoupling at least one transistor of the plurality of transistors, in response to operation of one of the control terminals to improve the performance metric. A digital processing core is disposed within the circuit. The digital processing core is configured to receive the signal representative of the performance metric from the at least one sensor. The digital processing core is configured use the signal representative of the performance metric in the performance of an algorithm recorded in the form of instructions on a machine-readable medium in a non-volatile manner to produce a control signal. The digital processing core is configured to apply the control signal to a respective control terminal of the plurality of actuators. At least one power terminal and at least one common terminal are electrically coupled to the electronic circuit and configured to accept power to operate the self-healing monolithic integrated circuit.

In one embodiment, the self-healing monolithic integrated circuit includes a CMOS technology.

In another embodiment, the performance metric includes a performance metric selected from the group consisting of output power, efficiency, gain, PAE, and linearity.

In yet another embodiment, the self-healing monolithic integrated circuit is a component of a system selected from the group of systems consisting of a point-to-point link, a local area network (LAN), a personal area network (PAN), a vehicle radar system, an all weather vision system, a medical imaging sensor, a space probe imaging system, and a plasma diagnostic system.

In yet another embodiment, the self-healing monolithic integrated circuit further includes a general purpose programmable computer and a set of instructions recorded on a computer-readable medium which when operating on the general purpose programmable computer cause the general purpose programmable computer to be configured to receive sensed information and to set at least one of the control terminals to optimize the performance metric.

In yet another embodiment, the set of instructions is recorded on a computer-readable medium and when operating runs on a computer device external to the monolithic integrated circuit.

In yet another embodiment, the set of instructions is recorded on a computer-readable medium and when operating runs on a digital circuit disposed within the monolithic integrated circuit.

In yet another embodiment, the digital circuit includes a state machine.

In yet another embodiment, the state machine is further controlled by a parent set of instructions recorded on a computer-readable medium.

In yet another embodiment, the actuator includes a tunable matching network.

In yet another embodiment, the tunable matching network includes a selected one of a T-line and a tunable slow-wave transmission line.

In yet another embodiment, the self-healing monolithic integrated circuit is configured to automatically self-heal in response a change in antenna impedance.

In yet another embodiment, the circuit includes a mm-wave circuit.

In yet another embodiment, the self-healing monolithic integrated circuit senses a phase difference between a gate current and a drain voltage.

In yet another embodiment, the self-healing monolithic integrated circuit is configured to operate at least one of the control terminals to cause the phase difference between the gate current and the drain voltage to change towards a quadrature phase difference.

In yet another embodiment, the self-healing monolithic integrated circuit is configured to adjust a bias voltage or a threshold voltage through body effect (triple-well process) based on a gain estimate based on an output of a peak detector sensor.

In yet another embodiment, the self-healing monolithic integrated circuit includes a Schottky peak detector.

In yet another embodiment, the self-healing monolithic integrated circuit senses an efficiency metric of the circuit using a temperature sensor.

In yet another embodiment, the temperature sensor includes a PTAT sensor.

In yet another embodiment, the self-healing monolithic integrated circuit further includes two or more on-chip antennas configured to provide power combining.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 11A is a schematic diagram of a circuit used for power measurement.

FIG. 11B is a diagram illustration the construction of the couplers used in the circuit.

FIG. 11C is a graph showing the input match vs. frequency for the input coupler and the output coupler.

FIG. 11D is a graph showing the measured S-parameter vs. frequency for the input coupler and the output coupler.

FIG. 11E is a graph showing the coupling vs. frequency for the input coupler and the output coupler.

FIG. 11F is a graph showing the isolation vs. frequency for the input coupler and the output coupler. The coupling coefficients of the input and output couplers are designed to be near 18 dB and 21 dB respectively, while the insertion loss is between 0.3-0.5 dB at 28 GHz.

FIG. 16B is a schematic showing the layout of temperature sensor diodes interspersed within PA transistors.

FIG. 16C is a closeup of a portion of FIG. 16B.

FIG. 16D is a diagram showing a simulated thermal profile for 80 mW power dissipation in the process.

FIG. 16E is a closeup of a portion of FIG. 16D.

FIG. 23 is a schematic diagram of a 6-bit binary weighted current-mode DAC.

FIG. 24A is a graph of output voltage vs. decimal output measured response of a common-source DAC.

FIG. 24B is a graph of output voltage vs. decimal output measured response of a common-gate DAC.

FIG. 27A is a diagram showing the measured output power before self-healing, and after self-healing for maximum output power, both for healing done at small signal and at the 1 dB compression point for a PA.

FIG. 27B is a diagram showing histograms of 20 measured chips before and after self-healing at small signal.

FIG. 27C is a diagram showing histograms of 20 measured chips before and after self-healing at the 1 dB compression point.

FIG. 28A is a diagram showing measured DC power consumption for 20 chips before and after self-healing for minimum DC power while maintaining a desired RF power level is used.

FIG. 28B is a histogram cross section of 20 chips of the DC power consumption before and after self-healing to maintain an output power of 12.5 dBm, near the 1 dB compression point.

FIG. 33A is a graph of measurements before and after self-healing for maximum output power prior to any laser blasting.

FIG. 33B is a graph of measurements after before and after self-healing for maximum output power after laser blasting was used to cut one-half of a common-source transistor.

FIG. 33C is a graph of measurements before and after self-healing for maximum output power after laser blasting was used to cut one-half of a common-source transistor and cut one-half of a cascode transistor.

FIG. 33D is a graph of measurements before and after self-healing for maximum output power after laser blasting to cut an entire half of an output stage.

DETAILED DESCRIPTION

Definitions

Figure 1:
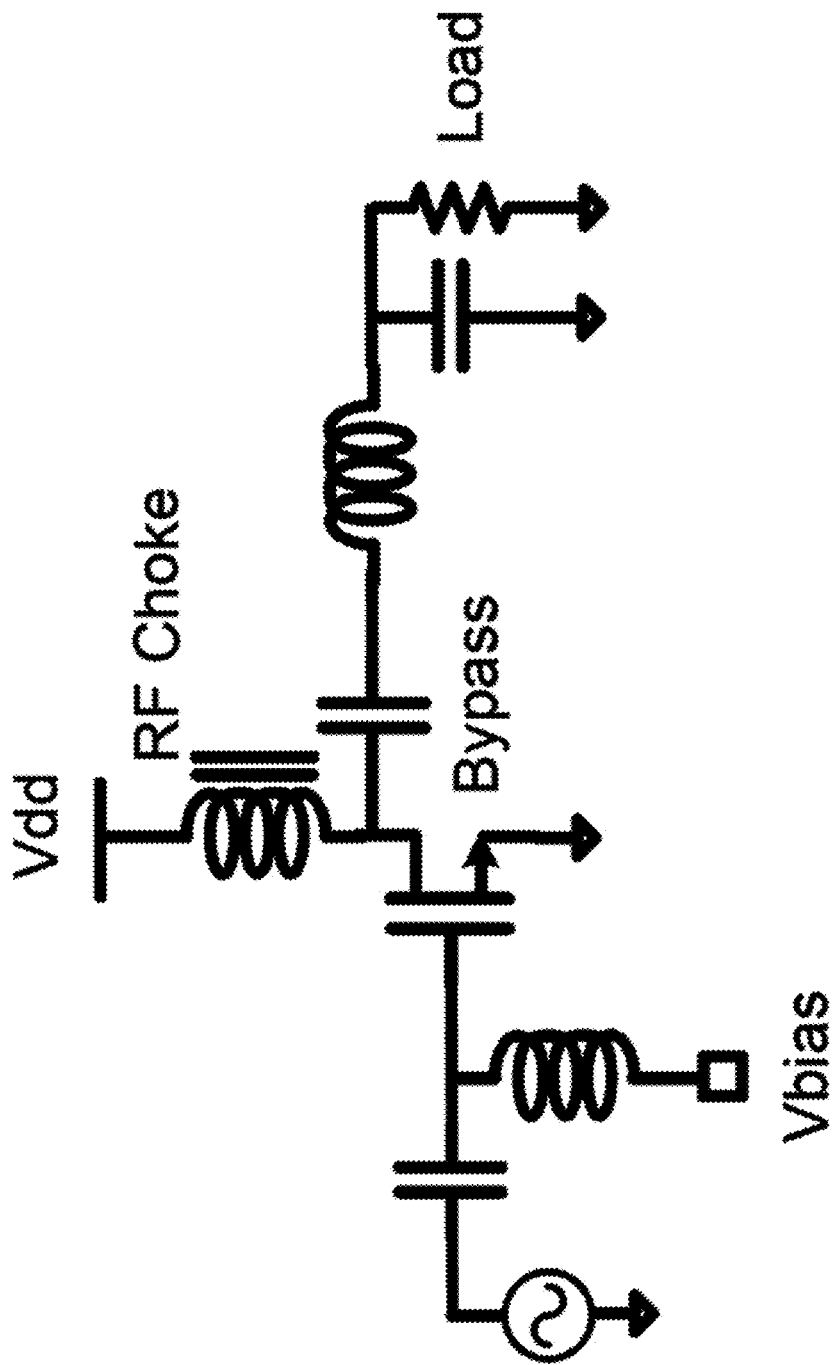
FIG. 1 shows a schematic diagram of an exemplary power amplifier.

As used in the present disclosure, we define the range of electromagnetic waves from microwave to "mm-wave" to correspond generally to a frequency range of about 10 to 300 GHz. The more general term of "high frequency" includes sub mm-wave as well as mm-wave frequencies. The self-healing techniques described herein are particularly advantageous in adapting semiconductor processes, such as for example, digital CMOS processes, to mm-wave operation.

However, it is understood that the technologies described herein can also be applied generally to any similar circuits operating at any high frequency.

Challenges in CMOS Fabrication

Some conventional CMOS fabrication processes, including digital CMOS fabrication processes, are not well suited for use at mm-wave frequencies. The lower mobility of CMOS devices as compared to III-V semiconductor devices, lower quality factor of passive components, and lossy silicon substrates all contribute to high ohmic losses, and pose challenges to silicon integration and efficient power generation at mm-wave frequencies. CMOS RF designs are further constrained by a proportional scaling in breakdown voltages which fundamentally limits the amount of power that can be obtained from a single transistor.

Some design methodologies for mm-wave silicon integration that scale with technology have been developed. For example in Komijani and Hajimiri, A 24 GHz, +14.5 dBm fully-integrated power amplifier in 0.18 µm CMOS, Custom Integrated Circuits Conference, 2004, Proceedings of the IEEE 2004, pages 561-564, October, 2004, a slow-wave structure was described, which effectively reduced substrate loss and on-chip wavelength and achieved a +14.5 dBm output power in 180 nm CMOS with a 3.1 GHz bandwidth at 24 GHz. A 77 GHz power amplifier was described by Komijani and Hajimiri in a wideband 77 GHz, 17.5 dBm power amplifier in silicon, Custom Integrated Circuits Conference, 2005, Proceedings of the IEEE 2005, pages 571-574, September, 2005, in which a 130 nm SiGe BiCMOS process yielded a device which achieved +17.5 dBm with a PAE (power added efficiency) of 12.8%.

A resonant impedance match using transmission lines or lumped passive components is inherently narrow-band and therefore sensitive to inaccuracies of active and passive modeling. An extremely wideband combining network was proposed and implemented using a non-uniform transmission line which funneled the output power of four stages into a load, achieving an output power of 125 mW at 84 GHz with a 3 dB bandwidth of 24 GHz in 130 nm SiGe BiCMOS technology. These technologies have been described in United States Patent Application Publication No. 2007/0086786, Electrical funnel: a novel broadband signal combining method, filed Sep. 22, 2006, and United States Patent Application Publication No. 2009/0096554, 2D TRANSMISSION LINE-BASED APPARATUS AND METHOD, filed Oct. 16, 2008, both of which applications are incorporated herein by reference in their entirety for all purposes.

The possibility of integrating billions of transistors in silicon and the application of sophisticated back-end digital processing integrated with a mm-wave front-end, all integrated in a single die, can be leveraged to make robust, low-cost, high-yield fully integrated systems at mm-wave frequencies. Applications such as gigabit/s point-to-point links, wireless local area networks (WLANs) with extraordinary capacity, short-range high data-rate wireless personal area networks (WPANs), vehicular radar, imaging sensors in planetary remote sensing, medical imaging, all-weather vision, plasma diagnostics and other commercial and defense applications with unprecedented levels of integration are no longer a distant possibility.

Problems in Manufacturing High Frequency Integrated Circuits

As process technologies scale towards the sub-90 nm regime, transistors are being pushed towards their fundamental limits and model, parasitic, and process variations all contribute to a severe degradation in system performance. Device models provided by the standard foundries are generally not validated at mm-wave frequencies or thought to be practical, as related economic costs are high and the performance margin in mm-wave design is very small. For example, a 30 fF (femto Farad) parasitic capacitance, having a reactance of 56 ohms ($X_C$) at 94 GHz, can completely detune a matching network unless the smallest parasitic is accurately modeled and accounted for.

Integrating large numbers of transistors (e.g. billions of transistors) in silicon by use of existing process technologies remains problematic because of low manufacturing yields and very high economic costs of design and manufacture. At the limits of conventional CMOS processes, a design that relies on the accuracy of device and passive modeling is generally followed up with fabrication of test structures, custom active device modeling and several iterative runs (with the associated added expense), all of which, due to process variations, nevertheless fail to guarantee an optimum performance. Production of such designs is generally reduced to unacceptably low yield percentages and such designs are thought to be not commercially viable for large volume production.

One convention solution to the problem of low production yield caused by process variation is to design conservatively and to attempt to guarantee performance at all corners of a performance envelope (e.g., to meet stringent military requirements) or to use an architecture that is inherently less prone to parasitics (e.g., a wideband design). However, such workarounds generally come with a cost of higher power or a larger chip area or one needs to sacrifice transistor performance resulting in a suboptimum performance. Furthermore, such workarounds completely overlook the fundamental advantages of CMOS integration which comes with almost limitless computational abilities in the digital domain and where transistors are so inexpensive that, relative to the related design and manufacturing costs, they are virtually free.

Self-Healing High Frequency Integrated Circuits

We describe hereinbelow a new concept of self-healing or self-adjusting autonomic systems, with an emphasis on mm-wave CMOS circuits, such as, for example, a mm-wave CMOS power amplifier. Our self-healing techniques are used to mitigate the effects of process variations, model inaccuracies and aging and environmental effects on circuits. Self-healing techniques can be accomplished, by automatic monitoring and sensing and subsequent on-chip corrections and adjustments such as by use of tunable active and passive elements, tuned via a self-sustained control and optimization process using a general purpose programmable computer programmed with a set of instructions recorded on a computer-readable medium. In some embodiments, an application-specific integrated circuit (ASIC), a dedicated logic circuit, or a number of standard "cells" that can perform the necessary computational operations can be used in place of a general purpose programmable computer in order to save chip area (or chip "real estate") and/or to save expense and effort. We believe that such a self-healing approach can reliably overcome the fundamental shortcomings of variability and uncertainty in highly-scaled technology nodes, without a sacrifice in performance. It is contemplated that such self-healing techniques can increase first-pass functional production yields to 75-90% which is expected to make application of CMOS processes viable for fabricating devices suitable for commercial mm-wave applications.

Integrated CMOS Mm-Wave Power Amplifier

A mm-wave power amplifier is one of the most challenging blocks to integrate in CMOS. The size of integrated transistors generally decreases with advances in integrated processes. Thus, with each advance in integrated processes, transistor operating voltages are falling with decreased transistor sizes. Power is proportional to voltage squared. Because the power available scales quadratically with the supply voltage, the power available from each transistor (e.g., each MOS transistor of a CMOS integrated circuit) reduces dramatically with voltage. Therefore, as we push frequency of operation of transistors further and further towards their $f_{max}$, in some embodiments, we combine the output power of several transistors to achieve desired power levels. In addition, in some embodiments, we can combine the output power of several stages (either on-chip or off-chip) through electromagnetic radiation via on-chip antennas. On-chip antennas, as well as other types of power combiners, have ohmic losses due to skin effect. In addition, combining an increasing number of output stages implies a higher impedance transformation ratio (assuming antenna impedance does not change significantly) which decreases the bandwidth and therefore the margin of error in a matching network. Slight detuning due to node parasitics, process variation or model inaccuracies can cause a severe degradation in output power, efficiency and gain. Such degradation in output power, efficiency and gain is unacceptable at mm-wave frequencies, where the power gain in bulk CMOS technology is limited.

W-Band Mm-Wave Power Amplifier in CMOS

Figure 2A:
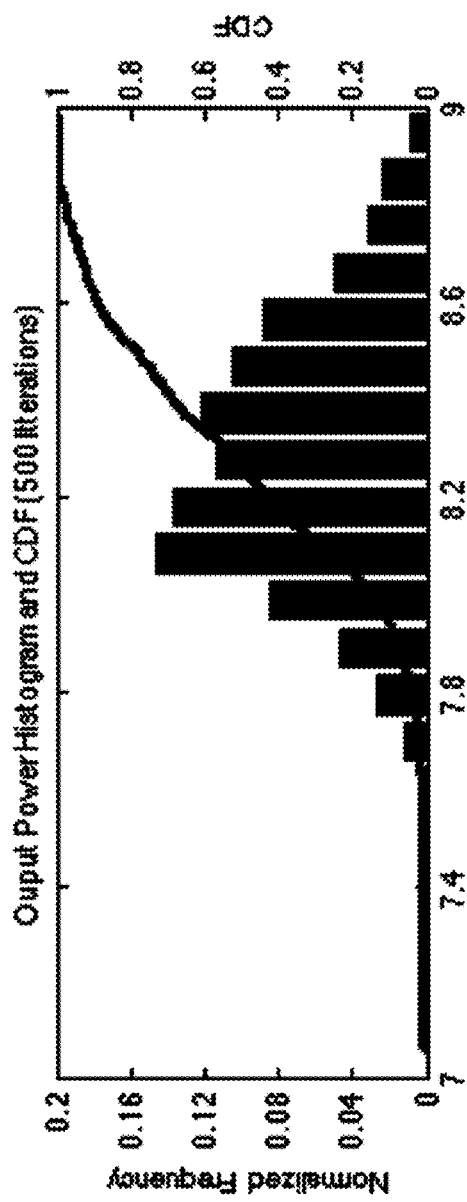
FIG. 2A shows graph of a Monte Carlo simulation of wafer-to-wafer variation over a range of output power for the circuit of FIG. 1.
Figure 2B:
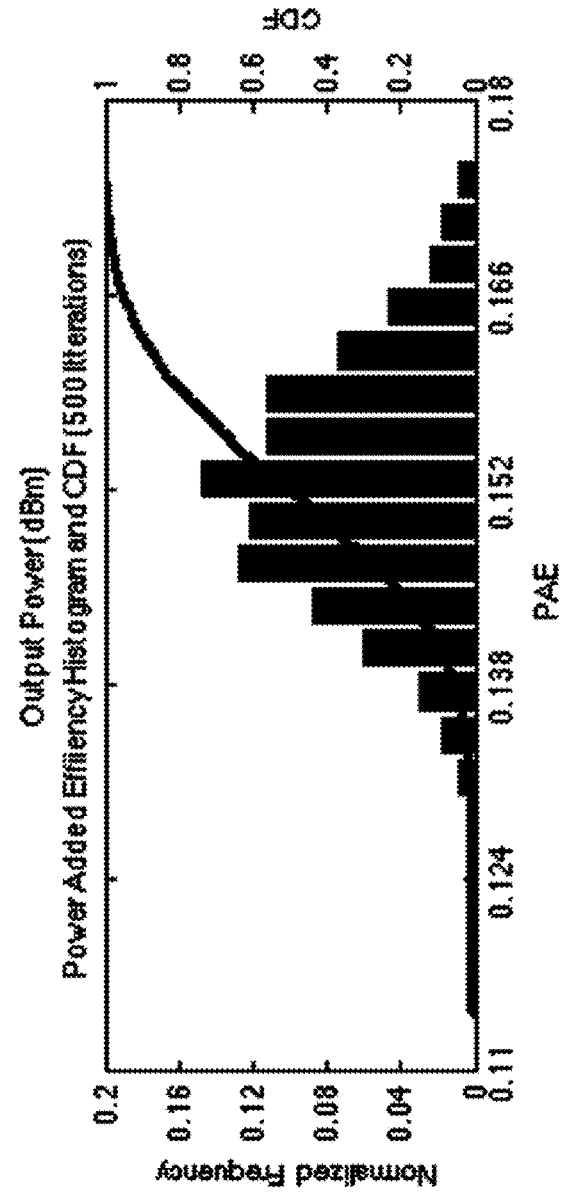
FIG. 2B shows graph of a Monte Carlo simulation of wafer-to-wafer variation simulation over a range of PAE for the circuit of FIG. 1.

An exemplary W-band (e.g., 94 GHz) power amplifier in 32 nm or 45 nm bulk CMOS technology is now described in more detail. FIG. 1 shows a schematic diagram of a section of a power amplifier. The power amplifier of FIG. 1 was simulated as biased in Class AB. Inductors were simulated with quality factor of 10 at 94 GHz. As shown in FIG. 2A and FIG. 2B, a Monte Carlo simulation was run which shows wafer-to-wafer variation over a range of Output Power (dBm) (FIG. 2A) and over a range of Power Added Efficiency (PAE) (FIG. 2B), with both simulations performed for the circuit of FIG. 1. The Monte Carlo simulation for a process variation of a bulk 65 nm CMOS technology shows how output power, gain, and efficiency can be expected to vary from wafer to wafer. Both simulations assumed no passive variations and absolute model accuracy and were therefore expected to be optimistic.

The single stage power amplifier of FIG. 1 was biased in class AB and matched at 94 GHz. From process variations alone, the output power can vary by 1 dB and the PAE can have a deviation of 3%. When model inaccuracies of active and passive devices are further included, the variation is expected to be much higher. In the Monte Carlo simulation of FIG. 2, nearly 70% of the yield fails to provide the designed 8.5 dB power level.

With a typical available input power of 5 dBm, current state of the art designs work around problems of process variation by embedding several capacitors in matching networks which are either digitally switched on and off as needed through manual control or are adjusted by laser trimming to bring the center frequency to the desired value. However, to our knowledge, there has been no concerted effort to automate the process and/or to mitigate losses, such as when the amplifier is forced to work under high VSWR conditions. Furthermore, under high VSWR conditions, the power amplifier can oscillate due to poor reverse isolation at high frequencies.

Another problem related to power amplifiers is the reduction of efficiency during "backoff" (gain non-linearity at higher operating power levels). Since the peak efficiency (at higher power levels) is lower than is achieved for low RF levels, backoff reduces the performance of mm-wave power amplifiers.

Self-Healing: A New Design Philosophy

As described hereinabove, CMOS processes such as digital CMOS processes have generally been thought to be impractical for high frequency circuits, and especially unsuitable for mm-wave applications. However, we have found that such CMOS processes can be used for high frequency RF circuits, including circuits used at mm-wave frequencies, by use of a careful amalgamation of the fundamental design procedures of analog and microwave circuit design. Our techniques include a careful modeling of both devices and high-frequency passive components. We have been able to mitigate these challenges by evaluation and critique of existing techniques and innovations in passive design, efficient power extraction and power combining. We now describe the techniques of self-healing (described hereinbelow in detail) as a holistic solution which attempts to substantially overcome all the fundamental problems of integrated circuit variation at a new level of abstraction. Instead of identifying and confronting individual problems and then devising custom solutions for each of them, self-healing constitutes a general design philosophy which allows an integrated circuit to achieve optimum performance over a range of both process variations as well as variation related to environmental factors.

Sensing

To develop the methodology of self-healing, we begin with an identification of relevant performance parameters that can be either directly or indirectly sensed. Self-actuation (in some embodiments, a fully automatic control aspect of the self-healing technique), can then be implemented through a control process operating on a general purpose programmable computer programmed with a set of instructions recorded on a computer-readable medium based on these performance metrics. Specifically with regard to the exemplary power amplifier, the relevant performance parameters include output power, efficiency, gain, and linearity. Therefore, a self-healing mm-wave power amplifier would typically include reliable, low-power, low-area, high impedance and/or low-insertion loss mm-wave sensors that can monitor metrics (e.g., output power, efficiency, gain, and linearity) of the power-amplifier through direct evaluation and/or through sensing other variables which have a known relationship with output power, efficiency, gain, and/or linearity.

Sensing Power

One way to directly sense (measure) input and output power is with a high impedance Schottky peak detector. Since the cut-off frequency of typical Schottky diodes in 32 nm typically exceeds 1 THz, these diodes are suitable for use as low-area, low power sensors for mm-wave power detection. High frequency power detection and implementation in standard CMOS processes based on high impedance Schottky peak detectors has been previously demonstrated.

Exemplary Self-Healing Architecture

Figure 3:
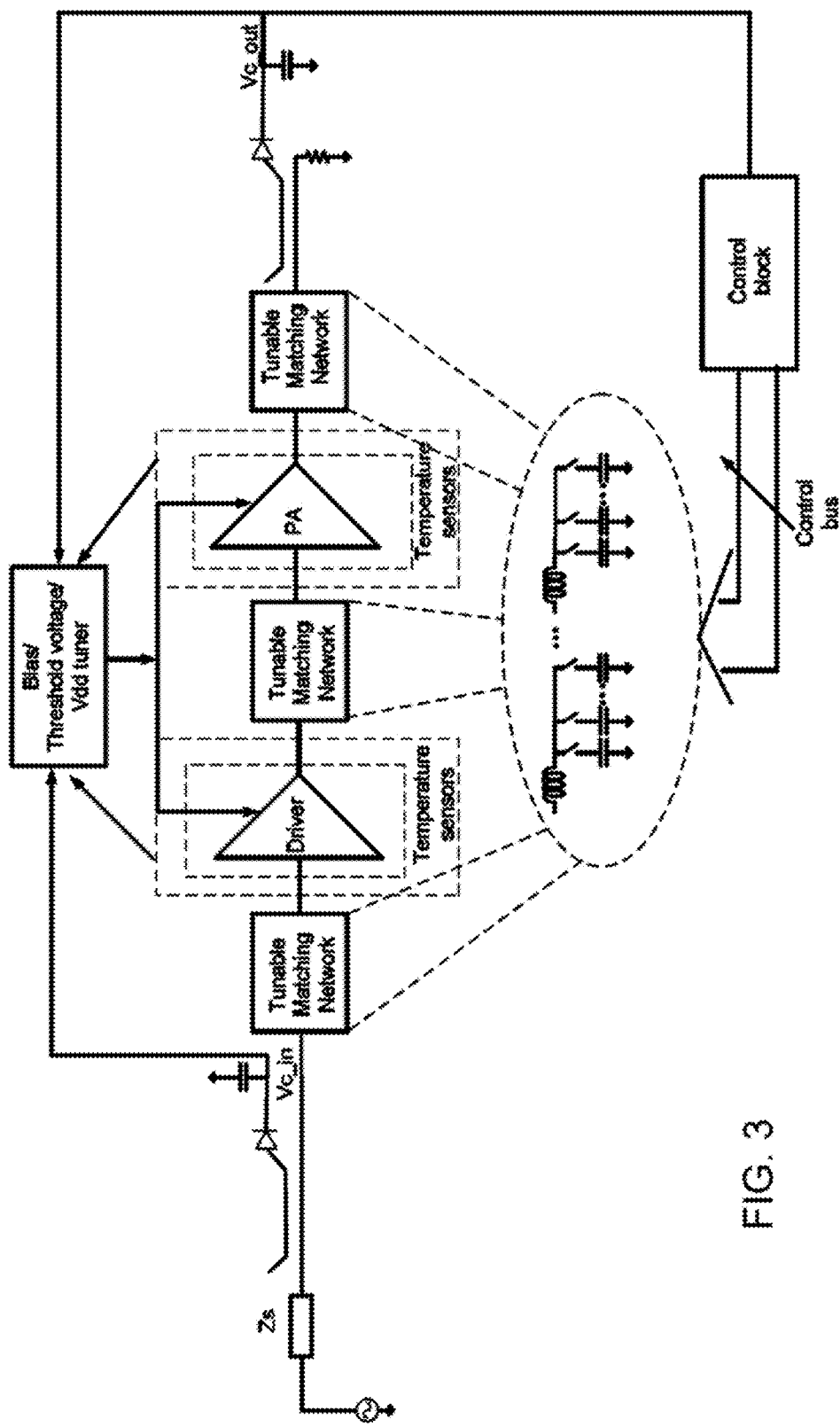
FIG. 3 shows a block diagram of an exemplary simplified block diagram of a two stage power amplifier according to the invention.

FIG. 3 shows a block diagram of a simplified architectural overview of various sensing and actuating mechanisms for an exemplary two stage power amplifier. The self-healing scheme uses the sensors and actuators shown around a core power amplifier. For power sensing, the output power can be coupled to the diode detector using an on-chip coupler or directly passed through it, depending on the loading effects of the diode. The coupler can also be designed to couple minimal power above some sensing threshold used for sensing. The effect of loading of the sensor on the output power network can be automatically adjusted as a part of the self-healing process through adjustments of an output tuning network as described herein below in more detail.

Gain, PAE, and Drain Efficiency Sensing

PAE is defined by the following equation:

$$PAE = \frac{\text{Output Power} - \text{Input Power}}{P_{dc}} \quad \text{Eqn. 1}$$

As seen in Eqn. 1, to estimate drain efficiency or PAE, the DC power ($P_{dc}$) consumed is measured. One direct way to measure the DC power consumed is by sensing the power supply current by passing it through a transistor and mirroring it. While this DC power sensing can be done for a cascade stage, for a common source stage, the higher supply voltage typically used can degrade efficiency. One contemplated alternative approach is to mirror a scaled version current through the PA by use of a voltage source below ground. It is also contemplated that there are other methods suitable for efficient bias current detection.

Circuit parameters can also be measured indirectly, such as by sensing their effects on other metrics, which in some cases are easier to measure. There are also variables in the nonelectrical domain which are indicative of PA efficiency. For example, lower efficiency implies a high power dissipation in active and/or passive circuit devices, which raises the local temperature surrounding the core. Therefore, the temperature of the core or parts of the circuit can be measured, for example, by use of well-known proportional to absolute temperature (PTAT) sensors. PTAT temperature sensors can be built on-chip to monitor heat dissipation and therefore to estimate efficiency inferred from the temperature measurements. One challenge is the calibration of the PTAT circuitry over ambient temperature. However, ambient temperature can also be sensed. PTAT can provide a reliable, low-cost and low-power method for sensing efficiency.

Techniques such as polar loop and Cartesian feedback, which have been demonstrated for low RF frequencies, as well as other suitable approaches, are contemplated for improving linearity. Information regarding gain of the PA can be obtained from the outputs of peak detectors realized, for example, with Schottky diodes.

Information about accuracy of matching networks (e.g., matching network tuning) can also be determined by sensing the phase difference between gate and drain voltage of the amplifier. For example, at nearly perfect load-pull matching, the gate and drain voltage will be completely out of phase. However, due to the presence of gate resistance, this phase relationship may not be satisfied and in general, it is less feasible to tap the voltage across the MOS gate capacitor. An alternative contemplated method is to sense the phase difference between the gate current and drain voltage which should be at quadrature phase. It is also believed that vector sensors can be extended to other parts of self-healing systems (e.g., transceivers) for measuring I/Q imbalance and other parameters.

Actuators

Information obtained from the various sensing mechanisms can be processed through an optimization and control process operating on a general purpose programmable computer programmed with a set of instructions recorded on a computer-readable medium. The optimization and control process can activate the various passive and active actuation mechanisms which regulate the circuitry to optimize performance and which can perform self-healing as needed. Generally, a transistor is coupled into a circuit or decoupled by operation of the transistor (e.g., operation of a transistor gate) to place the transistor in or out of the circuit or to cause some related device (e.g., an impedance element or impedance tuning structure of a tuned network) to be placed in or out of a circuit, to affect operation of an actuator.

Some exemplary actuating mechanisms are shown in FIG. 3. For example, the tunable network can be a multistage LC ladder network where individual and/or groups of capacitors in the capacitor banks can be switched on and off for tuning. Any suitable matching network can be used. Typically multistage LC matching networks can be used to achieve a desired quality factor. The matching networks can be tuned, for example, by using switched capacitors via an autonomous control process operating on a general purpose programmable computer programmed with a set of instructions recorded on a computer-readable medium which aims, for example, to maximize output power for a given bias and input power condition. The autonomous control process can be a control process as simple as a gradient descent process, or the autonomous control process can include more complex optimization routines. The flexibility of tuning over a large portion of a Smith chart can also enable a dynamic adjustment of the output matching network, for example, during a backoff condition, to increase efficiency.

Figure 4A:
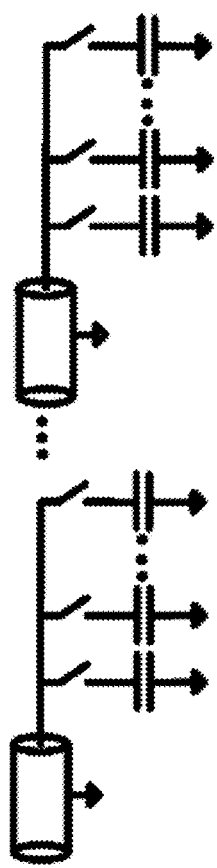
FIG. 4A shows a schematic diagram of an exemplary tunable matching network using a T-line suitable for use in the power amplifier of FIG. 3.
Figure 4C:
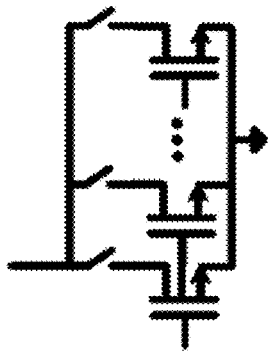
FIG. 4C shows a schematic diagram which illustrates another exemplary actuator circuit topology suitable for use in the power amplifier of FIG. 3.
Figure 4B:
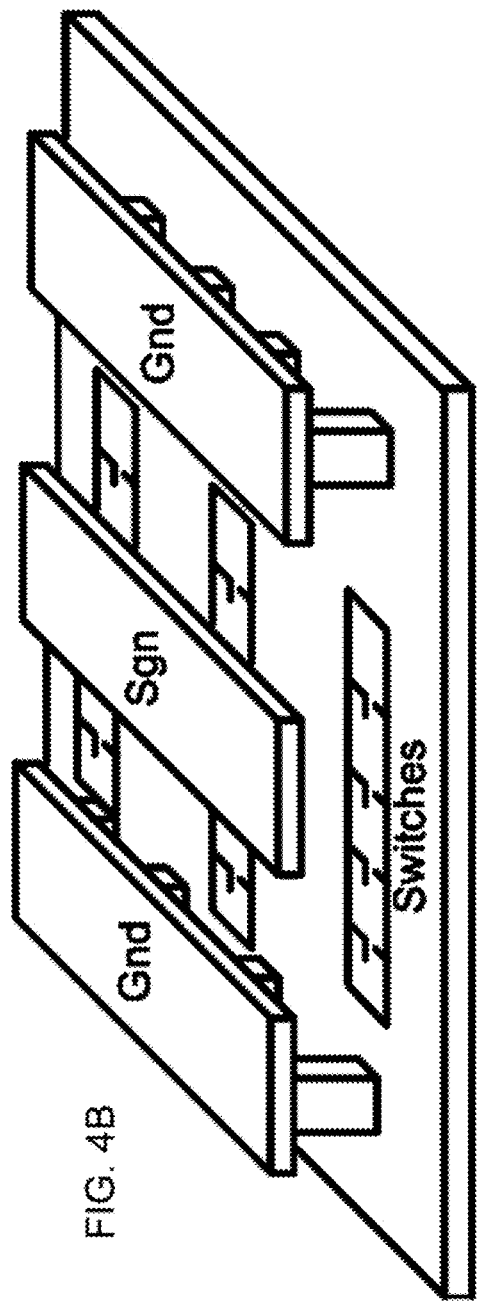
FIG. 4B shows a perspective view of another exemplary tunable show-wave transmission line suitable for use in the power amplifier of FIG. 3.

Tunable matching networks can also be realized with transmission lines instead of inductors as shown in FIG. 4A. Slow-wave transmission lines whose slots can be digitally controlled to switch on and off to allow flow of return current as shown in FIG. 4B are also believed to be suitable for use in tunable networks. In slow-wave transmission lines, dynamic changing of the return current flow allows control of characteristic impedance and wave velocity and can also be used for tunable matching. It is also contemplated that further analysis of optimum matching networks will identify other suitable matching networks and other types of actuating mechanisms that can extend useful bandwidth with minimum loss and to control overhead.

Any suitable active devices can be used to control the actuating mechanisms (e.g., one or more tunable matching networks of a power amplifier) and to allow re-configurability. Such active devices can be added in parallel to the core through logic control as shown in FIG. 4C. Active selection of multiple actuating mechanisms can be useful during backoff, for example, to save DC power and also to provide coarse tuning for optimum efficiency and/or optimum output power output, such as for a given input power. The incremental adjustments provided by such active devices can be sized in a weighted fashion (e.g., binary weighted) to allow for a relatively fine adjustment. Such incremental adjustments can be related to device sizes. The bias voltage and the threshold voltage through body effect (triple-well process) can be adjusted based on a gain estimate gathered from the output of peak detectors. Temperature sensors can also communicate with the control block (FIG. 3) to provide information on the efficiency of the power amplifier.

The control block of FIG. 3 can adjust, for example, the supply, bias and/or the threshold voltage to optimize performance. Such a control block can include, for example a state-machine in digital logic, software, or any combination thereof. It is contemplated that the "control" and "Bias/Threshold voltage/$V_{dd}$ tuner" blocks of FIG. 3 can be further controlled by a suitable "parent" control process operating on a general purpose programmable computer programmed with a set of instructions recorded on a computer-readable medium. It is contemplated that switches having a suitable wideband as well as a sufficient high off-state isolation and low insertion loss at on-state for use at mm-wave frequencies can be fabricated in CMOS.

Self-Healing PA (Power Amplifier)

We now summarize some of the self-healing techniques described hereinabove by describing a self-healing PA. In order to heal, the state of the PA is assessed. Some exemplary relevant metrics (sensed parameters for assessing the state of the PA) include, center frequency, PAE, Output Power, Bandwidth, and gain. These metrics can be calculated knowing the input and output power at various frequencies. For example, detection of the output power can be done with an envelope detector with a diode and a low pass filter, to provide a maximum voltage which gives an estimate of output power. The accuracy of the output power estimate relies on how accurately the load impedance is known, which can also be subject to process variations, depending on what the load is and if the load is on-chip or off-chip. Measuring input power can be somewhat more difficult because the load on the input is the gate of the transistor, so process variation, for example, can change the input power for a given measured peak voltage. If the goal is to know the absolute metrics as outlined above, such errors can be problematic. However, if the goal is to maximize or optimize those metrics, knowledge of the absolute value of a given parameter is less important than how that parameter changes during a particular self-healing operation (e.g., tuning) Similarly, the final 50 ohm load at the output might not be exactly 50 ohms. However, the load characteristics (e.g. load impedance, such as, for example, the load impedance of an antenna) generally do not change significantly during tuning, so the output power, relative to other tuning levels, can be known. The same should be true for the input power. In addition, the gate impedance does not change very much as the matching networks are tuned, so relative input power could also be found during the time period of self-healing tuning.

Turning now to PA actuators, one exemplary method for tuning the PA is to use a varactor diode to tune a matching network. In other embodiments, at relatively high frequencies, transmission line matching networks can be preferred over varactor diodes. To tune a transmission line, the length and/or the impedance can be tuned. To tune the length of a shorted stub in a matching network, switches can be used to short a part of the line to ground. It is also believed that in some embodiments, adjustable slotted ground planes on the transmission lines can be used for tuning. If the slots have switches across them, by varying how many of the slots are open, a transmission line can be adjusted from a normal non-slotted line to a fully slotted slow wave line. The load itself can also be varied. In the case of the direct antenna modulation (DAM), which has been described, such as for example, in Babakhani, et. al, Transmitter Architectures Based on Near-Field Direct Antenna Modulation, IEEE Journal of Solid-State Circuits, vol. 43, no. 12, pages 2674-2692, December 2008, switching combinations can be chosen such that the amplifier always sees a 50 ohm antenna. However, other combinations with different impedances can also be used to help better tune the PA. With suitable detection methods, DAM also allows for tuning out the impact of the environment on the load impedance seen be the PA. For example, the self-healing technique can be used to set a switching combination to match into a nominal 50 ohm load, which has been shifted to some other load impedance by, for example, the presence of a nearby object. In addition, the bias voltage on the gate and the bias voltage on the drain can be adjusted to change the gain and set the operation point of the amplifier.

Figure 5:
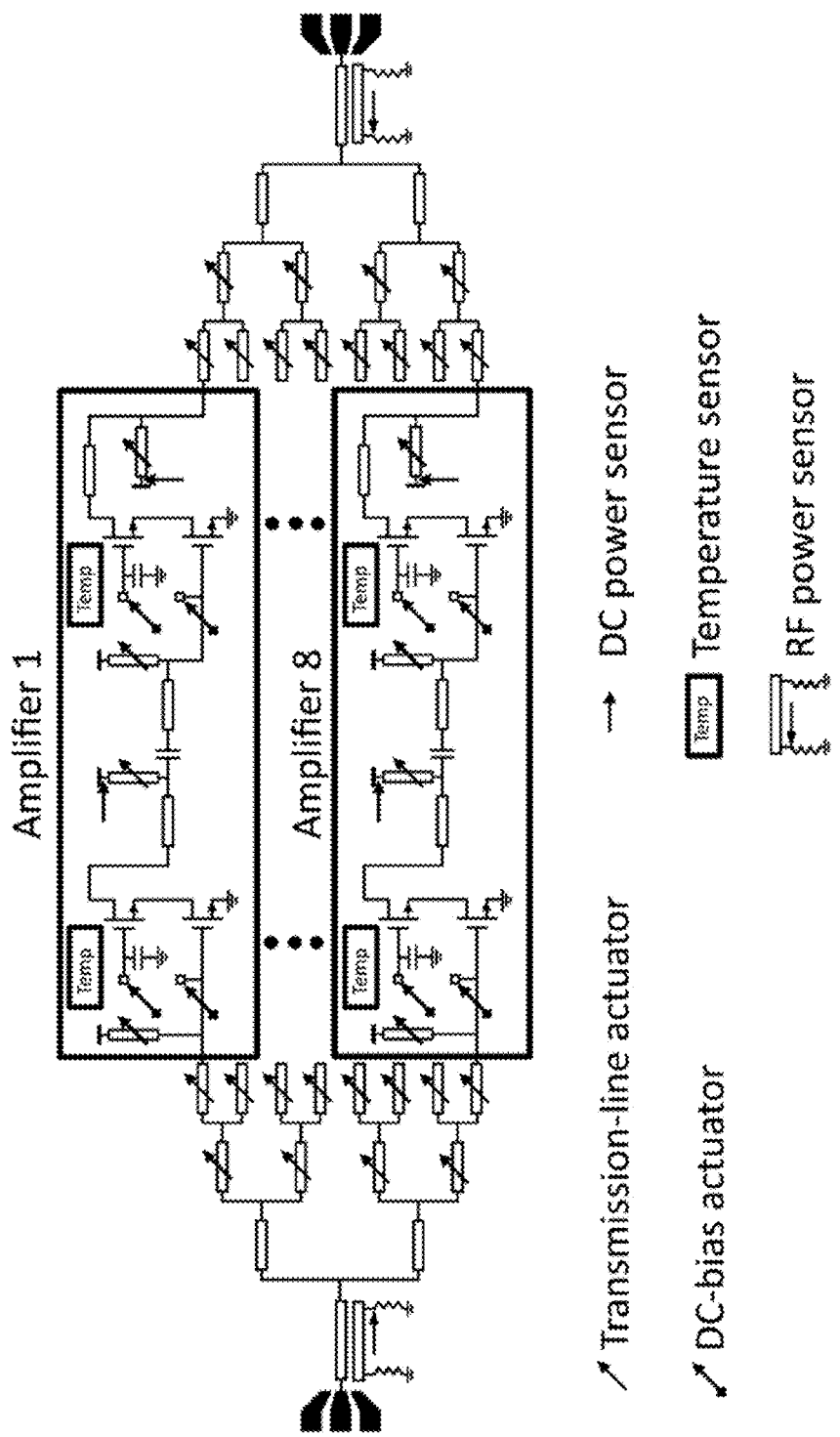
FIG. 5 shows a block diagram of one exemplary embodiment of a self-healing power amplifier having eight parallel amplifier stages.

FIG. 5 shows a block diagram of one exemplary embodiment of a self-healing power amplifier having eight parallel amplifier stages. An input signal is divided by a plurality of transmission-line actuators (e.g. tunable transmission lines as discussed hereinabove) to feed the eight parallel amplifier sections. DC-bias actuators are also shown in each of the eight amplifier stages. The outputs of the eight amplifier sections are combined into a single power output using transmission-line actuators. Exemplary sensors (suitable for measurement of relevant performance metrics, as described in detail hereinabove) include temperature sensors and power sensors.

Motivation for Self-Healing

Figure 6B:
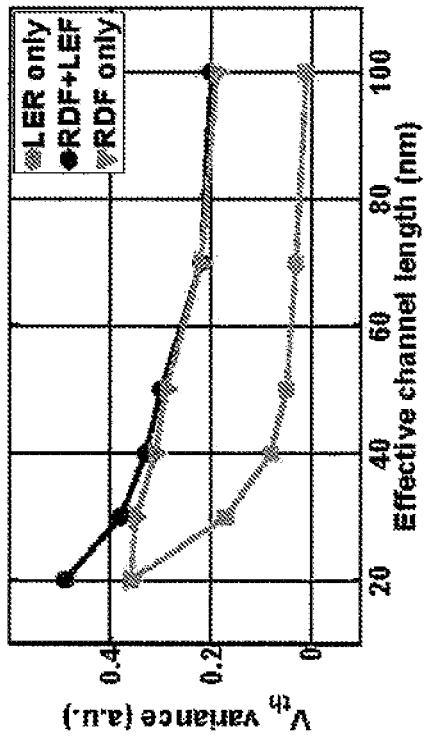
FIG. 6B is a graph showing the threshold voltage $V_{th}$ variation with channel length caused by LER and RDF.
Figure 6A:
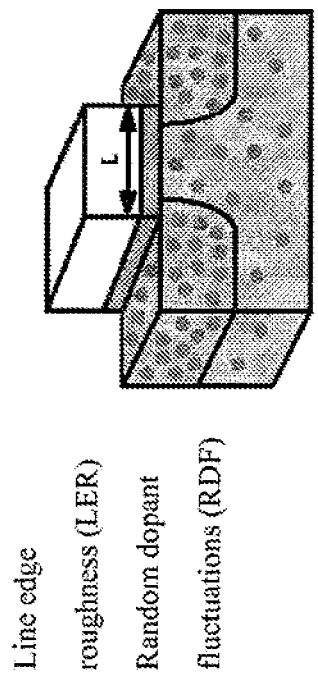
FIG. 6A is a diagram of a semiconductor device in which two sources of variation in a MOSFET, line edge roughness (LER) and random dopant fluctuations (RDF) are illustrated.

The rise of digital computation and personal computing has led to continual advances in semiconductor technologies at an exponential pace, following Moore's Law. In each successive processing node, the minimum feature size decreases, improving performance, but also bringing some tradeoffs in terms of variation both between chips as well as between transistors on the same chip. One major source of this variation is random dopant fluctuations (RDF) in the channel of a transistor. A typical 130 nm complementary metal-oxide-silicon (CMOS) process will have several hundreds of dopant atoms in the channel region. In contrast in a 32 nm process, only a few tens of dopants control important transistor characteristics like threshold voltage. A second source of variation is line-width control in these advanced processes. Line edge roughness (LER) caused by lithographic and etching steps directly impact the overlap capacitances as well as other device parameters like drain induced barrier lowering (DIBL) and threshold voltage. FIG. 6B shows how threshold voltage variations scale with process technology node. As can be seen, the variation is much more manageable at larger nodes, and the variation is expected to continue to increase at smaller nodes as the total number of dopant atoms as well as the channel length reduces even further. If the variation can be dealt with, however, the smaller transistors can enable new applications for mm-wave power generation, enabling transmitters and amplifiers at higher frequencies, powers, and efficiencies. Another issue that analog designers face is that due to the digital processing market being the driving force pushing the scaling, the models provided by the foundries early in the node's development stage are primarily designed for digital use, and are often not reliable at mm-wave frequencies.

Figures 7A, 7B:
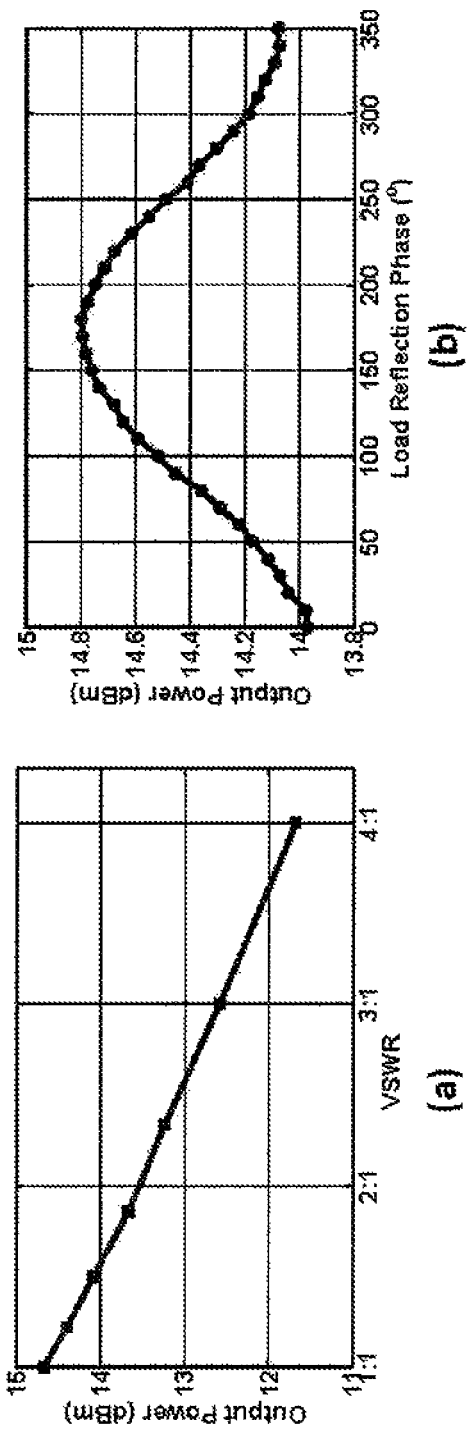
FIG. 7A is a graph of output power variation with VSWR magnitude for a fixed phase for one design of a mm-wave PA.
FIG. 7B is a graph of output power variation with phase variation for a fixed VSWR magnitude for one design of a mm-wave PA.

In addition to these static sources of variation, dynamic temperature variations across the same die can give rise to varying sub-threshold leakage, supply voltage variations thereby directly affecting overall system performance. Variability in operating environment of power generation systems can adversely affect their performance. This comes in the form of temperature variation, degradation due to aging, and in the case of power amplifiers that are driving antennas, load impedance mismatch caused by voltage standing wave ratio (VSWR) events that occur when objects in the environment interact in the near field of the antenna as can be seen in FIG. 7A. Dealing with this issue is critical especially when the amplifiers are in a phased array, as interactions between antennas can allow signals from other elements in the array to couple back through the antenna. Power amplifiers are generally tuned to provide the optimal output power at maximum efficiency for a designed load, so when that load changes, the performance drops, and in extreme cases, can damage the chip if care is not taken to ensure breakdown voltages are not exceeded for any expected VSWR events.

Self-healing is a method to reduce the adverse effects of process and environmental variation for mm-wave power amplifier (PA) design. Along the way, the design and measurement of a 28 GHz self-healing power amplifier will be used as an example to explain the various self-healing concepts. Other embodiments of chips that incorporate self-healing are contemplated. We present an introduction to self-healing and other reconfigurable circuit techniques and presents the design goals and architecture of the example PA. We discuss various sensors that can be used to detect the performance metrics of mm-wave PAs, followed by an examination of some of the ways these circuits can be actuated. We discuss data converters and an embodiment of a digital algorithm. We describe system level measurements of the PA embodiment.

Introduction to Self-Healing

There are two different approaches to solve these issues of performance degradation due to variation. The first approach is to design more and more variation tolerant systems by adopting architectures and circuit topologies which are less sensitive to process and mismatch variations. These techniques have been widely adopted in CMOS digital as well as analog designs over the years. Some of the commonly used strategies include supply voltage optimization, optimum device sizing, and PVT insensitive biasing methods. A limitation of the first approach is that with increasing variability in nanometer CMOS, these techniques become harder to implement. In addition, for high frequency designs, a lot of them cannot be implemented due to severe degradation in circuit performance.

Figure 8:
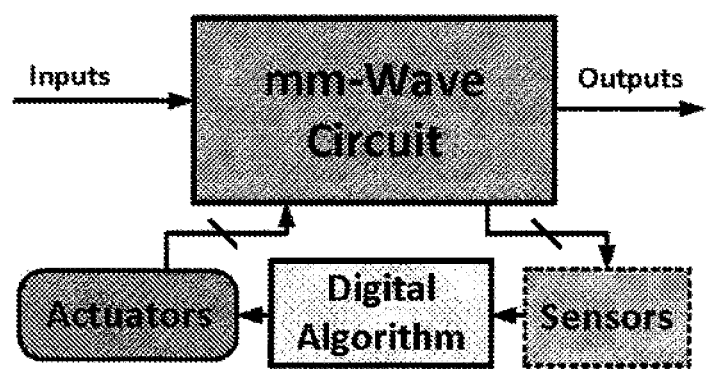
FIG. 8 is a schematic block diagram of a generic self-healing system for mm-wave circuits.

The second, more scalable approach is to sense the performance degradation once it occurs and then adjust the system performance by using various knobs. The ability to dynamically sense and actuate critical blocks of the system eliminates the additional design complexity of variation insensitive circuits. Self-healing is a design methodology that takes advantage of the vast digital processing power that is available on modern CMOS processes to reduce the effects of process and environmental variation on the analog circuits in the system. It uses a feedback loop through a digital processing core to heal the chip back to its optimum performance levels when facing performance degradation caused by these variations. A block diagram of the general self-healing concept is shown in FIG. 8. The self-healing loop starts with integrated sensors that detect the performance of the mm-wave circuit. These sensors need careful consideration as they are being implemented on the same chip as the mm-wave circuit, and thus are subject to the same variations. They preferably are designed to be robust to these variations, so that their outputs are a true measure of the mm-wave circuit's performance, and not dependent on the variation within the sensor. The sensor's outputs are converted to digital bits with an analog to digital converter (ADC) that sends that data to an integrated digital processing core. This core takes that data, runs an optimization on it, and controls digital to analog converters that set actuation points within the mm-wave circuit. The actuation space of the actuators preferably is sufficiently large to cover all of the expected variation the chip may experience, while inducing a minimal amount of performance loss due to their presence. This loop can then be iterated until an optimum actuation state is found.

While this methodology is an excellent fit for healing high performance mm-wave circuits, it has also been used as a resiliency technique to improve the yields of digital design. One such system is found in D. Sylvester, D. Blaauw, and E. Karl, "ElastIC: an adaptive self-healing architecture for unpredictable silicon," IEEE Design Test of Computers, vol. 23, no. 6, pp. 484-490, 2006, which presents a system which utilizes several adaptive processing units in addition to regular processing units and periodically turns off the system and performs a functional check and replaces the regular units with their adaptive counterparts as necessary. An example of an analog based circuit that uses a reconfigurable test scheme is reported in A. Goyal, M. Swaminathan, A. Chatterjee, D. Howard, and J. Cressler, "A new self-healing methodology for RF amplifier circuits based on oscillation principles," IEEE Transactions on Very Large Scale Integration (VLSI) Systems, vol. 20, no. 10, pp. 1835-1848, 2012, where performance of an LNA is detected by reconfiguring it in a feedback configuration and subsequently healed by bias control as well as passive network switching. A healable mm-wave power amplifier is reported in J.-C. Liu, A. Tang, N. Wang, Q. Gu, R. Berenguer, H. Hsieh, P. Wu, C. Jou, and M. C. F. Chang, "A V-band self-healing power amplifier with adaptive feed-back bias control in 65 nm CMOS," in IEEE Radio Frequency Integrated Circuits Symposium (RFIC), 2011, pp. 1-4, wherein based on output power levels, the bias of the core amplifier is dynamically adjusted to provide constant gain thereby improving the 1-dB compression point. In addition, built-in phase compensation provides ability to correct for constellation non-idealities. An indirect method of sensing phase-noise is reported in S. Yaldiz, V. Calayir, X. Li, L. Pileggi, A. Natarajan, M. Ferriss, and J. Tierno, "Indirect phase noise sensing for self-healing voltage controlled oscillators," in IEEE Custom Integrated Circuits Conference (CICC), 2011, pp. 1-4, which utilizes correlation between phase noise and integrated sensor outputs to optimize the system for best phase noise. On-chip PVT compensation has been demonstrated in a 2.4 GHz LNA K. Jayaraman, Q. Khan, B. Chi, W. Beattie, Z. Wang, and P. Chiang, "A self-healing 2.4 GHz LNA with on-chip S11/S21 measurement/calibration for in-situ PVT compensation," in IEEE Radio Frequency Integrated Circuits Symposium, 2010, pp. 311-314, where the input of the LNA switches between off-chip and an on-chip VCO during measurement and calibration phases respectively. A closed-loop method for healing PLL reference spurs is implemented in F. Bohn, K. Dasgupta, and A. Hajimiri, "Closed-loop spurious tone reduction for self-healing frequency synthesizers," in IEEE Radio Frequency Integrated Circuits Symposium (RFIC), June 2011, pp. 1-4, where both spur estimation and correction are per-formed at the VCO control voltage. The work presented in H. Wang, K. Dasgupta, and A. Hajimiri, "A broadband self-healing phase synthesis scheme," in IEEE Radio Frequency Integrated Circuits Symposium (RFIC), June 2011, pp. 1-4 demonstrates integrated phase error detection and self-healing for use in phased array based receivers and transmitters.

Self-Healing Blocks

Sensors

The most vital aspect of sensor design for self-healing circuits is robustness. The mm-wave circuit is designed to be cutting edge, to push the envelope of possible performance, and that means that variations can significantly degrade performance. The sensors, on the other hand, can be designed more conservatively, with robust design topologies and other techniques such as using non-minimum length transistors. Also, because the self-healing loop can be duty cycled, the DC power requirements are more relaxed than in the mm-wave circuit, robust designs that are more power hungry can still be acceptable in some circumstances. In order to design the sensors, the performance metrics of importance must be determined. It is also important to determine if the absolute value of the metric is important, or if it is a metric that must be maximized or minimized. In the case of mm-wave power amplifiers, the output RF power is a metric that often is bounded, but on the other hand efficiency is one that should always be maximized. For metrics that are not bounded, the most important aspect of the sensor is that it is monotonic, so that the optimizer does not get stuck on an artificial local maximum or minimum. The exact value reported in this case does not matter as much, as the optimization will always try to maximize or minimize the metric. For bounded metrics, the sensors need to be much more robust, as the optimizer will attempt to set the chip to a specific operating point that is based upon the absolute value that the sensor is reporting.

Actuators

To enable the mm-wave circuit to adapt to process and environmental variations, actuators need to be built into the design. Ideally these actuators will not affect the performance of the mm-wave circuit, but in practice there will be some cost associated with the actuator, in the form of performance degradation and or power and area consumption. This means that the actuators must be placed sparingly and be designed with the expected variation in mind. In the case of power amplifiers, the expected variation from process variation comes in the form of threshold voltage variation and parasitic capacitance variation, while the environmental variation can include temperature, aging and load mismatch. Thus, the aspects of the design that should be controlled by the actuator are the operating points of the amplifying transistors and the matching networks.

Possible types of actuators can be separated into four broad categories, that cover most of the parameters that a designer has control over when initially designing the amplifier. The first is control of gate bias voltages. By controlling the DC voltage on the gates of the amplifying transistors, the operating point of the transistor can be controlled. This will affect DC current, transconductance, $f_{max}$ of the transistor, gain, RF saturation power, linearity, parasitic capacitances and stability. In the case of cascode or stacked amplifiers, a combination of these parameters can be controlled by independently controlling the various gate bias points. The second type of actuator is tuning of the passive power combining and matching elements. Tuning of the matching elements can ensure that the input and output impedances seen by the amplifier are optimal, and in the case of power combining PAs, can adjust the power combiner in the case of mismatch between the output stages.

The third type of actuator is to actuate the supply voltage. This can enable higher efficiency in low power back off, while still enabling a high power mode with a higher supply voltage, but requires an efficient tunable DC-DC converter.

Another type of actuator involves changing the sizes of the transistors themselves. This can be done by placing many transistors in parallel and switching them in and out of the circuit. This again can help in efficiency in low power back off by reducing the size of the amplifying transistors but the impedance mismatch and the loss associated with the switches can make this type of actuator cost prohibitive. In the example design of the self-healing power amplifier, gate bias control and matching network tuning are employed as actuators.

Data Converters

In order to bridge the analog and digital domains, data converters must be implemented on chip. The sensor data must pass through an analog to digital converter (ADC) to be converted to digital signals that can be read by the digital processing core under control of the digital algorithm. These ADCs must be robust, as the digital algorithm only has access to the ADC's digital output bits, so the aggregate variation of the sensors combined with the ADC determines the accuracy of the performance metric measurement. The analog actuators also need digital to analog converters (DACs) to enable the digital processing core to control analog voltages. To keep overhead down, low power current mode DACs are used to control the analog actuators. Some actuators such as the tunable transmission lines, however, directly take digital inputs and thus do not require the use of DACs.

Digital Algorithm

The systems and methods of the invention use a digital algorithm recorded in the form of instructions on a machine-readable medium in a non-volatile manner. The instructions are carried out by a computer, such as a dedicated computer or a general purpose programmable computer, or can be implemented in hardware that is a special purpose computer.

In order to reach the optimum actuation state, the digital algorithm core needs to first determine the performance of the mm-wave circuit from the sensors, and then decide how to adjust the actuators to improve that performance. There are several components to the digital processing core that can be separated and implemented independently. There will be components for sensor reading, actuator writing, optimization, and global control.

In one embodiment, the global control component will first tell the sensor reading component to deliver the sensor data by querying the ADCs to return the state of all of the sensors. The global control component then sends this information to the optimization component. The optimization component calculates the performance from these sensor readings and determines the next state to set the actuators to. This is where the algorithm itself is implemented. The global control component then delivers this actuation state information to the actuator writing component, which sends out the bits to the DACs (for the analog actuators) or directly to the digitally controlled actuators. By grouping the digital processing core into these separate module components, more of the code can be reused between different designs, and changes can be made to update the optimization component's algorithm without recoding the other supporting components.

Block Level Vs. Global Healing

It is important also to consider block level verses global healing. While the scope of this discussion just deals with block level healing of just the power amplifier block, global healing of the entire transmitter can be useful as well. For example, if the transmitter is operating in a low power back off mode, it may be advantageous to adjust the gains of the preamplifiers and mixers, not just the bias points of the power amplifier to lower the overall DC power consumption and improve efficiency, or to tradeoff between linearity and power consumption. The entire healing digital processing core for the transmitter can be contained in a single centralized core, or it can be broken up into smaller block level cores that are controlled by a transmitter level global healing core. By incorporating self-healing both at the block level and transmitter level, maximum performance can be achieved.

Figure 9:
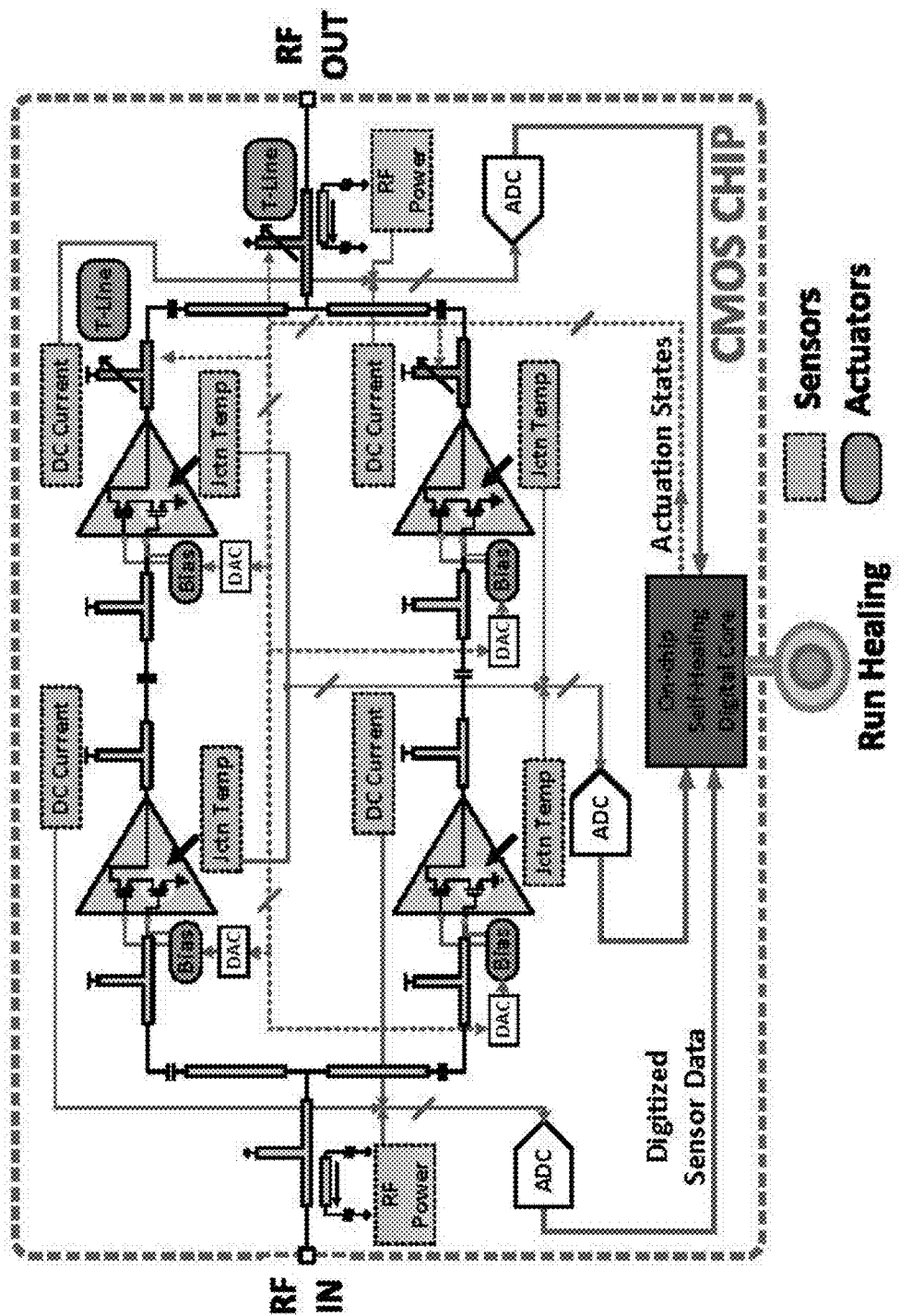
FIG. 9 is a schematic diagram showing the block level architecture of one embodiment of an integrated self-healing PA. Data from three types of sensors is fed through ADCs to an integrated digital processing core. During self-healing, the digital processing core closes the self-healing loop by setting two different types of actuators to improve the performance of the power amplifier.

Design Considerations and Architecture for a Self-Healing Power Amplifier Example Embodiment FIG. 9 is a schematic diagram showing the block level architecture of one embodiment of an integrated self-healing PA.

The example PA is a fully integrated self-healing PA at 28 GHz implemented in a standard 45 nm SOI CMOS process. It is a 2 stage, 2-to-1 power combining class AB PA matched to 50 at the input and output. The interstage matching network and output power combining matching network are designed to provide the optimum impedance for maximum saturated output power. The first stage is half the transistor size of the output stage, to ensure that the output stage can be fully driven into saturation. Class AB design was chosen in order to enable linear operation and to allow for non-constant envelope modulation schemes to be implemented.

Data from three types of sensors is fed through ADCs to an integrated digital processing core. During self-healing, the digital processing core closes the self-healing loop by setting two different types of actuators to improve the performance of the power amplifier.

Figure 10:
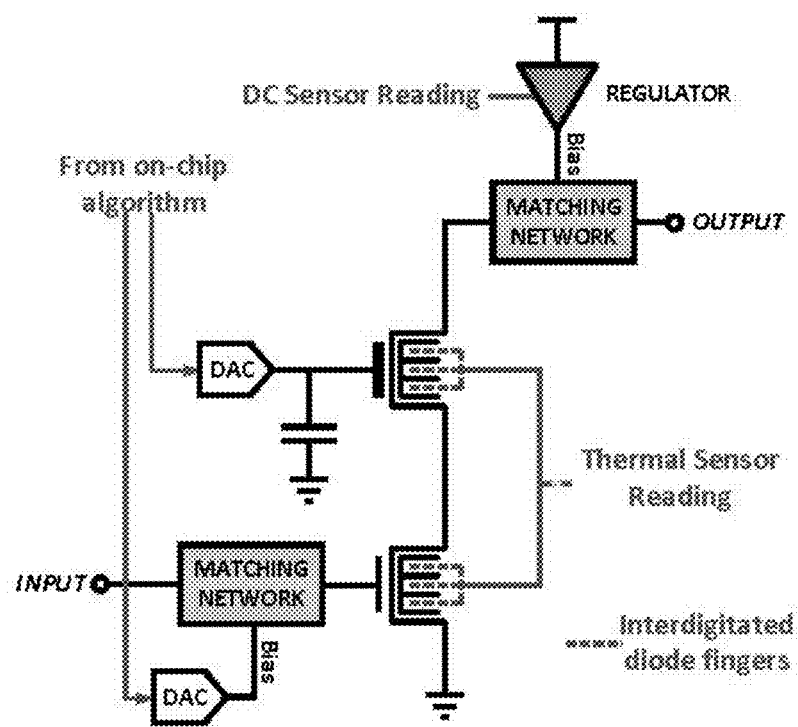
FIG. 10 is a schematic circuit diagram of a single cascode amplifying stage showing connections to matching networks, gate bias actuators, DC sensor and temperature sensor.

To increase the gain of each amplifying stage, each stage is a cascode amplifier, and two stages are used to further increase the gain. The common source transistors are 56 nm analog transistors, while the cascode transistor is a 112 nm thick gate oxide transistor to increase the voltage breakdown of the amplifier. A schematic of one of the output amplifying stages is shown in FIG. 10, showing the connections through the matching networks, as well as several of the sensors and actuators that will be discussed in the following sections. The three matching networks use a 2-stub matching technique, and biasing is done through the AC short circuits at the end of the stubs. A metal AC coupling capacitor is used to allow for independent biasing of the inputs and outputs of the amplifying stages. Full 3D electromagnetic simulations of the matching networks including the capacitors and pads were performed to ensure proper functionality.

There are three main metrics of interest that will define the performance of the example mm-wave power amplifier: output power, power gain, and DC power. This means that to be able to calculate the performance of the PA, the self-healing sensors need to be able to detect input and output RF power, and DC power. RF power sensors are thus placed at the input and output ports of the amplifier, and DC power is sensed both electronically through DC sensors as well as thermally through temperature sensors. On the actuator side, gate bias actuators are implemented on all amplifying stages, and the stubs of the output power combining matching network are tunable to enable tuning of the output network. These sensors and actuators will be discussed in more detail in subsequent sections.

Sensing: Detecting Critical Performance Metrics

As discussed hereinabove, on-chip closed-loop autonomous healing requires regular monitoring of the relevant system parameters, and applying self-correcting measures until the desired performance level is achieved. In the case of a power amplifier, the relevant parameters may include input and output power (and therefore gain), DC power consumption, junction temperature of the core power devices and linearity measurements such as $P_{1dB}$, output inter-modulation products, spectral regrowth, amplitude and phase distortions or output signal constellation. The sensor system needs to measure these parameters on-chip reliably and send the collected data to the central healing unit for performance optimization. Evidently, the on-chip sensors will be affected by the same process variations, mismatches and other factors which degrade the performance system under consideration which needs to be healed. Therefore, the design of the sensors need to ensure that their performance is less affected by the same variations than the system block or sub-block which is to be healed.

We discuss the overview of sensor design, design considerations and trade-offs, some design examples of low-overhead sensor implementation for a mm-Wave PA amplifier. Specifically, we will discuss sensor design related to measurement of true RF and mm-Wave power (which takes into consideration load mismatches) and low-overhead DC current sensors. The application of such sensors are very broad in a transceiver design and could be applicable to various other circuit blocks such as LNA, mixers, oscillators and others.

Overview of Sensor Design

There are several design considerations for reliable on-chip sensor design, which often directly trade-off with each other. The important characteristics are listed below.

Responsivity

Responsivity of a sensor is defined by the change in the sensor response corresponding to unit change in the sensed parameter. Evidently, a stand-alone measurement of responsivity of the sensor system without the noise contribution does not correlate with the achievable sensor sensitivity. Higher responsivity could be obtained by adding successive gain stages, but this also amplifies the noise contributed by those stages. It is, therefore, important to optimize the physical mechanism which is exploited for sensing the desired parameter. In the case of RF power and device temperature measurement (as described later in this section), it could be the nonlinearities of the transistor trans-conductance which is a function of its operating condition or the placement and layout of thermal diodes relative to the PA core whose rise in temperature needs to be sensed.

Noise and Sensitivity

The sensitivity of the sensor is limited by the output noise spectral density due to the active and passive elements constituting the sensor circuit and the quantization noise of the following digitizer. The power spectral density of the noise at the sensor output can necessitate techniques to avoid being swamped by the 1/f noise such as chopping, correlated double sampling and other noise sources. In the power amplifier example, the sensor outputs such as the input and output RF power, DC power and device temperature are converted to a DC output. The sensor resolution is primarily limited by the resolution of the subsequent ADCs, since the noise is low-pass filtered at the sensor output.

Dynamic Range

Dynamic range often trades-off directly with responsivity and this may necessitate a nonlinear responsivity profile to cover a large dynamic range. A logarithmic amplifier was implemented in Y. Huang, H. Hsieh, and L. Lu, "A build-in self-test technique for RF low-noise amplifiers," IEEE Trans. on Microwave Theory and Techniques, vol. 56, no. 5, pp. 1035-1042, 2008, to facilitate gain detection in decibels. In the present case of the power amplifier, the entire range of the RF input power is expected to lie between 0-10 mW, while the output power varies within 0-100 mW, consuming between 0-40 mA and 0-80 mA per input and output stage respectively. All the sensors are designed to be linear within this operating range.

Monotonicity, Linearity and Offset

The linearity requirements of the sensors depends on the self-healing algorithm, the performance metrics which are needed to be optimized and if they are pre-calibrated. Assuming that the sensors are not calibrated and if we need to actuate the PA into its maximum output power state, then monotonicity of the output RF sensor can guarantee successful convergence. However, if the on-chip algorithm needs to evaluate the output power corresponding to the maximum PAE, then the corresponding sensors need to be linear. The linear response can also help in a two-point on-chip calibration method that can measure the offset and responsivity. The offset is measured and canceled at the start of the algorithm for the amplifier presented.

Response Time

The settling time of the sensor determines the speed of the healing process, since the sensors need to be measured every time an actuation signal is commanded from the central healing core. However, faster sensor response also means larger bandwidth at the sensor output leading to higher output noise power. Thus, response time can trade-off directly with sensitivity. In this design process, the settling time is designed to be less than 1 µs so that even the exhaustive search healing algorithm can run in less than 1 second.

Power and Performance Overhead

The power-area overhead for the sensor needs to be carefully optimized so that the performance of the system is not adversely affected by the addition of the sensors. It could be prudent to integrate the sensors with the other existing ancillary circuits. In the case of the PA example, the DC current sensor is integrated with the on-chip regulator. The digital processing core is designed to fit within the area between two PA paths, which would have been vacant otherwise. The thermal diodes are closely packed with the PA core, so as to reduce any stray parasitic effects and the RF sensors are kept short. The total sensor overhead for the power amplifier is less than 6%.

It is to be noted that all the relevant parameters need not be measured directly. In the example shown later, the DC power dissipation in the PA is measured in the non-electrical domain by the resultant rise in temperature of the device core, using the procedures in K. Sengupta, K. Dasgupta, S. M. Bowers, and A. Hajimiri, "On-chip sensing and actuation methods for integrated self-healing mm-wave CMOS power amplifier," in IEEE MTT-S International Microwave Symposium Digest (MTT), June 2012, pp. 1-3.

Measurement of RF Power

Input and output RF power sensors are necessary to estimate gain and power delivered to the load. Ordinarily voltage sensors placed at the output port can sense the true RF power delivered as long as the output load remains constant. However, due to environmental changes or load-impedance mismatch events, the output load is rarely ever 50Ω. We present RF sensors which detect both the forward and the reflected power to estimate RF parameters in face of VSWR events.

At mm-wave frequencies, coupled transmission lines can be used to sense power. It is to be remembered that in a self-healing setting, the coupling strength is desired to be small, to avoid significantly perturbing the power flow through the main circuit. Therefore, unlike traditional couplers, the sensors do not need λ/4 long transmission lines, as explained in details below. At lower RF frequencies, transformer-based coupling may be the more efficient method of coupling a fraction of the power to be sensed. In either case, the sensor designs be made both area and power-efficient. In the following design example for a PA operating near 28 GHz, two coupled transmission lines are implemented for the input and output port of the PA as shown in FIG. 11A. The couplers are kept compact and short at 220 μm for low insertion loss of 0.5 dB at 28 GHz. This also minimizes the coupling coefficients which are designed to be at 18 dB and 21 dB at the input and output respectively so that only a small fraction of the input and output power is sensed by the couplers for estimation of gain and the power delivered. The transmission lines are implemented with 1.2 μm thick copper line in a metal ground tub as shown in FIG. 11B. The figure also shows the measured S-parameters of the input and output coupler. The input matching is better than 18 dB between 25-45 GHz and the isolation is more than 28 dB. The coupling coefficients vary by less than 3 dB between 25-35 GHz.

Figure 12A:
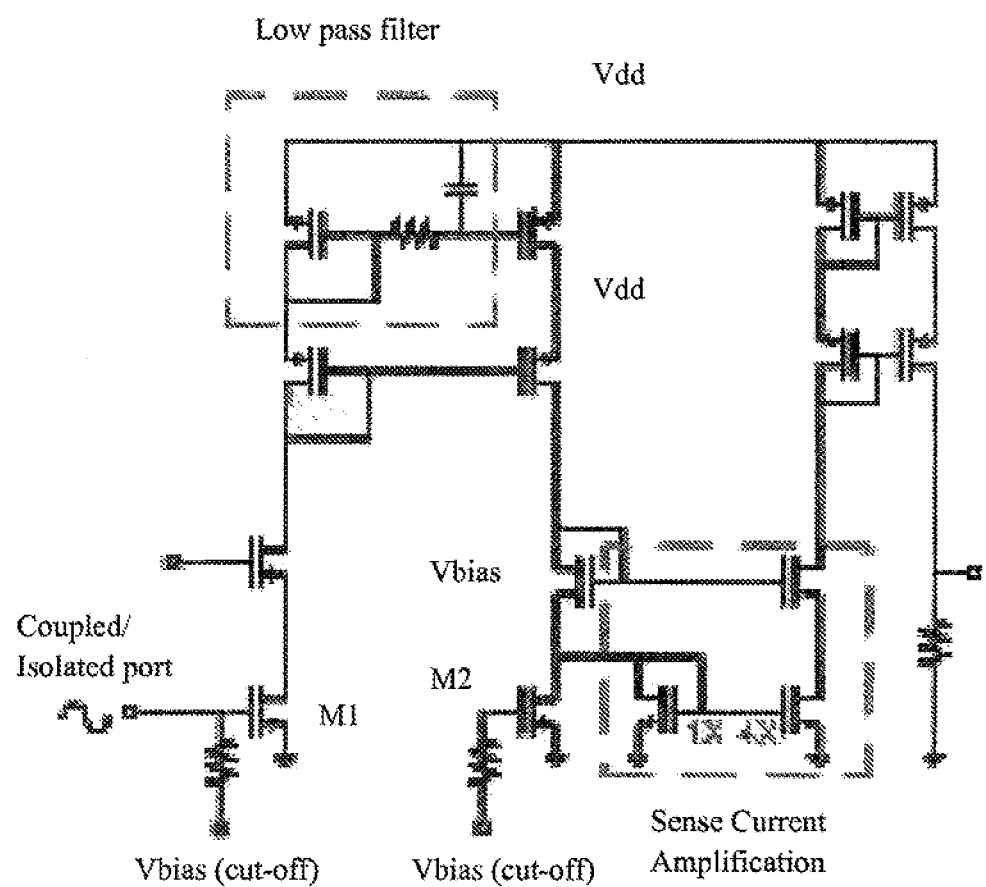
FIG. 12A is a schematic diagram of a power sensor showing rectification, low-pass filtering and detection current amplification.
Figure 12B:
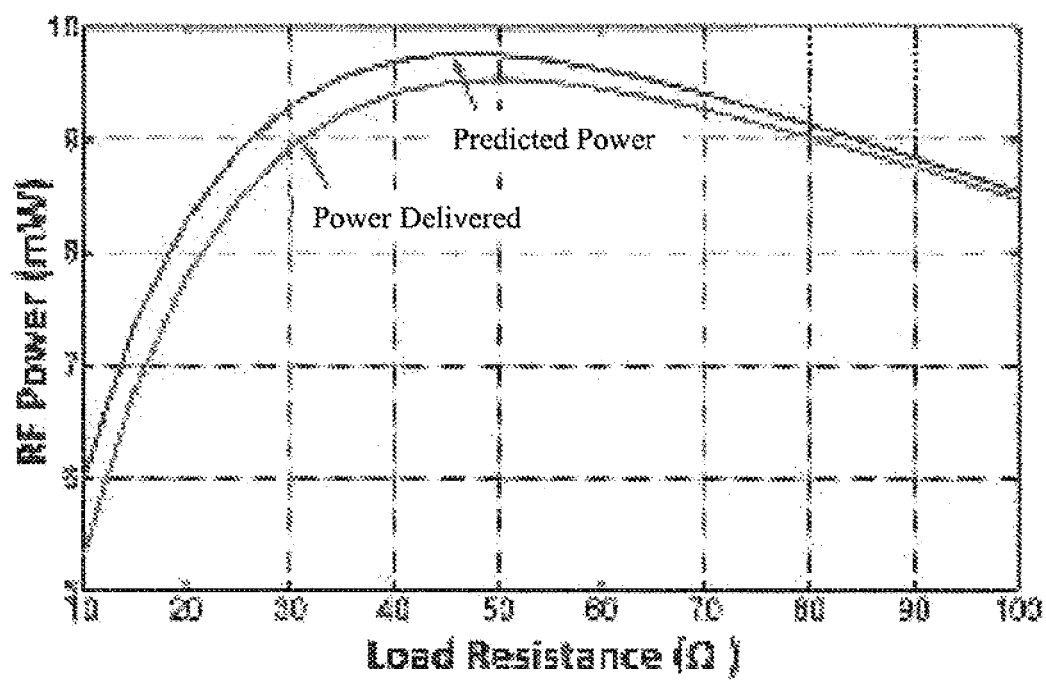
FIG. 12B is a graph that shows the predicted and simulated true RF power delivered to the load as the impedance is varied between 10-100Ω.
Figure 13A:
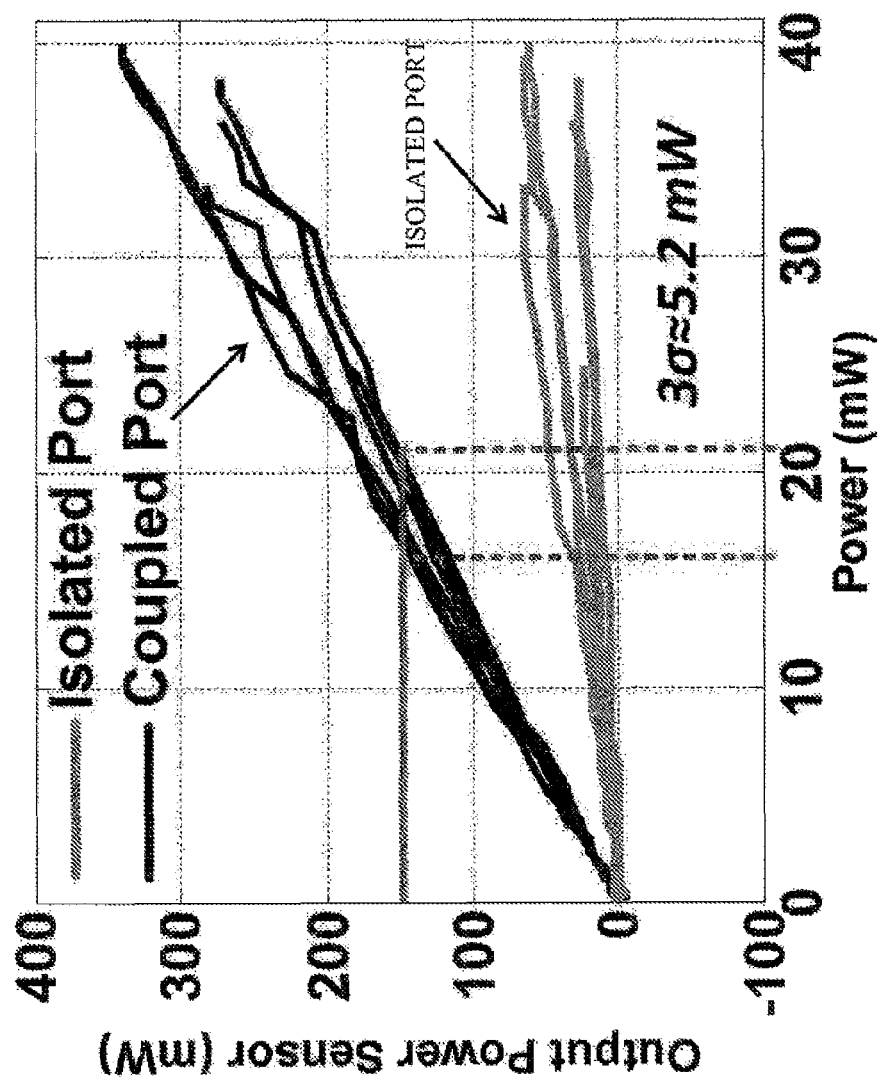
FIG. 13A is a graph of the measured RF power detector response of the output power sensor at 28 GHz over 6 chips using coupled and isolated ports.
Figure 13B:
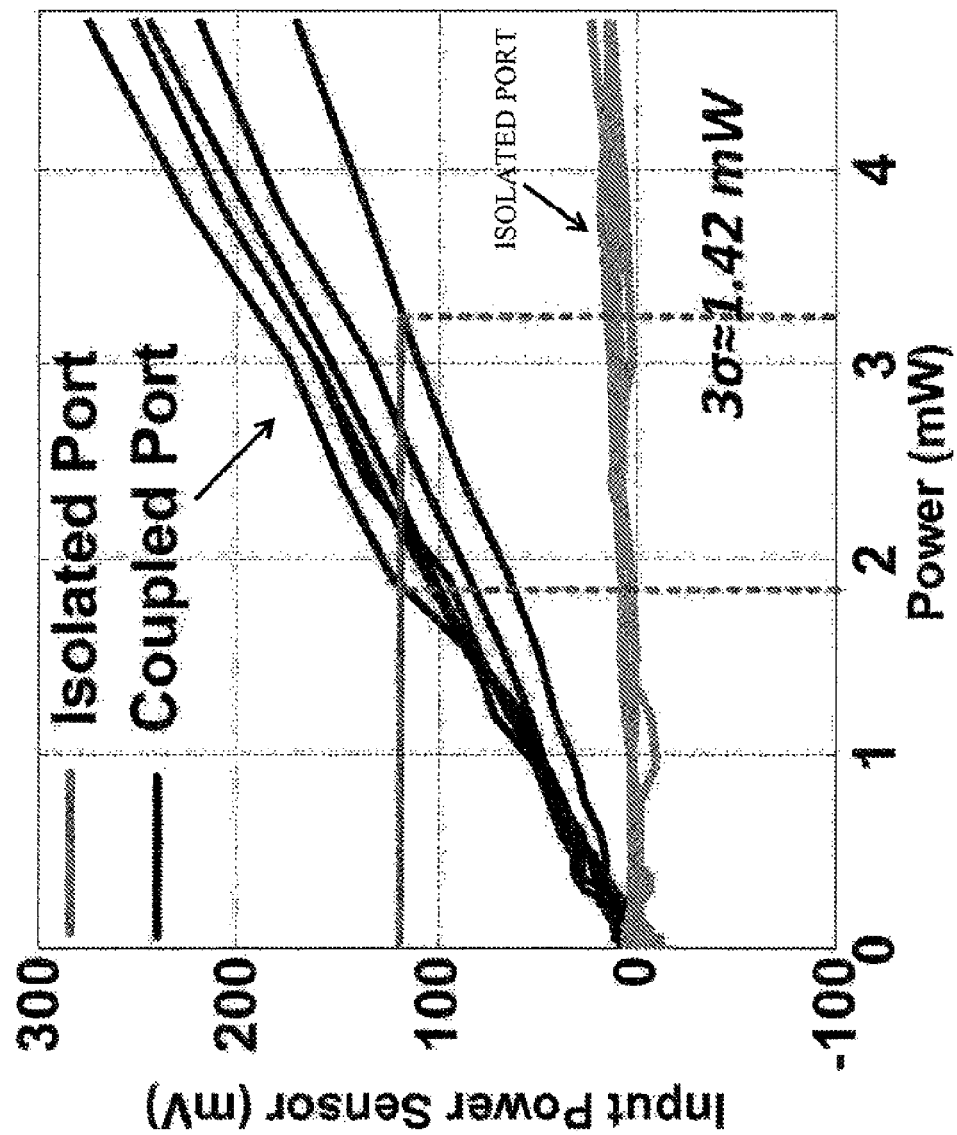
FIG. 13B is a graph of the measured RF power detector response of the input power sensor at 28 GHz over 6 chips using coupled and isolated ports.

Once the true RF power is converted into voltage swings at the matched coupled and isolate ports, it is measured by the power RMS voltage detector circuit as shown in FIG. 12A. Integrated RMS voltage detectors have been demonstrated in bipolar devices based on trans-linear principles and in CMOS at RF frequencies. The sensor is biased at cut-off. It relies on the nonlinearities of the transistor to generate a DC current proportional to the input power which is given by $$i_d(\theta) = \frac{i_{max}}{1 - \cos(\alpha/2)}(\cos\theta - \cos(\alpha/2)) \quad \text{Eqn. 2}$$

$$i_{dc} = \frac{1}{2\pi}\int_{-\alpha}^{\alpha} i_d(\theta)\,d\theta = \frac{i_{max}}{\pi} \quad \text{Eqn. 3}$$

where $i_{max}$ is the peak current and α is the conduction angle. The rectified signal is then low pass filtered and amplified in the current domain, and measured across a resistor as shown in FIG. 12A. A matching transistor M2 subtracts the standby current of M1 increasing the dynamic range. FIG. 12B also demonstrates the ability to evaluate the true RF power delivered to the load in case of a load-mismatch event. The predicted power is given by $P_{del}=(P_c-P_I)/k$, where $P_c$ and $P_I$ are the power delivered at the coupled and isolated ports respectively, k is the coupling coefficient and $P_{del}$ is the estimated power delivered to the load (through-port). The difference between the two plots is the effect of neglecting the insertion loss. FIG. 13A and FIG. 13B demonstrate that the output and input power detectors with couplers achieve responsivity of 8.3 mV/mW and 54 mV/mW respectively and consume 1.2 mW of DC power each. The 3-σ spreads of the true RF power for a measured sensor output are approximately 1 dB and 2 dB for output and input sensors respectively over 6 chips. The variation of the power sensor output across chips, primarily comes from the active circuitry which exploits the nonlinearity of the sensor transistor to convert an input RF signal into a DC signal. For many self-healing algorithms such as minimization of output power, the monotonicity of the sensor performance is enough to guarantee convergence. In algorithms where absolute power requirement needs to be met, a conservative estimate based on measurement of multiple such sensors can be used. It is to be remembered that since the coupler and the accompanying sensor circuits are broadband (unlike the PA), their performance are less sensitive to process variations and mismatches compared to the tuned circuitry, whose on-chip performance is being measured.

Measurement of Dc Power Consumption and Efficiency

Figure 14:
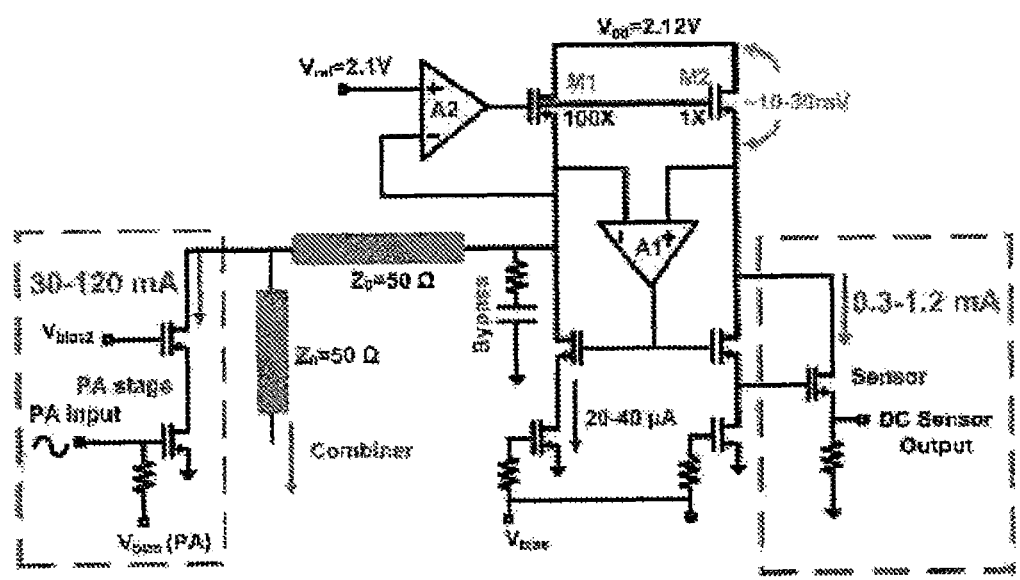
FIG. 14 is a schematic diagram of the DC sensor of the PA. The current through PA is mirrored by a factor of 100 and sensed, also accomplishing voltage regulation with a headroom of only 10-30 mV.

It is challenging to measure the DC drawn by a high power, high frequency PA during operation. One possible method is to sense the DC current through a small resistor in series with the amplifier. However, due to large currents in the PA, this can lead to excess power loss and parasitics. The method adopted in this example centers around mirroring the current accurately from the PA through another path and sensing it across a load. However, in order to mirror the current accurately without sacrificing efficiency, overhead transistors are kept in deep triode under voltages from 10-30 mV as shown in FIG. 14 under a 2.12 V supply. The current though a PA is scaled down by a factor of 100 and mirrored through matched transistors M1 and M2 as shown in FIG. 14. An accurate mirroring of the current will, therefore, require both the source nodes of M1 and M2 held at the constant potential which can be set externally by $V_{ref}$, as shown in FIG. 14. This allows us to accomplish supply regulation and current-sensing at the same time. The op-amp A1 forces the source nodes of M1 and M2 to be at the same voltage for accurate mirroring of the current, while the sensor current through M2 is converted into the sensor DC voltage as shown in FIG. 14.

Figure 15A:
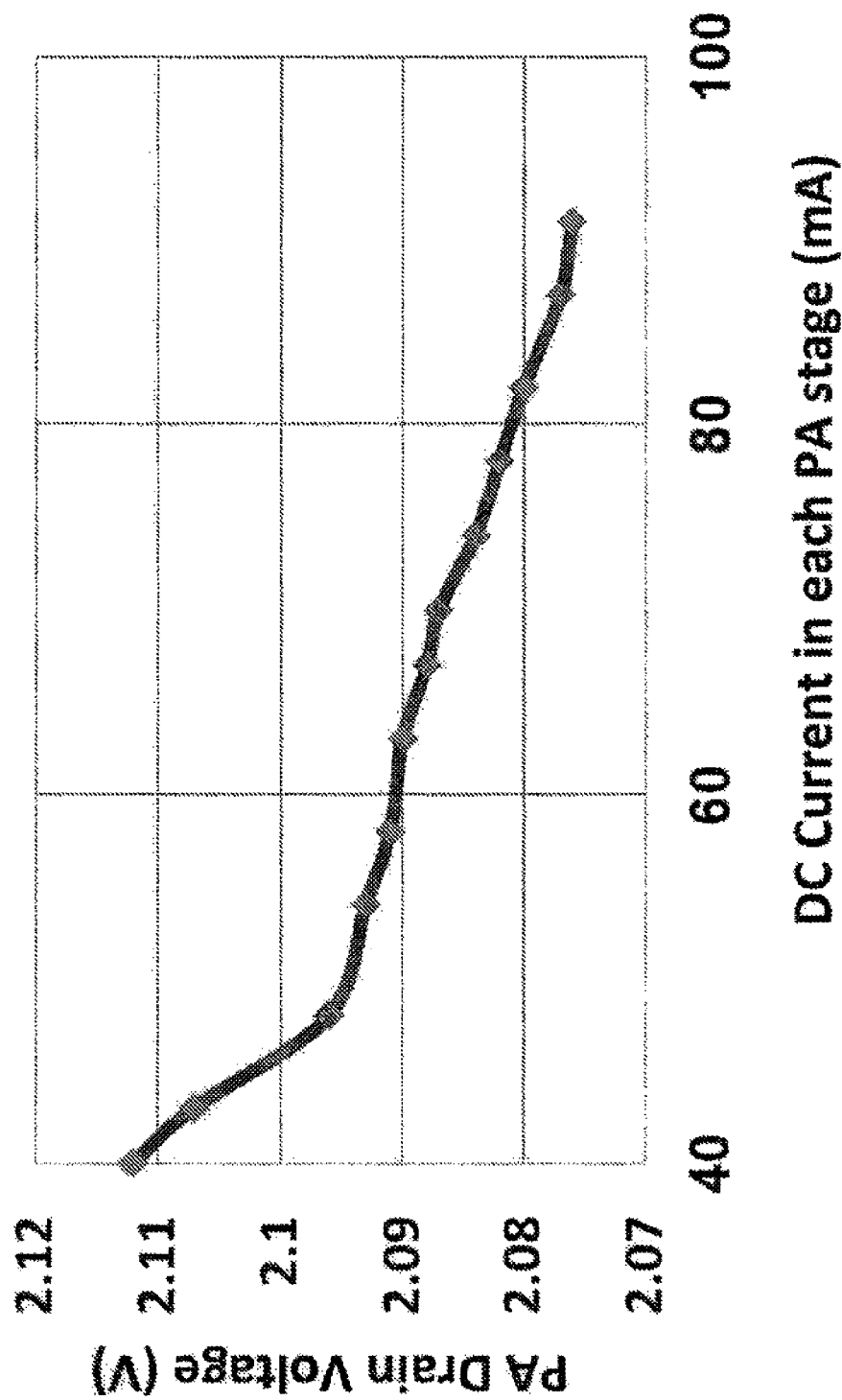
FIG. 15A is a graph of PA drain voltage vs. DC current in each PA stage.
Figure 15B:
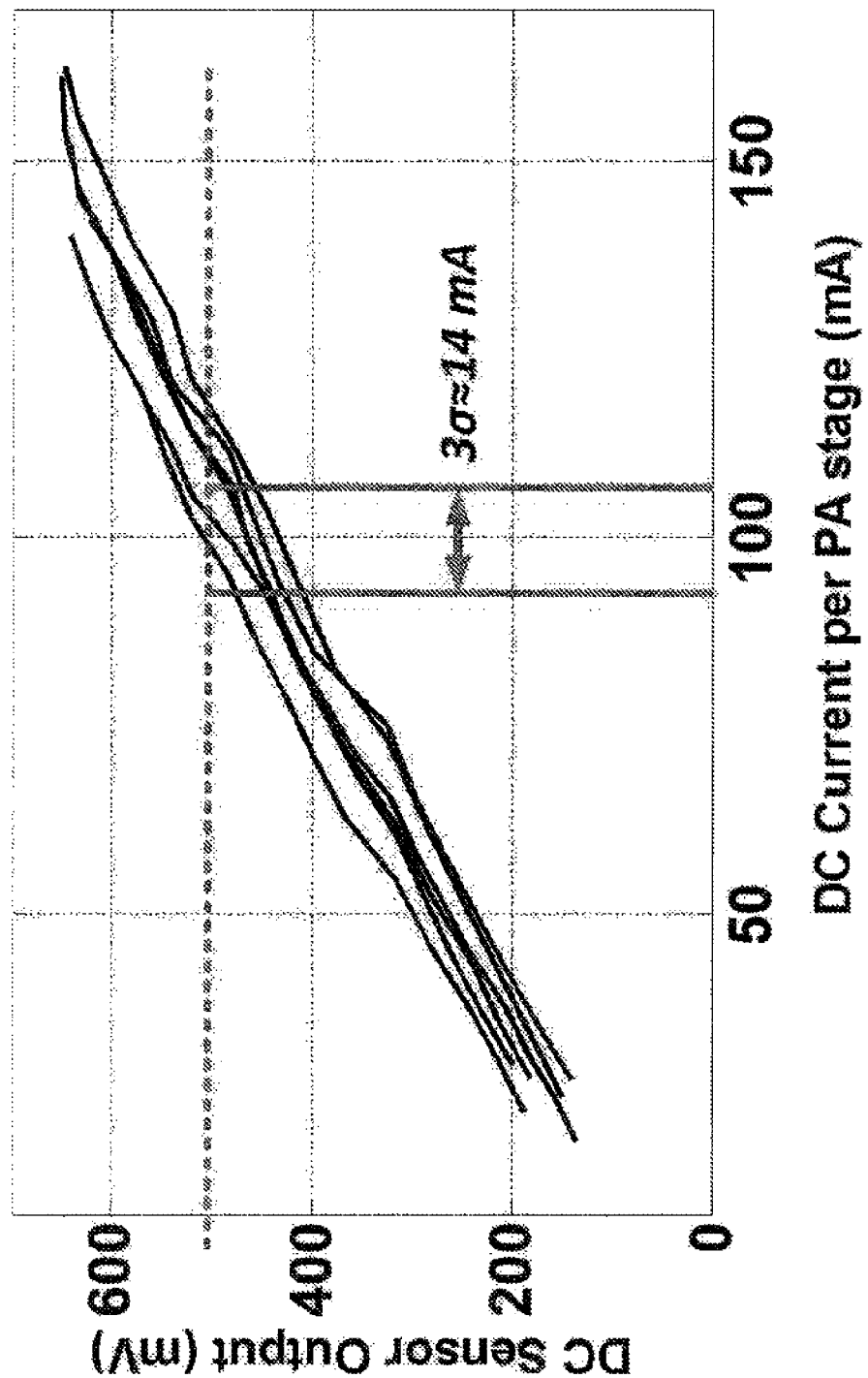
FIG. 15B is a graph of DC sensor output vs. DC current in each PA stage. The measured headroom for the sensor is maintained below 50 mV over the 2.12 V supply as the PA current is varied between 0-90 mA. The DC sensors therefore are maintained in extreme linear region, thereby not affecting the PA efficiency. The data was measured for 5 different chips.

The effective voltage regulation is shown in FIG. 15A, which illustrates that the headroom is held below 50 mV for the entire range of current actuation between 0-90 mA, thereby not affecting the PA efficiency. FIG. 15B also shows a measured responsivity of 4.2 mV/mA current drawn based on 5 chips. The 3-σ spread of the PA current for a measured sense voltage is less than 14% over all the chips. The total power consumption of the sensor is less than 1.7 mW.

Local Temperature Sensing to Measure PA Efficiency

In order to monitor the PAE or PA efficiency on chip, the DC power drawn can either be measured directly by sensing the current as described previously or it could be measured indirectly in a non-electrical domain. The concept relies on the idea that due to power dissipation, the temperature of the core device and an area around it will experience a rise in temperature proportional to the power dissipated during the PA operation.

Figure 16A:
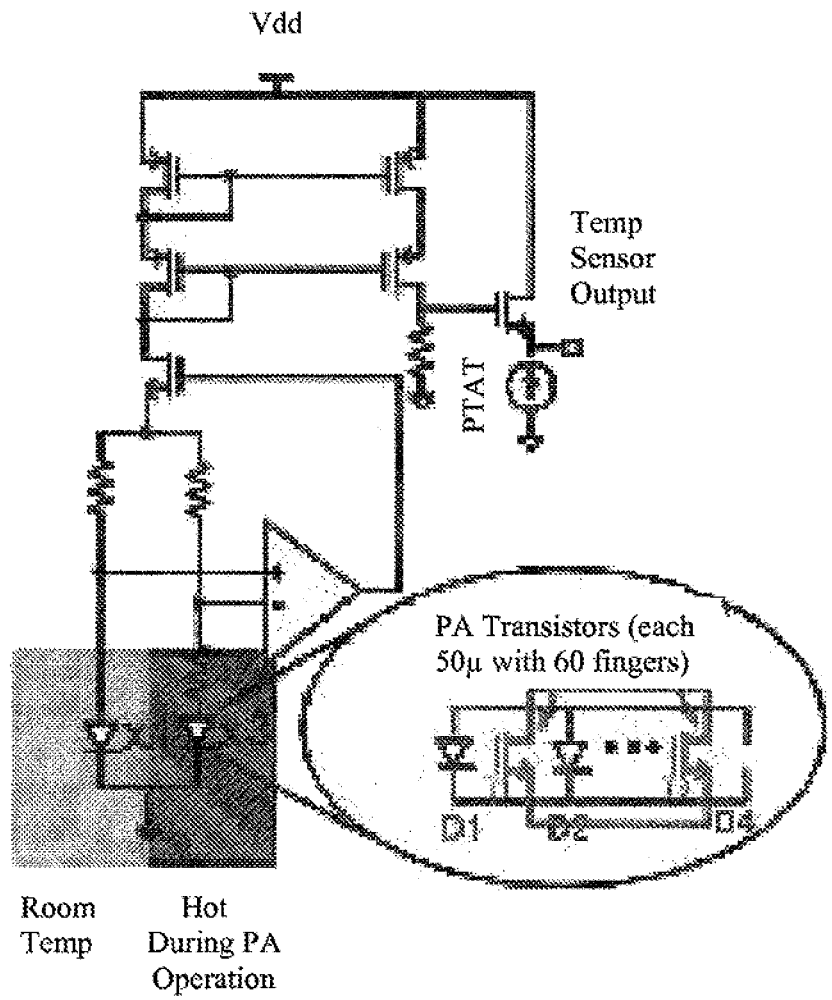
FIG. 16A is a schematic diagram of the temperature sensor showing 'hot' sensor diodes interspersed within a PA transistor.

In order to predict accurately the temperature change during PA operation, thermal simulations were carried out using Ansoft ePhysics 2.0. The silicon substrate is an excellent thermal pathway, however metal connections and vias also affect the temperature change and therefore needs to be incorporated in the simulation. Simulations and theoretical prediction indicated that the temperature profile falls sharply beyond a radius of 20-30 μm of the PA transistors during operation, with the core rising by 10° C. Hence, p-n junction sensor diodes were laid within the input and output PA transistors (thermally active region), both at the common source and the cascade transistor as shown in FIG. 16A. In order to increase the responsivity, the x1 diode is placed outside the local thermally sensitive region (~40 μm away) as shown in FIG. 16A leading to a factor of 10 increase in responsivity. It can be proved that if diodes of sizes x1 and xN are kept at two different temperatures T and T+ΔT, and if the same currents are forced through them, the difference between their $V_{be}$ is given by $$\Delta V_{be} = V_T(m+4)\ln\left(1 + \frac{\Delta T}{T}\right) + V_T \ln N + \left(\frac{E_g}{q} - V_{be,n}\right)\frac{\Delta T}{T+\Delta T} \quad \text{Eqn. 4}$$

where $V_T \approx 26$ mV, $V_{be,n} \approx 700$ mV, $E_g \approx 1.12$ eV (bandgap of silicon), $m \approx -3/2$. A regular temperature sensor, where both the diodes experience the same global temperature change, takes advantage of the term $V_T \ln N$ to establish $$\frac{\partial V_{be}}{\partial T} \approx k/q \approx 8{:}67 \times 10^{-5} V/K.$$

By placing the x1 diode in a constant temperature region, the designed local temperature sensor takes advantage of the last term $$\left(\frac{E_g}{q} - V_{be,n}\right)\frac{\Delta T}{T+\Delta T}$$

to establish $$\frac{\partial V_{be}}{\partial T} \approx \frac{\left(\frac{E_g}{q} - V_{be,n}\right)}{T} \approx 1{:}33 \times 10^{-3} V/K.$$

Since the range of temperature change is limited, we sacrifice linearity over large range with sensitivity.

Figure 17:
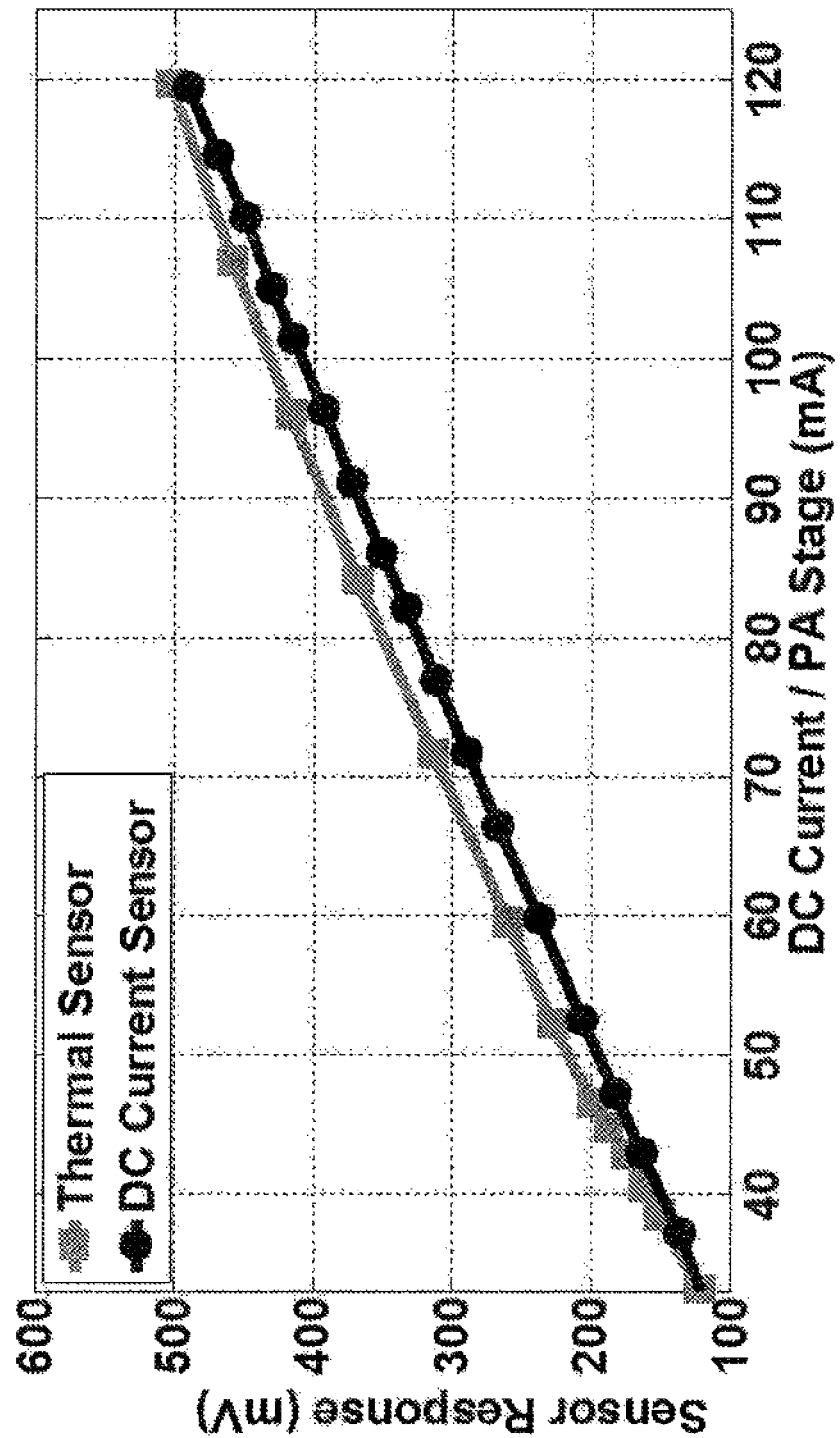
FIG. 17 is a graph showing measured temperature sensor output and DC sensor output with increasing DC power dissipation in a PA.

FIG. 17 shows the measured responsivity of 2 mV/mW of dissipated power under a 2.12 V supply. The thermal as well as the DC sensor show similar monotonic variation with DC power drawn by the PA. The response of the thermal sensor is, however, limited by the thermal time constant. The measured results are in close agreement with predicted results from thermal and circuit simulations. The sensor performances are summarized in Table 1.

TABLE 1

| Sensors | Measured Entities | Responsivity | Range | Sensor 1-bit resol. |
|---|---|---|---|---|
| True RF Power DC Sensor | In. Power | 54 mV/mW | 0-10 mW | 55 μW |
| | Op. Power | 8.3 mV/mW | 01-100 mW | 300 μW |
| | DC drawn by | | | |
| | Ip. Stage | 8.5 mV/mA | 0-60 mA | 280 μA |
| | Op. Stage | 4.2 mV/mA | 0-120 mA | 560 μA |
| Thermal Sensor | Power dissipated | | | |
| | Ip. Stage | 4.0 mV/mA | 0-130 mW | 0.75 mW |
| | Op. Stage | 2.0 mV/mA | 0-260 mW | 1.5 mW |

Actuation: Countering Performance Degradation

In order for the self-healing system to be able to improve the performance of the mm-wave circuit, actuators that are controlled by the digital algorithm are required. It is important for the actuation space cover the expected space of variation, so that the optimum point for any expected variation is still within the actuation space.

The expected process variations that are considered include chip-to-chip process variation, and mismatch between devices on the same chip. The main sources of this variation are variation in dopant levels and variation in gate thicknesses that affect threshold voltage and parasitic capacitance. Within the context of power amplifier design, these types of variations are expected to change the operating points of the transistors, can change the maximum gain and $f_{max}$ of the transistors, and are expected to affect the desired input and output impedances for maximum power generation. The environmental variations that are expected to be considered include load impedance mismatch, temperature variation and transistor degradation and failure due to effects such as aging. Load impedance mismatch is expected to affect the output matching network, and is expected to detune the system, lowering the output RF power supplied by the output amplifying transistors as well as possibly increasing the loss due to the output power combiner matching network. Temperature variation is expected to mainly show up in transistor performance, and is expected to affect the matching, bias and saturated power of the amplifying transistors. To a lesser extent, it is expected to affect the passives, and is expected to change the matching networks, but this effect is much less dominant. Transistor degradation due to aging is expected to reduce the gain and saturated output power of the transistors, and is expected to affect the output matching, to the point where complete failure of some of the output transistors can severely degrade the matching network's ability to provide the optimum load impedance to the other functional transistors. There is expected to be degradation to the output signal due both to less power being generated by the output transistors, as well as degradation due to mismatch in the output power combining matching network.

How then do we select appropriate actuators to cover the effects of all of these variations? A good actuator should cover a large actuation space while having a minimal impact on the performance of the amplifier in the nominal case. Every actuator will cause some degradation, whether it be to decreased RF power, increased DC power, or even occupying area on the chip, but keeping this degradation to a minimum will make the system have a net positive effect on the performance once the healing loop is turned on.

There are several possible actuators for mm-wave PAs that generally fall into four categories: gate bias voltage actuators, passive matching network tuning actuators, supply voltage actuators and transistor architecture actuators.

Gate Bias Actuators

Control of the gate voltages of the transistors is one of the most effective, lowest cost actuators available to the designer. By adjusting the gate of the common source transistors and any stacked or cascode transistors, the operating points of the transistors can be changed. These actuators can be very low cost, due to the high DC gate resistance of CMOS transistors, so adjusting the voltage of the gate does not inherently draw any extra DC power. In general, for class AB PA operation, the transistors should be biased such that the $f_{max}$ of the transistor is maximized. This biasing point is heavily dependent on the threshold voltage of the transistors and can vary greatly over process variation. This can enable maximum performance at class AB saturation situations, but control of the gate bias also enables a lowering of the DC power consumption of the power amplifier in power back off scenarios. There is a tradeoff on gain verses DC power in back off.

One way to reduce the output power and achieve back-off power levels is by using a variable gain amplifier before the PA and lower the input power of the PA, but because the PA is the dominant source of DC power consumption, this leads to low efficiencies in back off because the PA is drawing relatively the same amount of DC power as in saturation, but is producing much less RF power. The other way to achieve back off power levels is to trade some of the gain in the power amplifier for lower DC power consumption. By lowering the gate bias of the common source transistors, the PA is expected to saturate at lower power levels, while simultaneously reducing the DC power consumption, significantly raising the efficiency of the amplifier in back off conditions. These actuators require analog inputs and thus will need DACs (discussed in the next section) to convert the digital signal sent by the algorithm to the analog voltage for the actuator. Gate bias actuators are employed on the example PA for the gates of the common source and cascode transistors of both paths of the input and output amplifying stages. Looking back to FIG. 10, the gate bias actuators for the common source transistor are input through a stub in the matching network, while the gate bias control for the cascode stage is biased at the AC short circuit created by the AC coupling capacitor.

Passive Matching Network Tuning Actuators

The second type of actuators are passive matching network tuning actuators. The goal of these actuators is to be able to dynamically retune the matching networks on the chip after fabrication to account for the variations in parasitic capacitances and optimal output loads of the amplifying transistors. Actuators can be added to any type of passive element, and as an example, two types of actuators to create tunable transmission lines for transmission line matching networks will be considered in more depth. For the output power combining matching network, keeping the loss to a minimum is critical, because the output network deals with the highest power levels, and since the loss is expected to show up in the form of attenuation in dBs, this means that loss in the output network is expected to result in the largest actual loss in terms of watts. Also, for maximum performance, the amplifying transistors are expected to be operating near their voltage breakdown and the matching network is expected to transform the impedance to 50Ω from a much smaller impedance, which means that the voltage swing within the output network and at the output is expected to be much larger than the transistor breakdown, and any actuator transistors preferably should be not be placed such that they breakdown.

Using transistors as switches on various parts of the matching network also can lead to tradeoffs in transistor size. To have low loss switches in the on state, the size of the transistor is increased, but this increases capacitance in the off state. This can initially lead to a compromised design that both loads the circuit with capacitance in the off state, and causes loss due to resistance in the on state.

Figures 18A, 18B:
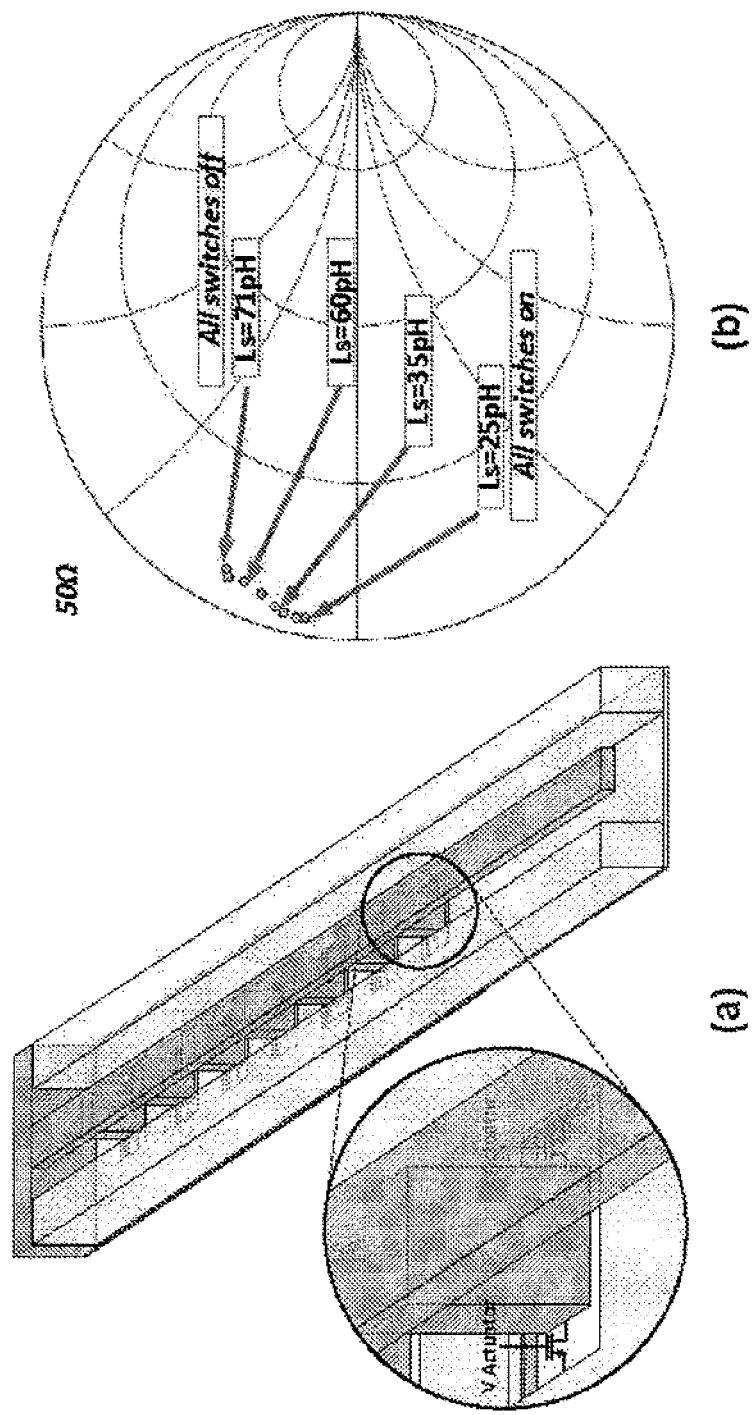
FIG. 18A is a diagram showing a tunable transmission line stub that has switches placed at various points along the line to short out the signal line to the ground, changing the effective length of the stub, with an inset showing a closeup of the actuators.
FIG. 18B is a graph of the measured effective inductance seen looking into the stub for the different actuation states at 28 GHz.

One way to overcome both of these challenges is to tune just the transmission line stubs of the matching network that are terminated with short circuits. The effective length of the transmission line can be changed by shorting out the stub at various points near the end of the line, as shown in FIG. 18A.

Large actuation ranges can be achieved simply by placing actuation switches toward the end of the line, which due to their proximity to the short circuit at the end of the line, keeps the voltage swing low when the switches are off. In addition, because the switches are being placed at regular intervals within the transmission line, the off capacitance can be considered distributed, and can be absorbed into the transmission line model and included in the match. This means that much larger transistors can be used and low on resistances can be achieved. These stubs can be considered as shunt inductors at their connection to the rest of the output network, and measurements of one of these tunable transmission line stubs at 28 GHz shown in FIG. 18B show a tuning range from 25 pH to 71 pH with just 8 switches, showing the large actuation space that these actuators can achieve. Because these actuators are already digital switches, they can be set directly from the algorithm block without the need for any DACs.

Figures 19A, 19B:
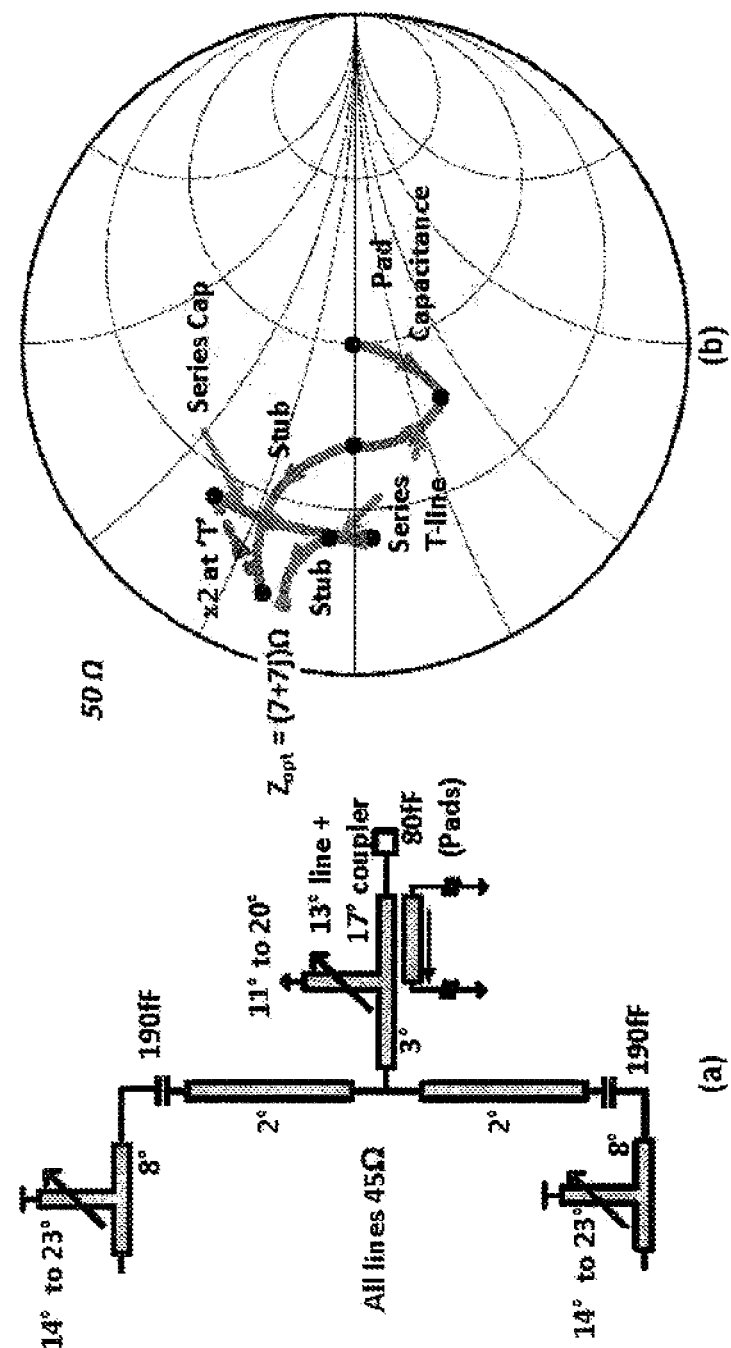
FIG. 19A is a schematic of the output power combining matching network showing the three tunable stubs and the output RF power sensor coupler.
FIG. 19B is a graph showing the mapping of the 50Ω load through each element of the output power combining matching network to the nominal optimum impedance at the output amplifying stage of (7+7j) at 28 GHz.

The example self-healing PA utilizes these tunable transmission line stubs on all three of the output power combining matching network stubs. They were not used on the input matching network or the interstage matching networks because the expected variation in impedances of the loads for those networks (gates of the first and second amplifying stages) was small enough that the advantage of the matching networks did not warrant the additional complexity and loss the actuators come with. The output power combining matching network is shown in FIG. 19A, with the nominal impedance mapping from the 50Ω load to the optimal impedance of the output stage with typical transistors, which for this example is (7+7j) at 28 GHz. One additional benefit of the matching network being tunable is that the two output amplifiers did not need to be isolated. If there is mismatch between them, it can be minimized by tuning the output matching network.

Figure 20B:
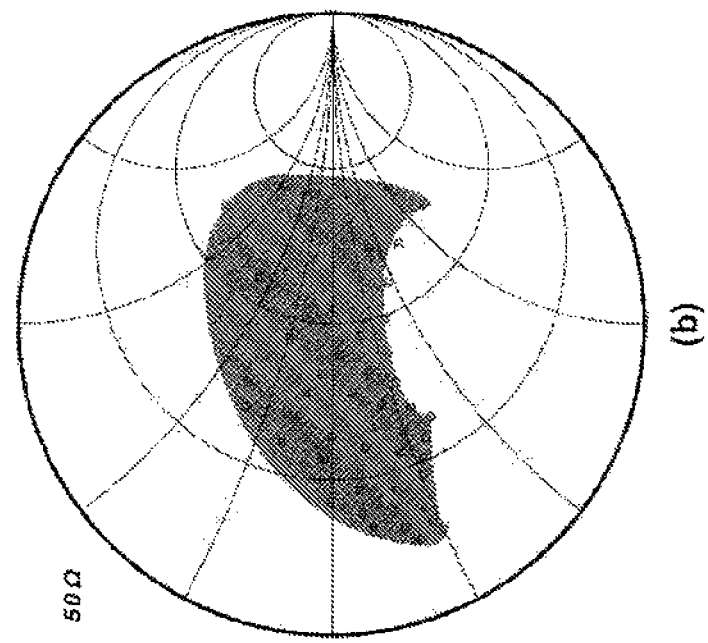
FIG. 20B is a graph showing the actuation space of loads that can be matched to the nominal optimal impedance of (7+7j) at 28 GHz.
Figure 20A:
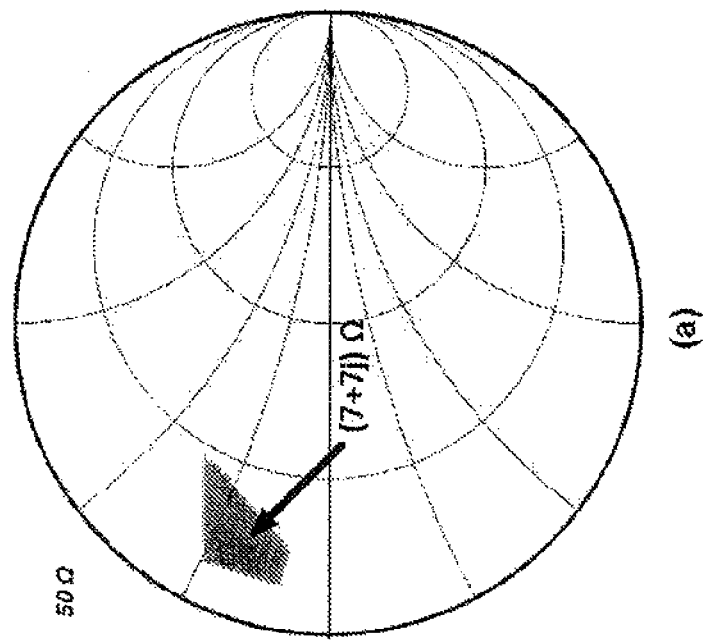
FIG. 20A is a graph showing the simulated actuation space of the output power combining matching network from a 50Ω nominal load.

Using this network, the overall actuation space impedance looking into an input port of the combiner with a nominal load of 50Ω is shown in FIG. 20A, which is larger than the simulated variation of optimal loads that the transistors will experience. Looking from the other way, the actuation space of load impedances that can still be transformed back to the typical optimum impedance of (7+7j) at 28 GHz is shown in FIG. 20B. This means that most loads within the 4-1 VSWR circle can be transformed back to (7+7j), and for the ones that cannot, they can be transformed back to something much closer to the optimal load and the performance can still be significantly increased compared with a static matching network.

Supply Voltage Actuators

Another way to reduce the DC power consumption of the PA is to reduce the supply voltage to the amplifiers. Simply lowering the voltage on chip by dumping the power into a transistor or resistor does not actually decrease the DC power, so efficient tunable DC-DC conversion is required for this type of actuator to be effective. Since these types of converters fall out of the scope of this discussion, this type of actuator is not considered further, but should be kept in the designer's mind, especially if such a block is already being implemented on chip for other reasons and can be taken advantage of by the self-healing system.

Transistor Architecture Actuators

Changing the size or architecture of the transistors themselves is also a possibility for actuators for mm-wave PAs. One can imagine that an easy way to deal with saturated output RF power degradation is simply to increase the size of the amplifying transistors. Switching fingers of transistors in and out of the circuit, however can cause significant losses in performance from two dominant sources. The first is that the switches used to switch the transistors in or out is expected to either have higher on resistance or off capacitance, and both are expected to cause signal degradation. Secondly even if perfect switches were available, changing the size of the transistors is expected to significantly change the desired matching network, and put much more demand on the tunable matching networks, resulting either in more loss in the matching networks or in mismatch for some transistor sizes. For the example PA, it was determined that the best performance could be achieved by making the transistors large enough to cover the desired saturated output power and to use the gate bias actuators to achieve higher efficiencies while in back off, so transistor architecture actuators were not used.

Data Converters: Interfacing with the Digital Processing Core

An integral part of any self-healing system is data conversion. Analog-to-digital converters (ADCs) are required for converting analog sensor output to digital form for use with the digital healing algorithm. In addition, some of the actuators, for example bias actuators can be controlled directly by the digital ASIC through digital-to-analog converters (DACs).

Because self-healing is a low overhead technique for improving yield, the requirements on these data converters become somewhat stringent.

Analog-to-Digital Converters

As with all other self-healing enabling blocks, the on-chip ADCs preferably should be extremely low power as well as area efficient designs. However, lower power generally implies lower speeds which will lead to a slower computation time for the digital healing algorithm which in turn affects the total healing time. In addition to the overhead versus speed tradeoff, resolution of the ADC also directly affects the accuracy of the healing algorithm. This resolution is chosen based on the sensor responsivity as well as the sensitivity of the system to the different actuators. For example, an RF power sensor responsivity of 10 mV/mW on a 5-bit ADC implies a 1-bit resolution of around 2 mW which may be greater than the sensitivity of the system to one particular actuator. Depending on the nature of the on-chip algorithm, this may lead to convergence issues thereby rendering the self-healing loop unusable.

The fastest ADCs are flash ADCs which operate in a parallel fashion leading to simultaneous generation of output bits. However, because of this parallel computation, these converters usually are among the most power hungry ADCs. In addition, matching requirements for comparing elements become extremely stringent for higher resolutions. Both power as well as design complexity thus limit the use of flash ADCs in self-healing systems. A good compromise between resolution, design complexity and speed is a pipelined ADC. However these ADCs usually occupy larger area as well as consume significant amounts of power. The added complexity in timing synchronization of such ADCs also make them less suitable for low-overhead self-healing applications. The successive approximation register (SAR) based ADCs are serial ADCs which offer several desirable features such as low power consumption, high resolution, reduced design complexity as well as low area overhead. In addition to being suitable for medium data rate applications due to the inherent serial nature of the data output, such an ADC is an ideal candidate for self-healing systems where routing complexity for multiple high-speed digital signals across the chip also needs to be minimized. An 8-bit SAR ADC was chosen for the current self-healing system.

Data from Various Sensors

Figure 21A:
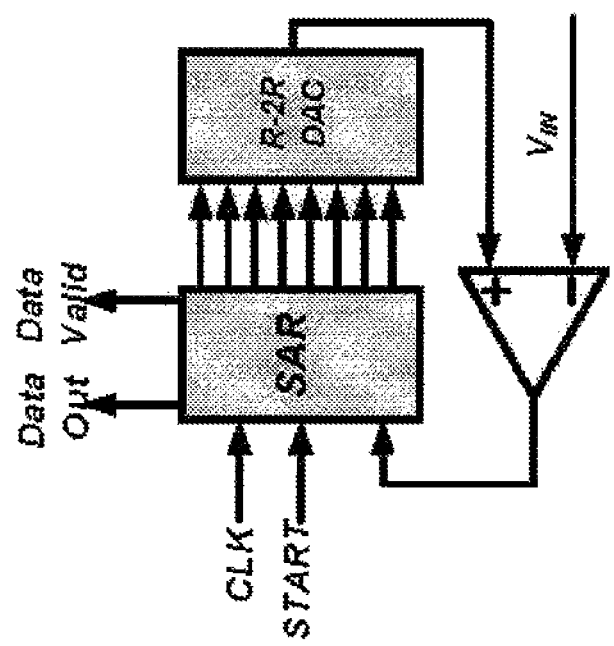
FIG. 21A is a schematic ADC block diagram.
Figure 21B:
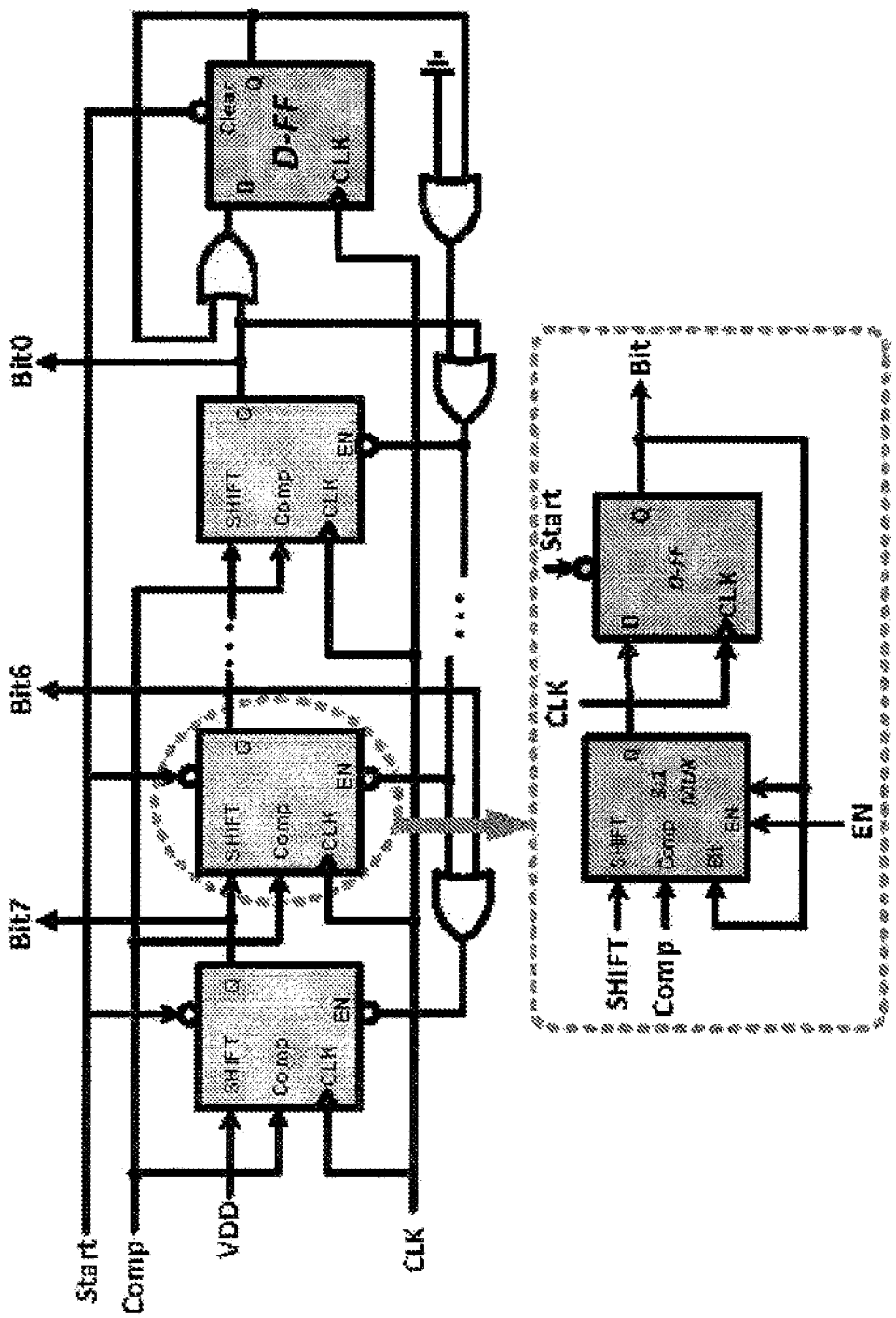
FIG. 21B is a schematic diagram of a fully-synchronous successive approximation register (SAR).

4 DC sensors, 4 thermal sensors and 2 RF sensors were multiplexed and fed to three ADCs placed throughout the chip. The sensor choice is governed by the digital ASIC. The block diagram of the implemented SAR ADC is shown in FIG. 21A. Global clock and the digitization initialization signals are the only inputs to the ADC in addition to the sensor select bits. Significant attention should be paid to the SAR-DAC since it directly affects the linearity as well as monotonicity of the ADC. In addition, specifically for SAR ADCs where comparison and setting of the output register both happen in a synchronous fashion, care must be taken to ensure that the comparator does not change its output over the approximation window itself. Synchronous SAR architectures FIG. 21B are also popular choices to alleviate timing issues associated with asynchronous registers.

Figures 22A, 22B:
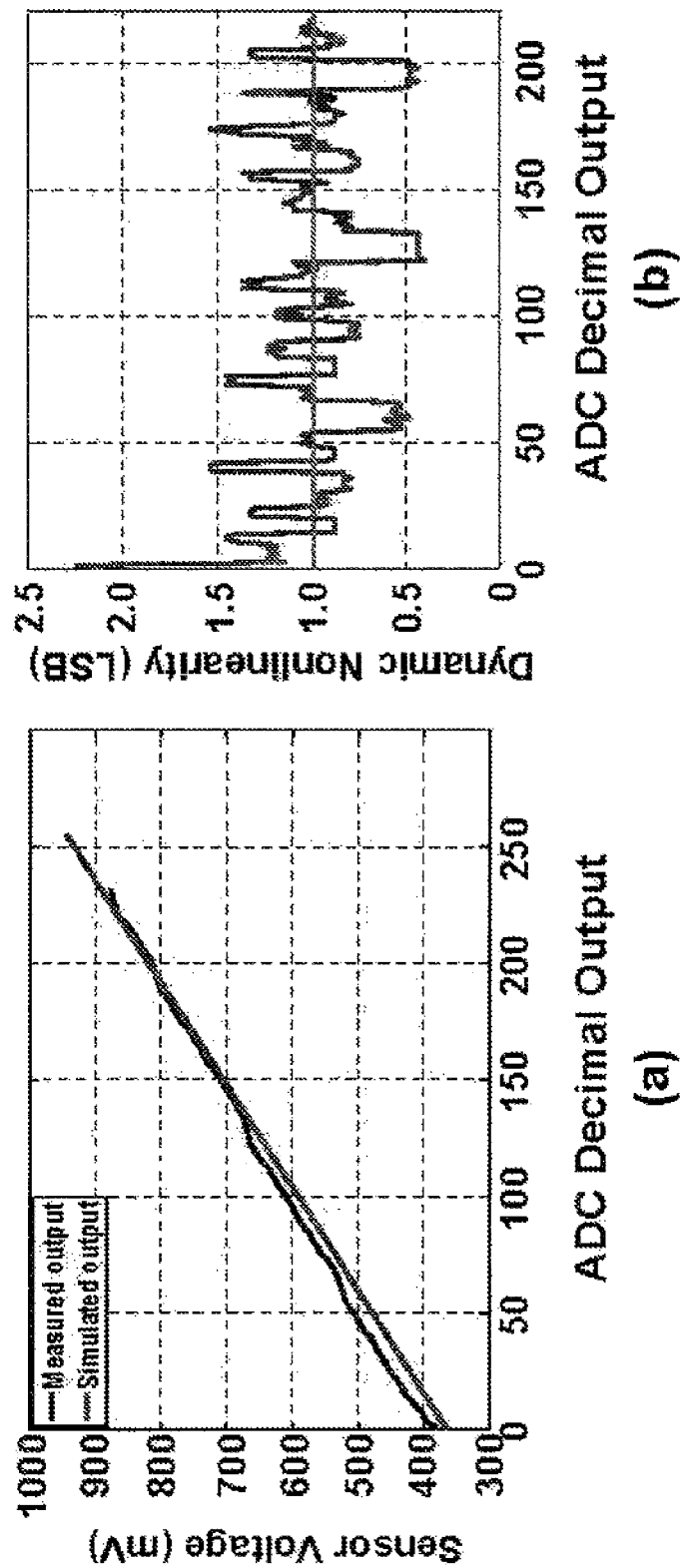
FIG. 22A is a graph illustrating the ADC measured and simulated characteristics ($V_{refn}$=350 mV, and $V_{refp}$=950 mV) vs. decimal output.
FIG. 22B is a graph illustrating the measured dynamic non-linearity (DNL) vs. decimal output.

The ADC measurements were performed as part of the full self-healing system. Sensor voltages were DC probed and the corresponding readouts were obtained through the digital ASIC. The ADC was verified to operate at 25 MHz clock frequency which translates to 2.5 Msps for an 8-bit SAR with initialization and data ready bits. FIG. 22A shows measurement vs simulation results of the implemented ADC. The average DNL was −0.04 LSB and the worst case DNL was measured to be −0.605 LSB as shown in FIG. 22B. These ensure that the ADC is monotonic which ensures proper operation of the digital ASIC. The SAR ADC draws 1.6 mW from a 1 V supply.

Digital-to-Analog Converters

A significant portion of the variations associated with a mm-wave power generation system are due to quiescent point fluctuations due to process and temperature changes. In fact almost all the performance metrics of a mm-wave PA directly correlate to the bias current, for example, efficiency, saturated output power, and the like. Most PAs are designed to operate at or near their maximum saturated power or maximum efficiency point. However, in a typical communication system, the PA operates <10% of the time near its peak output power. A dynamic biasing scheme addresses both these issues; it optimizes the operation of the PA for maximum performance when required and it can also reduce DC power consumption of the system at back-off leading to significant improvement in efficiency.

Due to the cascode nature of the power stage, both the common-source (CS) as well as the cascode (CG) transistor biasing points have significant effects on the overall system performance. Thus, bias control in the form of DACs has been implemented for both these transistors. The requirements for these DACs are the following: they preferably should be extremely low power blocks so as to reduce overall self-healing overhead, however they also need to drive the output stage transistors at relatively high speeds which keeps healing time to a minimum. In the present design, current-source based DACs are implemented. These binary weighted current sources are laid out in a common-centroid fashion to ensure good matching. To minimize variations due to process, the transistors in the DAC are long-channel devices which are less susceptible to variations such as line-edge-roughness. The DAC for the CS transistor provides output voltages in the range of 450 mV to 1.05 V, whereas the CG DAC provides 1.1 V to 1.95 V. A 6-bit control ensures adequate resolution in the healing search space. For calibration purposes, the CS DAC has one extra OFF bit which sets the bias voltage to 0 V thereby turning the PA off. FIG. 23 depicts schematics of the implemented current mode DAC. The two DACs were verified to operate at 25 MHz which was limited by the test setup. Measurements from the CG and CS DACs are shown in FIG. 24A and FIG. 24B.

Algorithms: Setting the Actuators Based on Sensor Data

The integrated self-healing core of the system takes sensor data as inputs, and based on that data it sends instructions to the actuation mechanisms to optimize performance. This procedure can occur in an iterative fashion and the entire communication link between the sensors and actuators controlled by an on-chip digital processing core. Independent control of the various actuators and capability of monitoring the resultant effects through the various sensors allows us to minimize a defined cost-function which could be represented as $$C = \Sigma_i w_i (p_i - p_{i0})^2, p_i = f = (s_1, s_2, \ldots)$$  Eqn. 5 where $p_i$ is a performance parameter of interest which is desired to be set at a value of $p_{i0}$ and can be expressed as a function of multiple sensor readings as $p_i = f(s_1, s_2, \ldots)$, and $w_i$ is the weight of the corresponding error function. By manipulating the different weights, the system may be geared towards optimizing certain parameters across multiple frequency bands which trades off with the other less important ones. The mapping $f: \vec{s} \to p$, which computes the desired performance parameter from the sensory response data can be a direct function such as measuring output power from the power sensor or PAE from a combination of measurement from input and output RF sensors and DC current sensors. The mapping can also be indirect, where an optimized multi-tone input was applied to a mixer under test, and from the envelope information extracted from the output power sensor, a nonlinear regression model was built off-chip to extract the desired parameters such as gain, IIP3 (the input intercept point for a third order intercept point), and other parameters. Others have shown that the use of external stimulus can be avoided by connecting the device-under-test (LNA) in a feedback network to produce oscillation which was analyzed on-chip to extract the parameters of interest. In the case of the power amplifier presented here, we will focus on the PA characterization by the input and output RF power, gain and PAE at the mm-wave frequency of interest. These metrics can be directly computed on-chip using the sensor data.

The rationale behind choosing a particular algorithm will depend on the particular application in hand, the performance metrics of interest and the nature of actuation space. If the space is convex or linear, then various fast-converging algorithms exist which can guarantee convergence to the optimum set of performance parameters within the actuation space. Depending on the system under test, the nature of the algorithm could either be geared towards individually optimizing blocks or sub-blocks. However, the possibility exists for a global self-healing process, where information of multiple components of the system may go to a centralized healing core which can direct multiple sub-healing cores responsible for healing the various components. In this case, we will focus our attention on the healing process of the power amplifier related to its input and output power and efficiency. Others have shown that an iterative procedure can be carried out to extend the linear range of the V-band power amplifier (55.5-62.5 GHz) by a method of adaptive biasing. In the case of the example PA, two methods of automated healing were implemented.

Figure 25:
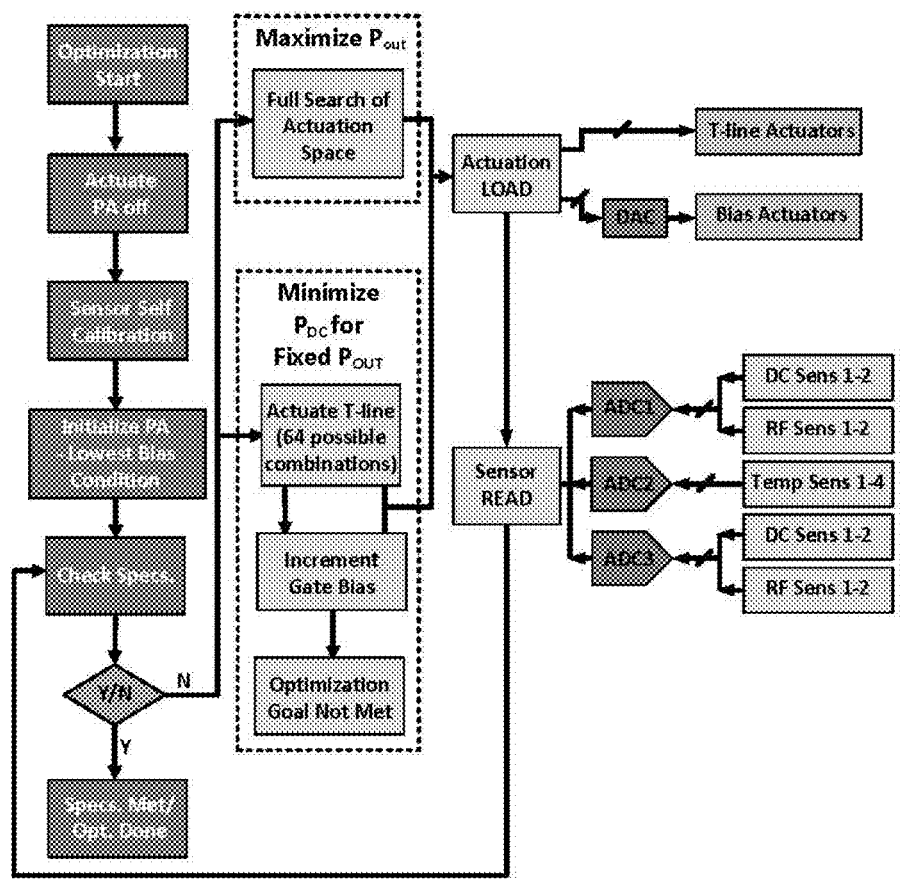
FIG. 25 is a flowchart showing the operating details of a self-healing digital processing core and the possible modes of fully automated self-healing. The diagram can be understood as either or both of the steps in an optimization process that can be performed as part of the self-healing process and as the functional structures and their interrelationships that can perform a self-healing digital process.

The algorithm was implemented as a custom digital processing core which was coded in VHDL and synthesized. The self-healing digital was built with a set of instruction sets corresponding to several different modes of operation such as fully automated self-healing, and reading sensor data without actuation or step-by-step healing with off-chip control. Once the desired instruction set was chosen, and the global state machine controlled all the necessary communication between the various component blocks for actuation loading, sensor reading, and optimization. Due to this modular code setup, many different types of complex optimization algorithms can be incorporated into this general fully integrated self-healing framework. Two modes of fully automated healing algorithms were implemented within the digital processing core. This is illustrated in FIG. 25. All the possible modes of operation start with an automated offset calibration step, which measures the DC offset setting of the sensors when the PA is turned off and subtracts it from all future measurements.

The first self-healing mode optimized the actuation settings (both bias and t-line combiner settings) for the highest output power. This was an exhaustive search among all the possible 262,144 states. The algorithm starts with the lowest bias settings (lowest DC current) and then continues to increase the bias actuation 1 bit at a time iterating through all possible combiner settings for each DC current setting. The settings of the driver and output stage are varied independently. The second mode of automated healing tries to find the most efficient state of the PA which can deliver at least a given amount of output RF power. As shown in FIG. 25, this mode also starts with the lowest bias setting, reads the sensor data through the shared ADC in a time-multiplied manner, and checks for the desired output power condition for all combinations of the t-line combiner setting. If the output power requirement is not reached, the bias current settings are incremented until the performance goal is reached. As before, the bias setting for the driver stage and the output stage are varied independently. If the desired output power is still not achieved after all actuation states are searched, the state with the highest output power is returned.

In the current implementation, the digital processing core uses a test setup limited clock of 25 MHz (though the on-chip core is verified to operate without timing errors until 500 MHz) and requires 3 μS per optimization iteration (set actuators, read all sensors, decide on next actuation state). This results in a maximum healing time of 0.8 s when the algorithm is an exhaustive search visiting all possible actuation states.

System Measurements of a Fully-Integrated Self-Healing PA

Figure 26:
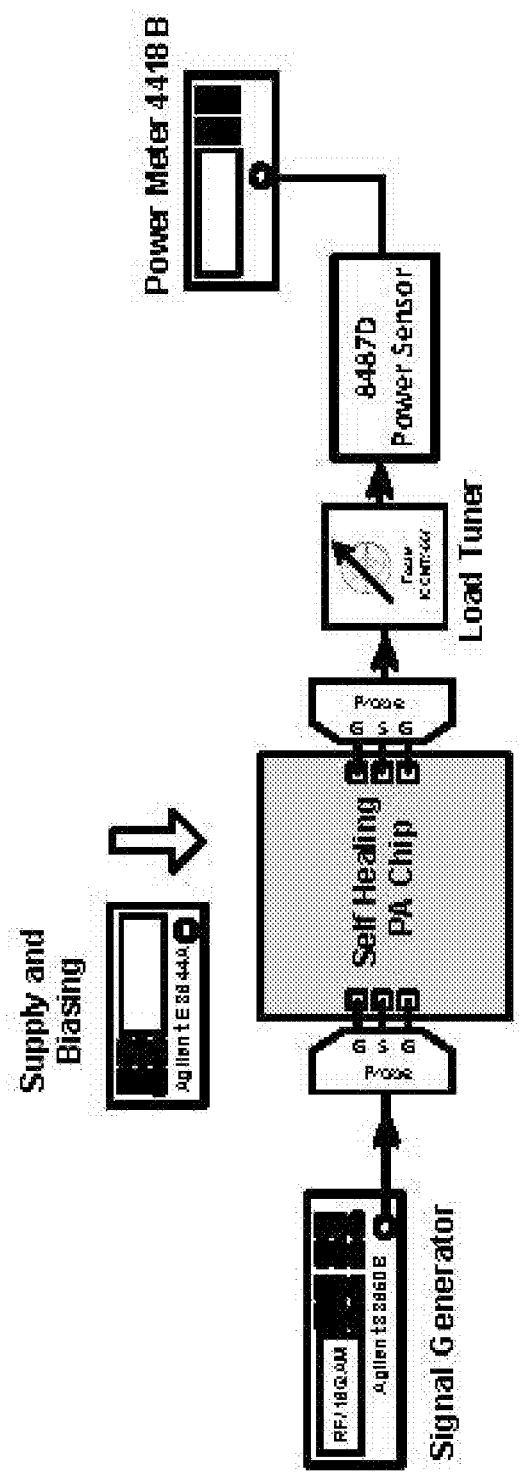
FIG. 26 is a diagram of a measurement setup used to observe the behavior of the fully-integrated self-healing power amplifier.

The example PA was fabricated using the self-healing blocks. The measurement setup of the PA is shown in FIG. 26. The PA was mounted on a PCB and probed at 28 GHz. It was driven by an Agilent 83650B signal generator, and probed with Cascade Z-probes. The output went through a calibrated network that included a mm-wave load tuner to an Agilent 8487D power sensor.

A comparison to an unhealed PA is useful to look at the benefits of the self-healing system, so a default actuation state must be selected as the 'default' state. The default state is chosen to be the state that had the best saturated performance in simulation and represents the PA that would have been taped out if the self-healing system was not being used. For all of the measurements without self-healing, the DC power consumption of the self-healing blocks were omitted when looking at the performance of the default state.

The entire self-healing system was integrated on a single chip, which means that the only external input given to the chip was the mode of operation, which algorithm to run, the desired output power (if needed) and then a go command, and no external calibration or external performance information is used during healing.

Healing Process Variation with a Nominal 50Ω Load

The healing ability of the amplifier for 50Ω loads is presented first. FIG. 27A shows the output power verses input power for an amplifier in its default state, as well as one that has been healed for maximum output power at low input power levels, and one that has been healed for maximum output power at the 1 dB compression point, the point where the gain has compressed 1 dB compared to the small signal gain. This plot shows the improvement in output power that can be achieved using self-healing, but also shows that there is no one optimal state for all input powers. The optimum load impedance for the maximum output power from the output amplifying transistors varies based upon the input power levels, and thus by tuning the matching network for the current power level, the corresponding optimal matching network can be found. This is an added benefit of the self-healing system, as it can be healed for the desired power level, and if that desired power level changes, it can be healed again. Near saturation where the default state was designed, it is close to the optimum, and thus there is not as much room for improvement. However, the default match at small signal is farther from the optimum, and thus there self-healing can provide larger improvements to the performance.

To show improvement for process variation, 20 chips were measured and histograms showing with and without self-healing for maximum output power are shown in FIG. 27B and FIG. 27C respectively. The small signal gain after healing is 21.5 dB, with a saturated output power of 16 dBm and a 1 dB compression point of 12.5 dBm while consuming 520 mW of DC power at 28 GHz.

The second algorithm to minimize the DC power while maintaining a desired output power is shown next. FIG. 28A shows the DC power consumption of 20 chips for various output power levels, with a histogram cross section of that plot for 12.5 dBm output power, near the 1 dB compression point, shown in FIG. 28B. Because the state is not changing, the DC power levels without self-healing for each chip are relatively at until the transistors really start to saturate and the power increases slightly. Once self-healing is turned on, there is still high DC power required to achieve very high output powers, but once the desired output power becomes even a couple dB below the saturated power, significant reduction in DC power consumption is observed. The DC power required to produce 12.5 dBm output power sees a 47% reduction in average power level over 20 chips, with a 78% decrease in the standard deviation between chips. This means that self-healing is both improving the performance, but also making it much more consistent across chips than in the default case. Once the power is near small signal levels, reductions of greater than 50% for every single chip measured are achieved.

Healing VSWR Environmental Variation with Load Mismatch

The load impedance was varied using a focus microwaves mm-wave load tuner that produces loads within the 12-1 VSWR circle at the tuner. When calibrating for the loss of the cable and probes, it becomes a load variation within the 4-1 VSWR circle at the probe tips, which corresponds to a resistance from 25Ω to 200Ω on the real impedance axis. The ability of the RF power sensors to detect actual power going to the load, not just the voltage, enables the self-healing system to know the delivered power to the load even under load impedance mismatch. This means that the algorithm can still heal and doesn't require knowledge of the load impedance to run the optimization, as the metric of interest, the output RF power is already known.

Figures 29A, 29B:
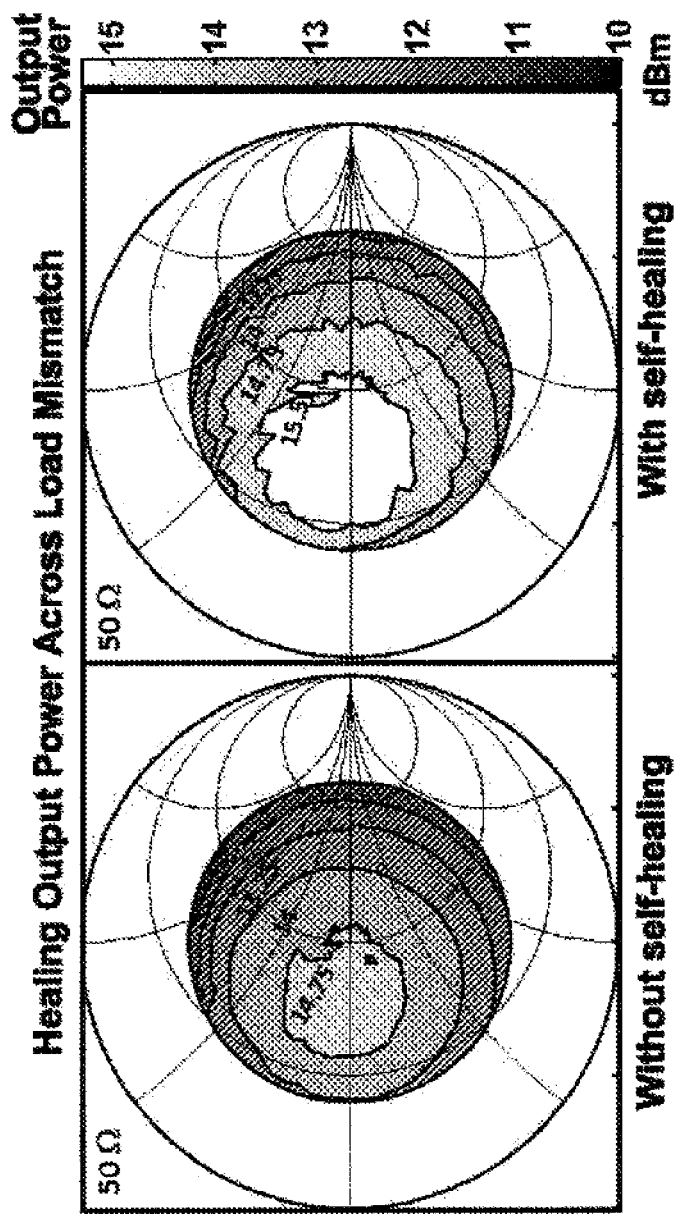
FIG. 29A is a graph of contour plots before self-healing for maximum output power for load impedance mismatch show improvement in output power over the entire 4-1 VSWR impedance circle.
FIG. 29B is a graph of contour plots after self-healing for maximum output power for load impedance mismatch show improvement in output power over the entire 4-1 VSWR impedance circle.
Figures 30A, 30B:
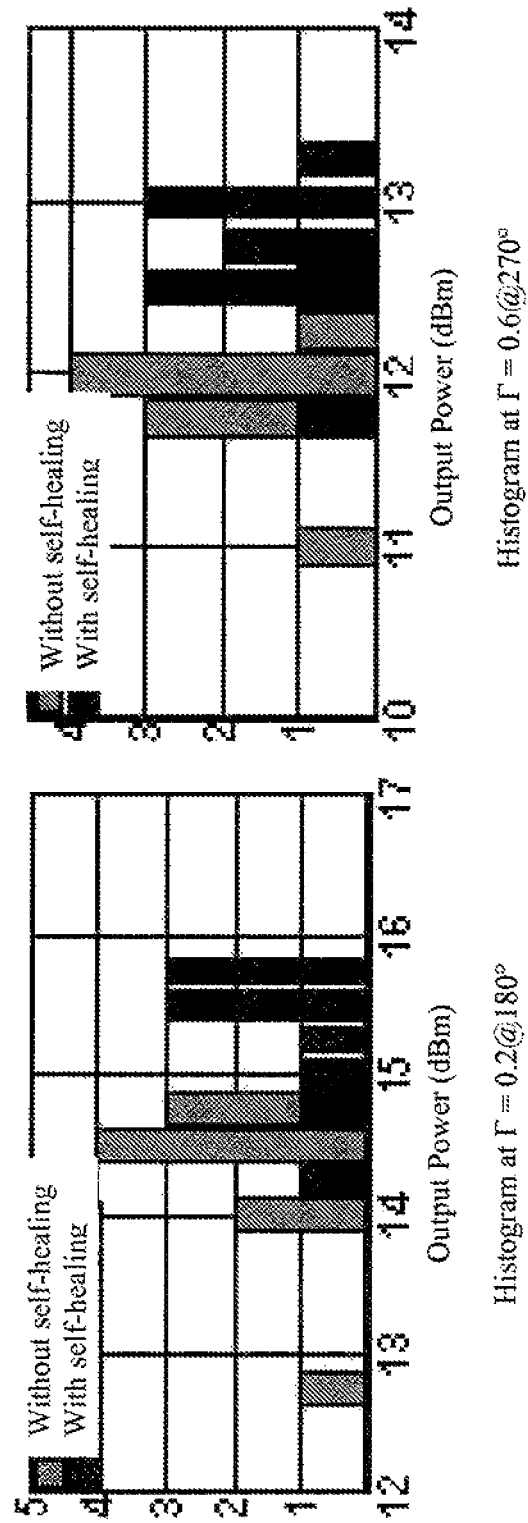
FIG. 30A is a histogram of 10 measured chips showing output power before and after self-healing two representative load impedance points near the maximum output power.
FIG. 30B is a histogram of 10 measured chips showing output power before and after self-healing two representative load impedance points on the edge of the 4-1 VSWR impedance circle.

The results of healing for maximum output power when the load impedance is swept within the 4-1 VSWR circle are shown as contour plots on the Smith charts in FIG. 29A and FIG. 29B, and show an improvement in output power across the entire 4-1 VSWR circle. Ten chips were measured, and the results of self-healing for maximum output power for two representative load impedances are shown in FIG. 30A and FIG. 30B. The first is near the maximum output power, and the second on the edge of the 4-1 VSWR circle. Again both show improvement overall in the output power, as well as a reduction in the variation between chips.

Figures 31A, 31B:
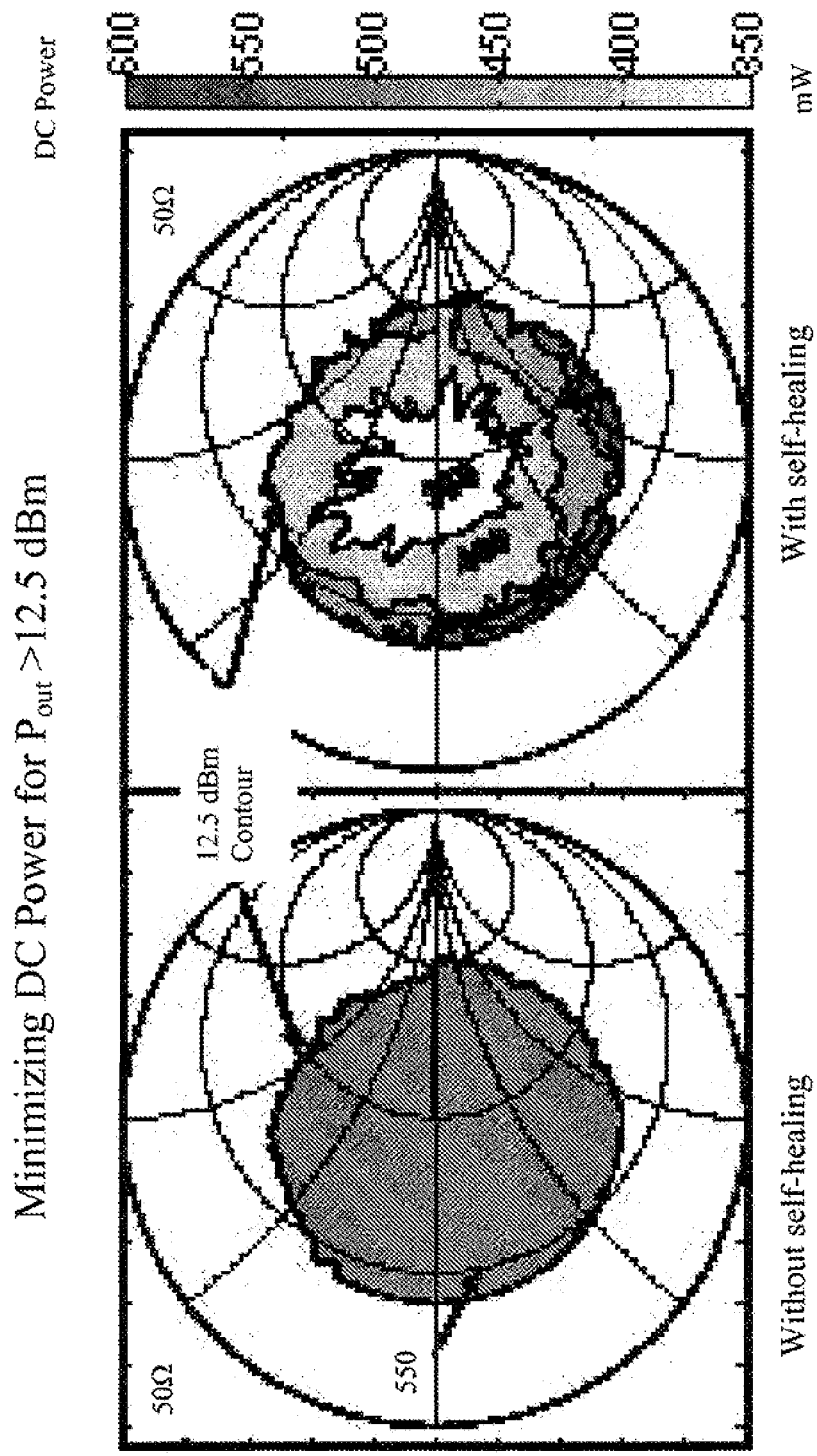
FIG. 31A is a graph of contour plots before self-healing for minimum DC power consumption while maintaining 12.5 dBm desired output RF power for load impedance mismatch show improvement in output power over the entire 4-1 VSWR impedance circle.
FIG. 31B is a graph of contour plots after self-healing for minimum DC power consumption while maintaining 12.5 dBm desired output RF power for load impedance mismatch show improvement in output power over the entire 4-1 VSWR impedance circle.

The second algorithm to minimize DC power for a desired output power was also tested under load impedance mismatch, and the results for a desired output power of 12.5 dBm are shown as contour plots in FIG. 31A and FIG. 31B. The outer-most contour represents the loads where 12.5 dBm was achieved, with the shading and all subsequent contours representing the DC power consumed. For the default state, the DC power consumption remains constant regardless of the load impedance mismatch. With self-healing however, the power can be substantially reduced by up to 35% at impedances near 50Ω, where the PA was designed, while still maintaining the desired output powers at the more extreme impedance mismatches.

Healing for Linearity

Figure 32:
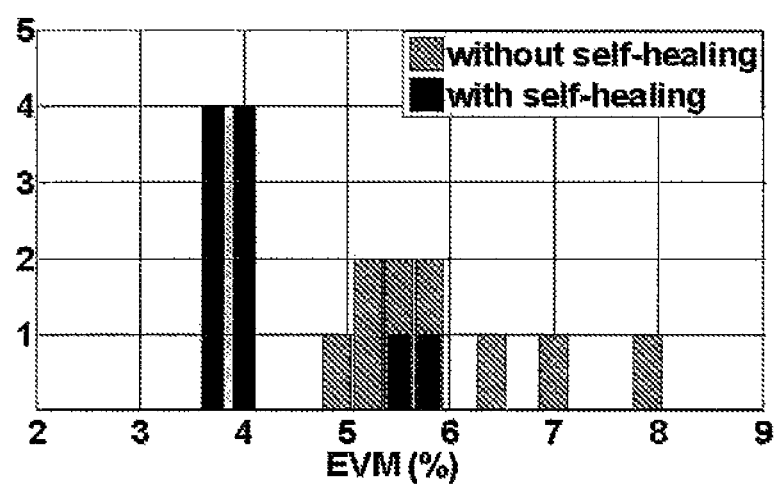
FIG. 32 is a histogram of the error vector magnitude (EVM) of 10 chips before and after self-healing for maximum output power show an improvement in linearity after self-healing.

The PA is designed as a linear amplifier to enable the use of non-constant envelope modulation schemes. The linearity of the PA has been verified using a 100 ksps 16 quadrature amplitude modulation (QAM) signal to measure the error vector magnitude (EVM) for 10 chips, shown for 12.5 dBm output power as a histogram in FIG. 32. While the self-healing system does not specifically attempt to improve linearity, a reduction in average EVM from 5.9% to 4.2% is observed when self-healing for maximum output power was applied. The healed chips are able to provide higher output powers while not being pushed as far into saturation, and thus the linearity for a given output power is improved.

Healing for Partial and Total Transistor Failure

Figure 33E:
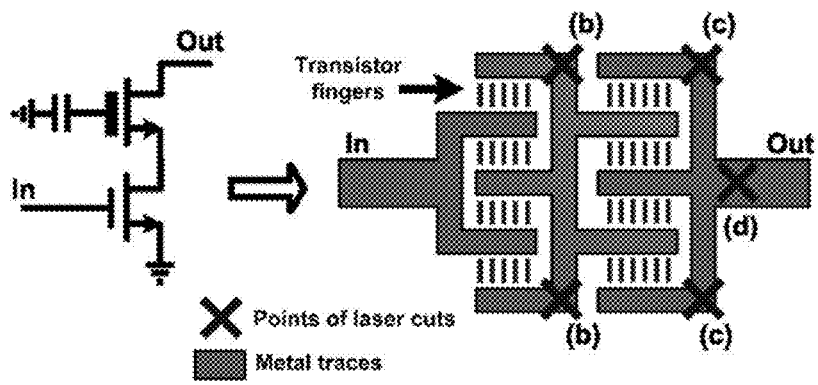
FIG. 33E is a schematic diagram showing the location of laser trim points.
Figure 33E:
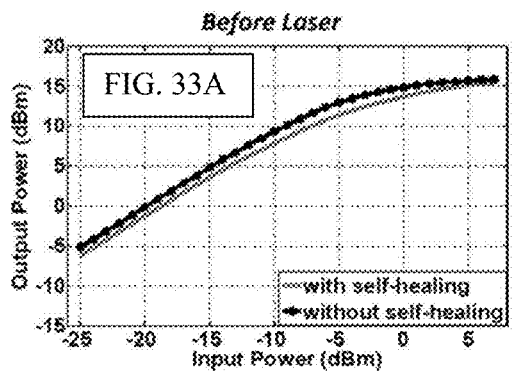
Figure 33E:
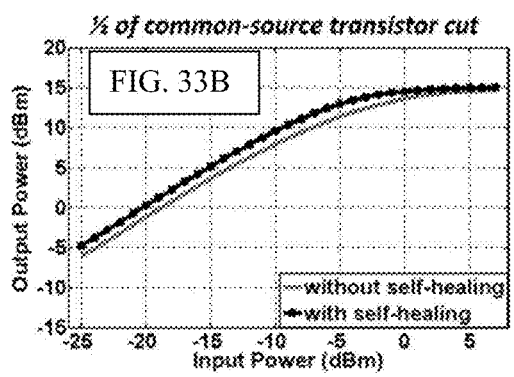
Figure 33E:
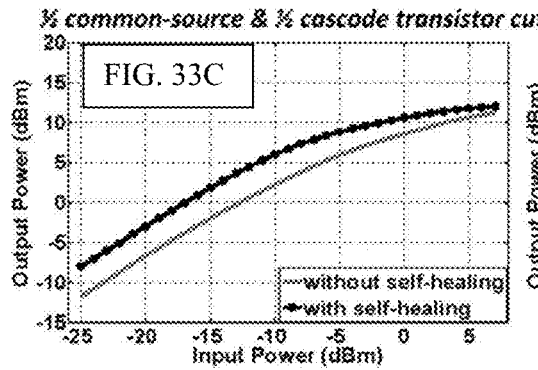
Figure 33E:
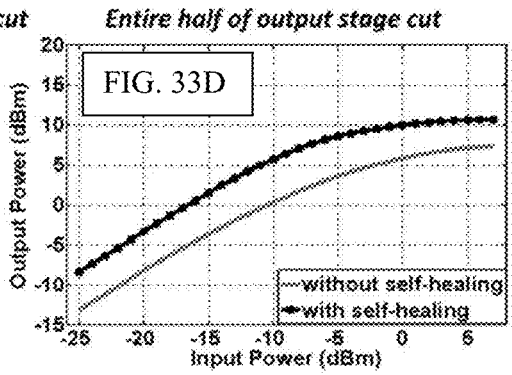

Partial or total transistor failure can be caused by aging, transistor stress such as from voltage spikes or other phenomenon. To show the self-healing system's ability to heal for partial and total transistor failure, a laser trimmer was used to blast away various parts of one of the output stage transistors. The output stage was chosen as the transistors to cut as they are the ones that are pushed closest to breakdown and are likely going to be the first ones to fail. Only one of the two output stages was cut to cause a worst case scenario from a mismatch standpoint. As a reference, the amplifier before any laser blasting is shown in FIG. 33A. Measurements taken in the default state and after healing for maximum output power with half of the common source transistor cut out are plotted in FIG. 33B. FIG. 33C shows the results with and without self-healing when half of the cascode stage was additionally cut out. Finally FIG. 33D shows the results once the entire output stage is blasted away. This means that the matching network that was expecting to have two similar drives at both inputs now has only a single input, and then a large stub where the other input used to be, destroying the original match that was shown in FIG. 19A and FIG. 19B.

Figures 34A, 34B, 34C:
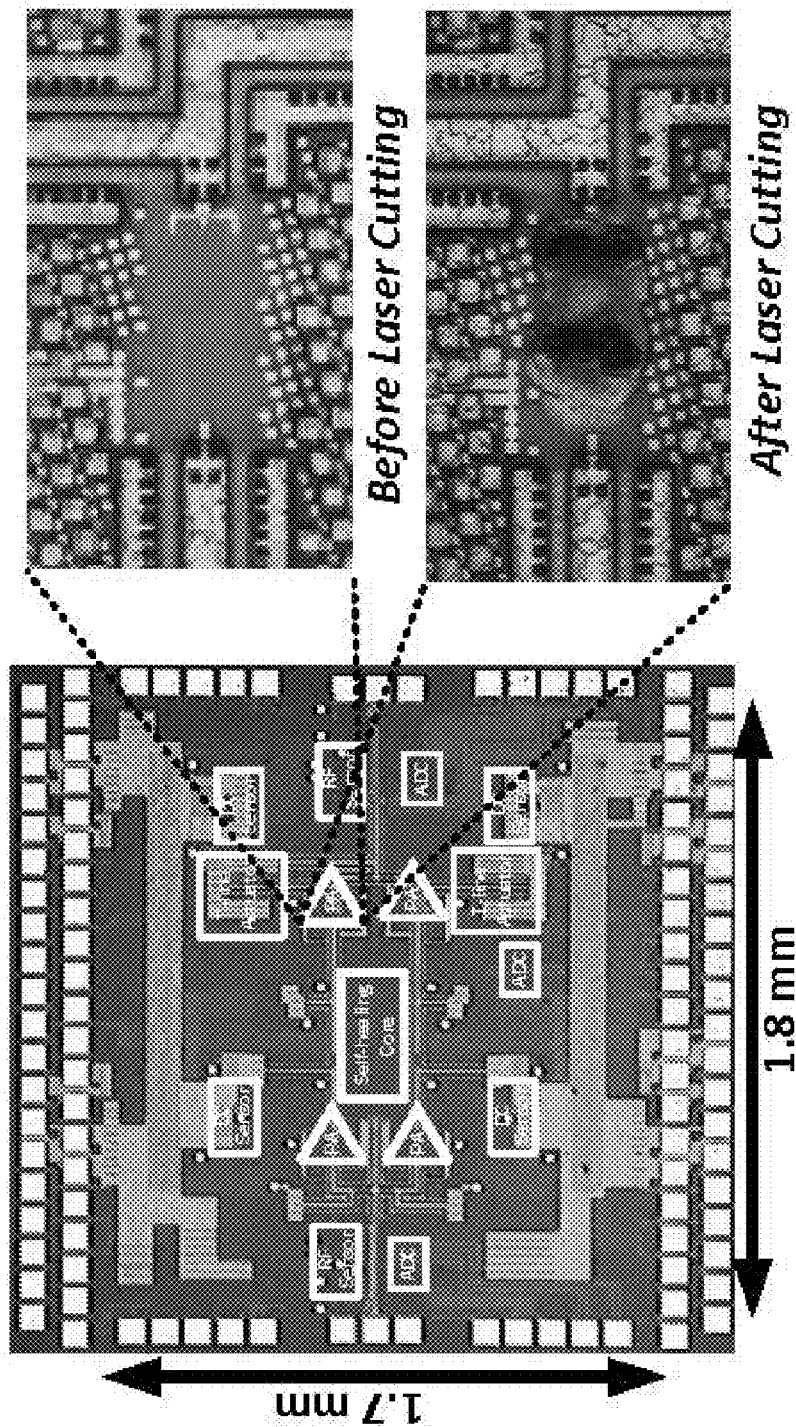
FIG. 34A is an image of the self-healing PA before laser blasting.
FIG. 34B is a closeup view of one output stage before laser blasting.
FIG. 34C is a closeup view of one output stage after laser blasting.

The default case at small signal loses 7.2 dB in output power from when the output stage is whole to when it is completely cut out. 3 dB of that is due to having only one of the two output stages providing power, but another 4.2 dB is caused by mismatch of the matching network. Once healing is applied, the loss due to cutting out the output stage is only 3.3 dB, which when taking into account the 3 dB loss from only having a single output stage means that the tunable matching network was able to heal back to the point where there was only 0.3 dB additional loss from this catastrophic event. This is one of the very strong points of self-healing, as under nominal conditions, where the default design is close to optimum, self-healing can only possibly improve the circuit at most the deviation from the optimum, but in cases such as this where the default falls far from the optimum point, and would normally register as a total failure of the entire circuit, self-healing can provide very significant gains and keep the circuit operational even under these types of extreme conditions. A die photo of the entire chip with closeup images before and after the laser blasting is shown in FIG. 34A, FIG. 34B and FIG. 34C.

Figure 35:
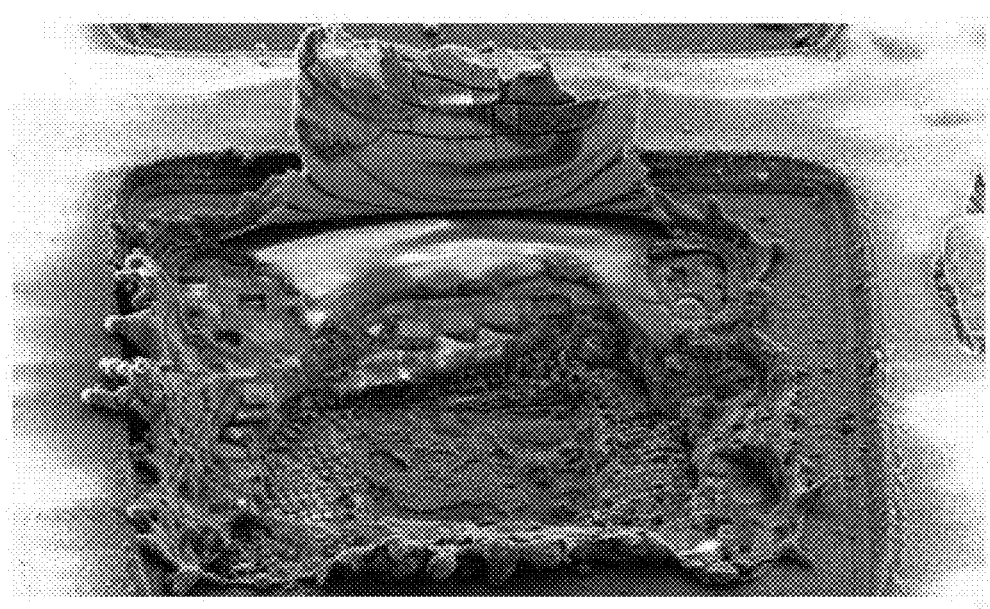
FIG. 35 is a scanning electron microscope image of some of the damage intentionally inflicted on a self-healing power amplifier using a high-power laser. The chip was able to recover from complete transistor destruction.

FIG. 35 is a scanning electron microscope image of some of the damage intentionally inflicted on a self-healing power amplifier using a high-power laser. The chip was able to recover from complete transistor destruction.

Yield Improvement

An effective self-healing system should improve the yield of the design, that is, to improve the percentage of chips that achieve a minimum performance specification for acceptable use. It is important to also consider any additional area requirements that the self-healing system requires, as it can reduce the number of chips that can fit on a given wafer size. However, in this design, the self-healing circuitry is placed within the confines of the PA itself in area that otherwise would have gone wasted, and thus the post-healing yield can be compared chip-to-chip with the pre-healing yield. For this design, the specifications included a saturation output power >15.5 dBm, gain >20 dB, and a power added efficiency >6%, and a 4-1 VSWR tolerance <3 dB, defined in dB as the worst case output power falloff within the 4-1 VSWR circle compared with a nominal 50Ω load. The PA was able to achieve best case metrics of 16.5 dBm saturated output power, 23.7 dB gain, 7.2% efficiency, and 2.28 dB 4-1 VSWR tolerance. Across 20 chips, the yield of the saturated output power improved from 20% to 90%, the gain improved from 20% to 100%, and the efficiency improved from 5% to 100%. For the 10 chips measured under load impedance mismatch, the yield improved from 0% to 80%, with an overall aggregate yield for all performance specifications improving from 0% to 80%.

Self-healing can enable significant improvements in performance if a mm-wave design has become susceptible to performance degradation caused by process or environmental variation. The effectiveness of the self-healing system is dependent on how far from optimal a non-healing design becomes. By programming different algorithms into the digital processing core, the amplifier can become dynamic, and tradeoffs that traditionally had to be made at the design level before fabrication can be adjusted based upon the current environment and use case of the mm-wave circuit.

Self-healing enables aggressive mm-wave designs even in process nodes where process variation and mismatch can cause significant variation in transistor operation. By using robust design to sense the performance of the mm-wave circuit during the self-healing optimization process, the core mm-wave circuit can take advantage of that aggressive design and push performance levels while maintaining yield. It is expected that as the minimum feature size continues to decrease, process variation will continue to increase, and the need for self-healing or other reconfigurable circuit techniques will increase.

Environmental variation can also be mitigated using self-healing. Variation in PA performance due to load impedance mismatch caused by VSWR events can be handled by making the output matching network tunable, so that the output amplifier stages still see their optimum impedance for maximum output power. Transistor degradation and failure due to effects such as aging can also be counteracted by adjustment of the DC operation point of the transistors and by adjusting the matching networks as the optimal impedances change. A 28 GHz power amplifier was presented as an example of how such an integrated self-healing PA could be implemented. Measurements of multiple chips demonstrate the viability of an integrated self-healing system that requires no external calibration of any kind Integrating the sensors, the actuators, a digital algorithm and data converters on a single chip allows for a completely automated healing system that improves aggregate yield from several performance specifications from 0% up to 80%, while healing for process variation, mismatch, load impedance mismatch, and partial and total transistor failure.

Unless otherwise explicitly recited herein, any reference to an electronic signal or an electromagnetic signal (or their equivalents) is to be understood as referring to a non-volatile electronic signal or a non-volatile electromagnetic signal.

Recording the results from an operation or data acquisition, such as for example, recording performance metrics is understood to mean and is defined herein as writing output data to a storage element, to a machine-readable storage medium, or to a storage device. Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, EEPROM, Compact Flash cards, PCMCIA cards, ExpressCard cards, solid state drives (SSD) or alternatively SD or SDIO memory; and the electronic components (e.g., floppy disk drive, DVD drive, CD/CD-R/CD-RW drive, or Compact Flash/PCMCIA/ExpressCard/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Recording data for later use (e.g., writing data to memory or to digital memory) can be performed to enable the use of the recorded information as output, as data for display to a user, or as data to be made available for later use. Such digital memory elements or chips can be standalone memory devices, or can be incorporated within a device of interest. "Writing data" or "writing data to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips, application specific integrated circuits ("ASIC") chips, and other specifically configured and tasked digital integrated circuits and sections of integrated circuits (e.g., sections, such as digital sections of integrated CMOS circuits) can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. A display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A self-healing monolithic integrated circuit, comprising:
    an electronic circuit having a plurality of transistors, said electronic circuit disposed between and electrically coupled to at least one input terminal and at least one output terminal;
    at least one sensor disposed within and electrically coupled to said electronic circuit, said at least one sensor configured to sense a performance metric of said electronic circuit and to provide a signal representative of said performance metric;
    a plurality of actuators disposed within said integrated circuit, each actuator of said plurality of actuators having electrically coupled to it a control terminal, said plurality of actuators being configured either to couple at least one transistor of said plurality of transistors to said electronic circuit or decouple the at least one transistor of said plurality of transistors from said electronic circuit, in response to operation of one of said control terminals to improve said performance metric;
    a digital processing core configured to receive said signal representative of said performance metric from said at least one sensor, said digital processing core configured to use said signal representative of said performance metric in the performance of an algorithm recorded in the form of instructions on a machine-readable medium in a non-volatile manner to produce a control signal, said digital processing core configured to apply said control signal to a respective control terminal of said plurality of actuators; and
    at least one power terminal and at least one common terminal electrically coupled to said electronic circuit and configured to accept power to operate said self-healing monolithic integrated circuit.

2. The self-healing monolithic integrated circuit of claim 1, wherein said self-healing monolithic integrated circuit comprises CMOS technology.

3. The self-healing monolithic integrated circuit of claim 1, wherein said performance metric comprises a performance metric selected from the group consisting of output power, efficiency, gain, PAE, and linearity.

4. The self-healing monolithic integrated circuit of claim 1, wherein said self-healing monolithic integrated circuit is component of a system selected from the group of systems consisting of a point-to-point link, a local area network (LAN), a personal area network (PAN), a vehicle radar system, an all weather vision system, a medical imaging sensor, a space probe imaging system, and a plasma diagnostic system.

5. The self-healing monolithic integrated circuit of claim 1, further comprising a general purpose programmable computer and a set of instructions recorded on a computer-readable medium which when operating on said general purpose programmable computer cause said general purpose programmable computer to be configured to receive sensed information and to set at least one of said control terminals to optimize said performance metric.

6. The self-healing monolithic integrated circuit of claim 5, wherein said set of instructions recorded on a computer-readable medium when operating runs on a computer device external to said monolithic integrated circuit.

7. The self-healing monolithic integrated circuit of claim 5, wherein said set of instructions recorded on a computer-readable medium when operating runs on a digital circuit disposed within said monolithic integrated circuit.

8. The self-healing monolithic integrated circuit of claim 7, wherein said digital circuit comprises a state machine.

9. The self-healing monolithic integrated circuit of claim 7, wherein said state machine is further controlled by a parent set of instructions recorded on a computer-readable medium.

10. The self-healing monolithic integrated circuit of claim 1, wherein said plurality of actuators comprise a tunable matching network.

11. The self-healing monolithic integrated circuit of claim 10, wherein said tunable matching network comprises a selected one of a T-line and a tunable slow-wave transmission line.

12. The self-healing monolithic integrated circuit of claim 10, wherein said self-healing monolithic integrated circuit is configured to automatically self-heal in response a selected one of change in antenna impedance and load characteristics.

13. The self-healing monolithic integrated circuit of claim 1, wherein said integrated circuit comprises a mm-wave circuit.

14. The self-healing monolithic integrated circuit of claim 1, wherein said self-healing monolithic integrated circuit senses a phase difference between a gate current and a drain voltage.

15. The self-healing monolithic integrated circuit of claim 14, wherein said self-healing monolithic integrated circuit is configured to operate at least one of said control terminals to cause said phase difference between said gate current and said drain voltage to change towards a quadrature phase difference.

16. The self-healing monolithic integrated circuit of claim 1, wherein said self-healing monolithic integrated circuit is configured to adjust a bias voltage or a threshold voltage through body effect (triple-well process) based on a gain estimate based on an output of a peak detector sensor.

17. The self-healing monolithic integrated circuit of claim 1, wherein said self-healing monolithic integrated circuit comprises a Schottky peak detector.

18. The self-healing monolithic integrated circuit of claim 1, wherein said self-healing monolithic integrated circuit senses an efficiency metric of said circuit using a temperature sensor.

19. The self-healing monolithic integrated circuit of claim 18, wherein said temperature sensor comprises a PTAT sensor.

20. The self-healing monolithic integrated circuit of claim 1, further comprising two or more on-chip antennas configured to provide power combining.

* * * * *